(12) United States Patent
Tomic

(10) Patent No.: US 7,161,507 B2
(45) Date of Patent: Jan. 9, 2007

(54) FAST, PRACTICALLY OPTIMAL ENTROPY CODING

(75) Inventor: Ratko V. Tomic, Lexington, MA (US)

(73) Assignee: 1st Works Corporation, Norfolk, MA (US)

( * ) Notice: Subject to any disclaimer, the term of this patent is extended or adjusted under 35 U.S.C. 154(b) by 0 days.

(21) Appl. No.: 11/015,894

(22) Filed: Dec. 17, 2004

(65) Prior Publication Data
US 2006/0055569 A1 Mar. 16, 2006

Related U.S. Application Data

(60) Provisional application No. 60/606,681, filed on Sep. 2, 2004, provisional application No. 60/603,464, filed on Aug. 20, 2004.

(51) Int. Cl.
*H03M 7/34* (2006.01)

(52) U.S. Cl. .......................................... 341/51; 341/107

(58) Field of Classification Search ................ 341/107, 341/65, 51, 50, 67, 63, 69, 106; 382/232–236
See application file for complete search history.

(56) References Cited

U.S. PATENT DOCUMENTS

| | | | |
|---|---|---|---|
| 4,122,440 A | 10/1978 | Langdon, Jr. et al. ...... | 340/347 |
| 4,286,256 A | 8/1981 | Langdon, Jr. et al. ...... | 340/347 |
| 4,295,125 A | 10/1981 | Langdon, Jr. ................ | 340/347 |
| 4,463,342 A | 7/1984 | Langdon, Jr. et al. ...... | 340/347 |
| 4,467,317 A | 8/1984 | Langdon, Jr. et al. ...... | 340/347 |
| 4,633,490 A | 12/1986 | Goertzel et al. ............. | 375/122 |
| 4,652,856 A | 3/1987 | Mohiuddin et al. ......... | 340/347 |
| 4,792,954 A | 12/1988 | Arps et al. .................... | 371/48 |
| 4,891,643 A | 1/1990 | Mitchell et al. ............. | 341/107 |
| 4,901,363 A | 2/1990 | Toyokawa .................... | 382/56 |
| 4,905,297 A | 2/1990 | Langdon, Jr. et al. ........ | 382/56 |
| 4,933,883 A | 6/1990 | Pennebaker et al. ........ | 364/554 |

(Continued)

OTHER PUBLICATIONS

Pearlman, William A. "High Performance, Low-Complexity Image Compression." Electrical, Computer and Systems Engineering Dept., Rensselaer Polytechnic Institute, Troy, New York, Jul. 1997, pp. 1-13.

(Continued)

*Primary Examiner*—Brian Young
(74) *Attorney, Agent, or Firm*—Foley Hoag, LLP

(57) ABSTRACT

An enumerator employs "indexing volumes" as the add-on values used to compute indexes for n-item ordered sets such as symbol sequences. Each indexing volume is associated with a different class into which the allowed ordered sets are partitioned. The indexing volumes all equal or exceed the number of ordered sets that belong to their respective classes. Additionally, the indexing volume $V_i$ associated with a given class of i-item equals or exceeds the sum of the indexing volumes associated with the classes that contain the (i−1)-item prefixes of the ordered sets that belong to the given class. The indexing volumes are quantized such that each volume $V=wr^s$, where r is an integer greater than unity, s is a non-negative integer, w is a positive integer less than $r^m$, m is some positive integer less than h, and, for some allowed ordered set whose size is less than n, h is the number of radix-r digits in the smallest quotient that results from evenly dividing by a positive-integer power of r the set count of the class to which that allowed ordered set belongs. As a result, the addition operations used to compute the indexes can be performed with limited precision, and storage requirements for the add-on values can be relatively modest.

102 Claims, 8 Drawing Sheets

U.S. PATENT DOCUMENTS

| | | | |
|---|---|---|---|
| 4,935,882 A | 6/1990 | Pennebaker et al. | 364/554 |
| 4,973,961 A | 11/1990 | Chamzas et al. | 341/51 |
| 4,989,000 A | 1/1991 | Chevion et al. | 341/107 |
| 5,023,611 A | 6/1991 | Chamzas et al. | 341/51 |
| 5,025,258 A | 6/1991 | Duttweiler | 341/107 |
| 5,045,852 A | 9/1991 | Mitchell et al. | 341/51 |
| 5,099,440 A | 3/1992 | Pennebaker et al. | 364/554 |
| 5,142,283 A | 8/1992 | Chevion et al. | 341/107 |
| 5,210,536 A | 5/1993 | Furlan | 341/107 |
| 5,272,478 A | 12/1993 | Allen | 341/107 |
| 5,307,062 A | 4/1994 | Ono et al. | 341/107 |
| 5,309,381 A | 5/1994 | Fukui | 364/715.02 |
| 5,311,177 A | 5/1994 | Kimura et al. | 341/107 |
| 5,363,099 A | 11/1994 | Allen | 341/107 |
| 5,404,140 A | 4/1995 | Ono et al. | 341/107 |
| 5,406,282 A | 4/1995 | Nomizu | 341/65 |
| 5,414,423 A | 5/1995 | Pennebaker | 341/107 |
| 5,418,532 A | 5/1995 | Lei | 341/107 |
| 5,546,080 A | 8/1996 | Langdon, Jr. et al. | 341/107 |
| 6,298,160 B1* | 10/2001 | Goertzen | 382/232 |
| 6,441,755 B1* | 8/2002 | Dietz et al. | 341/50 |
| 6,621,428 B1* | 9/2003 | Crane | 341/60 |
| 6,633,242 B1* | 10/2003 | Brown | 341/50 |
| 6,894,628 B1* | 5/2005 | Marpe et al. | 341/107 |

OTHER PUBLICATIONS

Tsai et al. "Stack-Run Coding for Low Bit Rate Image Communication." Electrical Engineering Department, University of California, Los Angeles, California, 1996 IEEE, pp. 681-684.

Moffat et al. "Arithmetic Coding Revisited." ACM Transactions on Information Systems, vol. 16, No. 3, Jul. 1998, pp. 256-294.

Bookstein, et al. "Is Huffman Coding Dead?" Computing, Springer-Verlag, Austria, vol. 50, 1993, pp. 279-296, no month given.

Lynch, Thomas J. "Sequence Time Coding for Data Compression." Proceedings Letters, Proceedings of the IEEE, Oct. 1966, pp. 1490-1491.

Davisson, L.D. "Comments on 'Sequence Time Coding for Data Compression.'" Proceedings Letters, Proceedings of the IEEE, Dec. 1966, p. 2010.

Öktem et al. "Hierarchical Enumerative Coding of Locally Stationery Binary Data." Electronics Letters, 19th Aug. 1999, vol. 35, No. 17, pp. 1428-1429.

Dai et al. "Binary Combinatorial Coding." Proceedings of the Data Compression Conference (DCC'03), 2003 IEEE, one page, no month given.

Myrvold et al. "Ranking and Unranking Permutations in Linear Time." Information Processing Letters, vol. 79, 2001, pp. 281-284.

Immink, Kees A. Schouhamer. "A Practical Method for Approaching the Channel Capacity of Constrained Channels." IEEE Transactions on Information Theory, vol. 43, No. 5, Sep. 1997, pp. 1389-1399.

Cover, Thomas M. "Enumerative Source Encoding." IEEE Transactions on Information Theory, vol. 1T-19, No. 1, Jan. 1973, pp. 73-77.

Lawrence, John C. "A New Universal Coding Scheme for the Binary Memoryless Source." IEEE Transactions on Information Theory, vol. 1T-23, No. 4, Jul. 1977, pp. 466-472.

Web search results on "Enumerative Coding", CiteSeer, http://citeseer.ist.psu.edu, Aug. 31, 2004, page one of one.

Tjalkens, Tjalling J. "A Universal Variable-to-Fixed Length Source Code Based on Lawrence's Algorithm." IEEE Transactions on Information Theory, vol. 38, No. 2, Mar. 1992, pp. 247-253.

Immink et al. "Effects of Floating Point Arithmetic in Enumerative Coding." Philips Research Laboratories, Prof. Holstlaan 6, 5656 AA Eindhoven, The Netherlands, Apr. 1997, pp. 1-6.

Schalkwijk, J. Pieter M. "An Algorithm for Source Coding." IEEE Transactions on Information Theory, vol. 1T-18, No. 3, May 1972, pp. 395-399.

Rissanen, J.J. "Generalized Kraft Inequality and Arithmetic Coding." IBM J. Res. Develop., May 1976, pp. 198-203.

Printz, Harry. "Tutorial on Arithmetic Coding." Feb. 23, 1994.

Bird et al. "Arithmetic Coding with Folds and Unfolds." Advanced Functional Programming 4, Lecture Notes in Computer Science, Johan Jeuring and Simon Payton Jones, editors, 2003, pp. 1-26.

Öktem, Levent. "Hierarchical Enumerative Coding and Its Applications in Image Compression." Thesis, Signal Processing Laboratory of Tampere University of Technology, 1999, pp. i-123.

\* cited by examiner

```
1   I=0;                        // init cumulative path index
2   for(k=n=0; n<M; ++n)        // M is the number of input bits
3   {                           // or a block size
4       if (getbit(n)==1)       // get data bit at bit index n
5       {                       // continue on 0, add on 1
6           ++k;                // increment count of 1's found
7           I=I+C(n,k);         // add binomial to the path index
8       }
9   }                           // k is the final count of 1's
```

FIG. 7

```
1   while(--n>=0)
2   {
3       if (I<C(n,k))      // compare to the binomial C(n,k)
4           setbit(0,n);   // output bit=0 at a bit index n
5       else               // I >= C(n,k), a vertical step
6       {
7           setbit(1,n);   // output bit=1 at a bit index n
8           I=I-C(n,k);    // reduce the path index
9           --k;           // reduce the count of 1's
10      }
11  }
```

FIG. 8

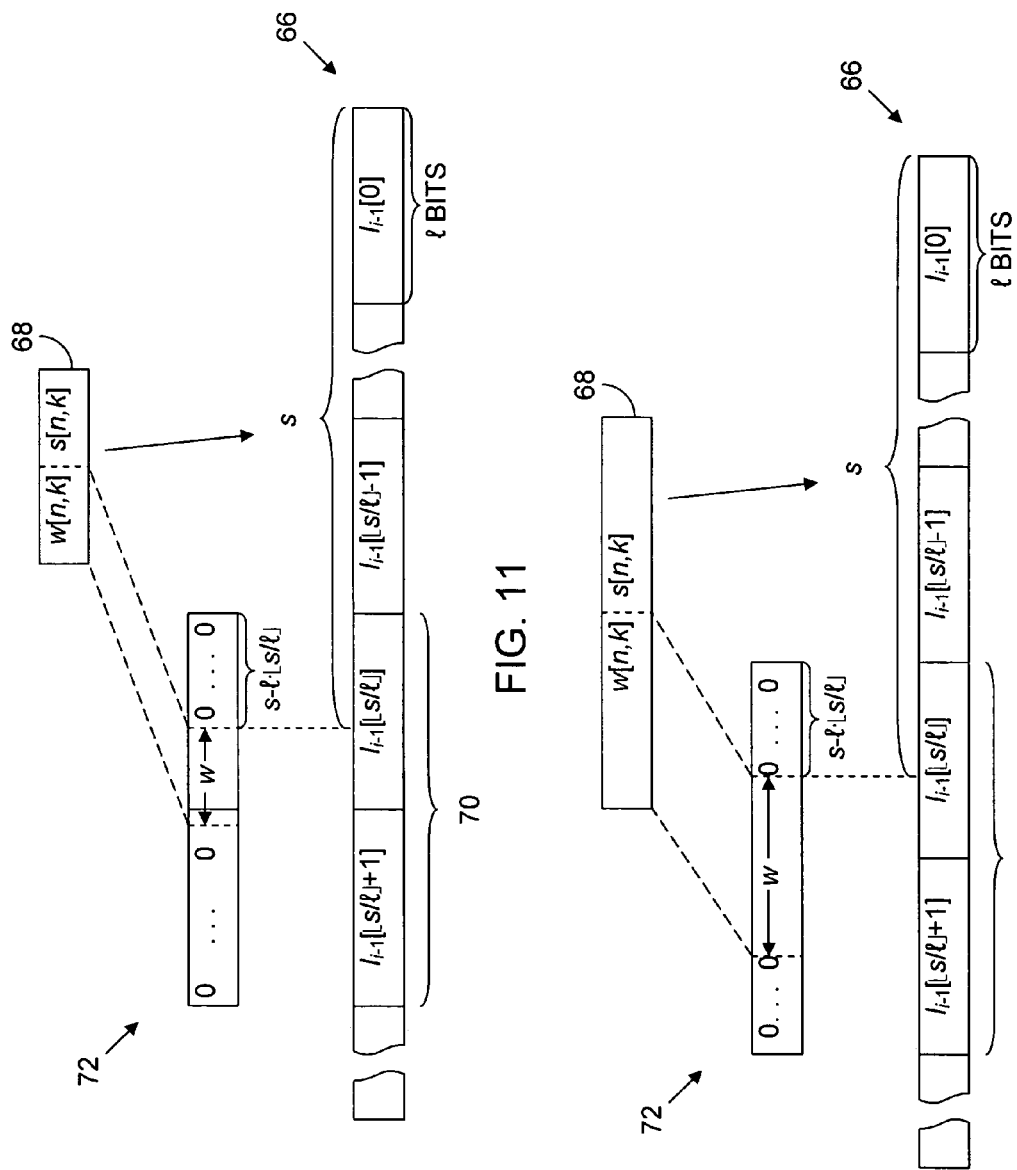

```
          a a c a b c d d c b a c   (k₁+k₂) + (k₃+k₄)
[12]      0 0 1 0 0 1 1 1 1 0 0 1   PLANE 1   (a|b)=0  (c|d)=1
          a a . a b . . . . b a .   (k₁) + (k₂)
[ 6]      0 0 . 0 1 . . . . 1 0 .   PLANE 2.0   a=0  b=1
          . . c . . c d d c . . c   (k₃) + (k₄)
[ 6]      . . 0 . . 0 1 1 0 . . 0   PLANE 2.1   c=0  d=1
----
[24]                    FIG. 13
```

```
          a a c a b c d d c b a c   (k₁+k₂+k₃) + (k₄)
[12]      0 0 0 0 0 0 1 1 0 0 0 0   PLANE 1   (a|b|c)=0  d=1
          a a c a b c . . c b a c   (k₁+k₂) + (k₃)
[10]      0 0 1 0 0 1 . . 1 0 0 1   PLANE 2.0 (a|b)=0  c=1
          . . . . . . . . . . . .   PLANE 2.1  EMPTY
          a a . a b . . . . b a .   (k₁) + (k₂)
[ 6]      0 0 . 0 1 . . . . 1 0 .   PLANE 3.0.0   a=0  b=1
----      . . . . . . . . . . . .   PLANE 3.0.1  EMPTY
[28]
                        FIG. 14
```

```
STEP
 1    a a c a b c d d c b a c
 1    0 0 1 0 0 1 1 1 1 0 0 1    PLANE 1
 1    0 0 0 0 1 0 1 1 0 1 0 0    PLANE 2

2    0 0 1 0 0 1 1 1 1 0 0 1    PLANE 1
 2    0 0 0 0 1 0 1 1 0 1 0 0    PLANE 2.0 + PLANE 2.1
```

FIG. 15

```
STEP
 1    a a c a b c d d c b a c
 1    0 0 0 0 0 0 1 1 0 0 0 0    PLANE 1
 1    0 0 1 0 0 1 . . 1 0 0 1    PLANE 2
 1    0 0 . 0 1 . . . . 1 0 .    PLANE 3

2    0 0 0 0 0 0 1 1 0 0 0 0    PLANE 1
 2    0 0 1 0 0 1 . . 1 0 0 1    PLANE 2.0 + PLANE 2.1 (EMPTY)

3    0 0 1 0 0 1 . . 1 0 0 1    PLANE-2.0
 3    0 0 . 0 1 . . . . 1 0 .    PLANE-3.0 + PLANE-3.1 (EMPTY)
```

FIG. 16

FAST, PRACTICALLY OPTIMAL ENTROPY CODING

CROSS-REFERENCE TO RELATED APPLICATIONS

The present application claims the benefit of U.S. Provisional Patent Application Ser. No. 60/603,464, which was filed on Aug. 20, 2004, by Ratko V. Tomic for a Fast, Practically Optimal Entropy Encoder, and of U.S. Provisional Patent Application Ser. No. 60/606,681, which was filed on Sep. 2, 2004, by Ratko V. Tomic for a Fast, Practically Optimal Entropy Encoder both of which are hereby incorporated by reference.

BACKGROUND OF THE INVENTION

1. Field of the Invention

The present invention concerns algorithmically indexing ordered sets. It is particularly, but not exclusively, applicable to entropy encoding.

2. Background Information

Data compression usually includes multiple phases, where the initial phases are more dependent on the specific data source. The initial phases typically identify the source-specific higher-level regularities and convert them into more-generic forms. The final output of this higher-level processing is a sequence of symbols in which higher-level, domain- or source-specific regularities have been re-expressed as simple, generic (quantitative) regularities, such as a highly skewed distribution of the produced symbols (picturesquely described as a "concentration of energy" when the statistical imbalances vary across the output sequence). The task of the entropy coder is to transform these simple regularities into fewer bits of data.

Optimal encoding is quantified as the message entropy, i.e. as the minimum number of bits per message averaged over all the messages from a given source. In the case of a source with a finite number of M distinct messages, all equally probable, the entropy H (per message) is $\log_2(M)$ bits; i.e., no encoding can do better than sending a number between 0 and M−1 to specify the index of a given message in the full list of M messages. (In the remainder of the specification, $\log_2 x$ will be expressed simply as "log x.")

More often, though, messages' probabilities re not equal. A common entropy-coding scenario is the one in which messages are sequences of symbols selected from an alphabet A of R symbols $a_1, a_2, \ldots a_R$, generated with probabilities $p_1, p_2, \ldots p_R$ that are not in general equal. The n character message entropy is then:

$$H = n \sum_{i=1}^{n} p_i \log(1/p_i) \quad (1)$$

This value is less than log M if the probabilities are not equal, so some savings can result when some messages are encoded in fewer bits than others. Taking advantage of this fact is the goal of entropy coding.

The two types of general entropy-coding algorithms that are most popular currently are Huffman coding and arithmetic coding. The Huffman algorithm assigns to each symbol $a_i$ a unique bit string whose length is approximately $\log(1/p_i)$ bits, rounded up or down to the next whole number of bits. The up/down rounding choice of each $\log(1/p_i)$ depends on all the $p_i$'s and is made by using the Huffman tree-construction algorithm. If all the symbol probabilities happen to be of the form $1/2^k$, where k is a positive integer, the resultant encoding minimizes the average message length.

The principal weakness of the Huffman code is its sub-optimality in the case of more-general probabilities (those not of the form $1/2^k$). Huffman coding is especially inefficient when one symbol has a probability very close to unity and would therefore need only a tiny fraction of one bit; since no symbol can be shorter than a single bit, the code length can exceed the entropy by a potentially very large ratio. While there are workarounds for the worst cases (such as run-length codes and the construction of multicharacter symbols in accordance with, e.g., Tunstall coding), such workarounds either fall short of optimality or otherwise require too much computation or memory as they approach the theoretical entropy.

A second important weakness of the Huffman code is that its coding overhead increases, both in speed and memory usage, when the adaptive version of the algorithm is used to track varying symbol probabilities. For sufficiently variable sources, moreover, even adaptive Huffman algorithm cannot build up statistics accurate enough to reach coding optimality over short input-symbol spans.

In contrast to Huffman coding, arithmetic coding does not have the single-bit-per-symbol lower bound. As a theoretical, albeit impractical, method, arithmetic coding goes back to Claude Shannon's seminal 1948 work. It is based on the idea that the cumulative message probability can be used to identify the message. Despite minor improvements over the decades, its fatal drawback was the requirement that its arithmetic precision be of the size of output data, i.e., divisions and multiplications could have to handle numbers thousands of bits long. It remained a textbook footnote and an academic curiosity until 1976, when an IBM researcher (J. Rissanen, "Generalised Kraft Inequality and Arithmetic Coding," *IBM J. Res. Dev.* 20, 198–203, 1976) discovered a way to make the algorithm's arithmetic work within machine precision (e.g., 16, 32, or 64 bits) practically independently of the data size, with only a minor compression-ratio penalty for the truncated precision. (That technique retained only a log(n) dependency on the data size n if absolutely optimal compression was required.) Over the following decades, the algorithm evolved rapidly, chiefly through speed improvements (which are obtained in arrangements such as that of IBM's Q-coder with only a small additional loss of compression efficiency) and faster and more-flexible adaptive variants. By the mid-1990's the arithmetic coder had replaced the Huffman algorithm as the entropy coder of choice, especially in more-demanding applications. But arithmetic coding is like Huffman coding in that its performance suffers when source statistics change rapidly.

Theoretically, the slow-adaptability problem that these two popular entropy-encoding techniques share can be overcome by a relatively obscure compression technique known as "enumerative coding." The roots of enumerative coding extend farther into the past than modern information theory, going back to the enumerative combinatorics of the Nineteenth and early Twentieth Centuries. And using combinatorial objects for ranking, as conventional enumerative encoding does, had actually been part of common computer-programming folklore for over a decade in 1966, when Lynch (T. J. Lynch, "Sequence Timecoding for Data Compression," *Proc. IEEE* vol. 54, 1490–1491, October 1966) and, independently, Davisson (L. D. Davisson, "Comments on 'Sequence Time Coding for Data Compression,'" *Proc.*

*IEEE* vol 54, 2010, December 1966) used the same number representation and formulas to encode "sequence times" for digitized data samples, i.e., presented what is now referred to as enumerative encoding.

Conceptually, enumerative encoding lists all messages that meet a given criterion and optimally encodes one such message as an integer representing the message's index/rank within that list. In words, an example would be, "Among the 1000-bit sequences that contain precisely forty-one ones (and the rest zeros), the sequence that this code represents is the one with whose pattern we associate index 371." That is, the example encoding includes both an identification of the source sequence's symbol population, (41 ones out of 1000 in the example), and an index (in that case, 371) representing the specific source sequence among all those that have the same symbol population.

Since the number of patterns for a given population can be quite large, it would not be practical to arrive at a significant-length sequence's pattern index by storing associations between indexes and patterns in a look-up table. Instead, one would ordinarily arrive at any given source pattern's index algorithmically, and the index-determining algorithm would typically be based on the value that the sequence represents. In accordance with one such indexing approach, for example, the prior example may alternatively be expressed in words as, "The sequence that this code represents is the $371^{st}$-lowest-valued 1000-bit sequence that contains precisely 41 ones," and it would therefore be possible to determine the index algorithmically.

Consider the seven-bit sequence 1001010, for example, i.e., one of the sequences that has three ones out of seven bits. The task is to determine an index that uniquely specifies this sequence from among all that have the same population, i.e., from among all seven-bit sequences that have three ones and four zeros. In accordance with an indexing scheme in which indexes increase with the sequence's value and the more-significant bits are those to the left, the index can be computed by considering each one-valued bit in turn as follows. Since the example sequence's first bit is a one, we know that its value exceeds that of all same-population sequences in which all three ones are in the remaining six bits, so the index is at least as large as the number of combinations of three items chosen from six, i.e., 6!/(3!·3!), and we start out with that value. Out of all same-population sequences that similarly start with a one bit, the fact that the example sequence has a one in the fourth bit position indicates that its index exceeds those in which both remaining ones are somewhere in the last three bit positions, so the index is at least as large as the result of adding the number of such sequences to the just-mentioned number in which all three are in the last six positions. By following that reasoning, the index I can be determined in accordance with:

$$I = \binom{6}{3} + \binom{3}{2} + \binom{1}{1} = 20 + 3 + 1 = 24.$$

I.e., the index can be determined by summing combinatorially determined add-on values.

Now, that index requires five bits, and it would take three bits to specify the population value, so the resultant eight bits exceeds the length of the (seven-bit) source sequence. But it is apparent that the comparison of the source-sequence length with the index length would be more favorable for a more-skewed population in a longer sequence. And the number of bits required for the "side information" that specifies the population increases only as the logarithm of the sequence length. Over a group of such sequences, moreover, that side information can itself be compressed. So the resultant code length approaches source entropy as the source-sequence length becomes large.

The combinatorial values used as "add-on" terms in the index calculation can be expensive to compute, of course, but in practice they would usually be pre-computed once and then simply retrieved from a look-up table. And it is here that enumerative coding's theoretical advantage over, say, arithmetic coding is apparent. Just as combinatorial values are successively added to arrive at the conventional enumerative code, successive "weight" values are added together to produce an arithmetic code. And arithmetic coding's weights can be pre-computed and retrieved from a look-up table, as enumerative coding's combinatorial values can. In arithmetic coding, though, the values of such add-on terms are based on an assumption of the overall sequence's statistics, and the arithmetic code's length will approach the source sequence's theoretical entropy value only if statistics of the source sequence to be encoded are close to those assumed in computing the add-on terms. To the extent that source statistics vary, the look-up table's contents have to be recomputed if near-optimal compression is to be achieved, and this imposes a heavy computational burden if the source statistics vary rapidly. In contrast, enumerative coding's table-value computation is not based on any assumption about the sequence's overall statistics, so it can approach theoretical entropy without the computation expense of adapting those values to expected statistics.

Enumerative coding has nonetheless enjoyed little use as a practical tool. The reason why can be appreciated by again considering the example calculation above. The sequence length in that example was only seven, but the lengths required to make encoding useful are usually great enough to occupy many machine words. For such sequences, the partial sums in the calculation can potentially be that long, too. The calculation's addition steps therefore tend to involve expensive multiple-word-resolution additions. Also, the table sizes grow as $N^3$, where N is the maximum block size (in bits) to be encoded, yet large block sizes are preferable, because using smaller block sizes increases the expense of sending the population value.

Arithmetic coding once suffered from the same drawback, but the Rissanen approach mentioned above solved the problem. Basically, Rissanen employed add-on values that could be expressed as limited-precision floating-point numbers. For example, the resolution might be so limited that all of each add-on value's bits are zeros except the most-significant ones and that the length of the "mantissa" that contains all of the ones is short enough to fit in, say, half a machine word. Even if such an add-on value's fixed-point expression would be very long and that value is being added to a partial sum that potentially is nearly as long, the resolution of the machine operation used to implement that addition can be small, since the change if any in the partial sum occurs only in a few most-significant bits. Rissanen recognized that add-on values meeting such resolution limitations could result in a decodable output if the total of the symbol probabilities assumed in computing them is less than unity by a great enough difference and the values thus computed are rounded up meet the resolution criterion. (The difference from unity required of the symbol-probability total depends on the desired resolution limit.)

Still, the best-compression settings of modern implementations require multiplications on the encoder and divisions on the decoder for each processed symbol, so they are slower than a static Huffman coder, especially on the decoder side. (The particular degree of the speed penalty depends on the processor.) By some evaluations, moreover, the arithmetic coder compresses even less effectively than the Huffman coder when its probability tables fail to keep up with the source probabilities or otherwise do not match them.

SUMMARY OF THE INVENTION

I have recognized that an expedient somewhat reminiscent of Rissanen's can be used to reduce the computation cost of enumerative encoding in a way that retains its general applicability and sacrifices little in compression ratio. I have recognized, that is, that such a result can come from replacing the conventional combinatorial values with limited-resolution substitutes.

Now, there is no straightforward way of applying the Rissanen approach to enumerative coding. As was explained above, the tactic Rissanen used to produce decodable output was to reduce the assumed symbol probabilities on which the his add-on-value computations were based, whereas the computation of conventional enumerative coding's add-on values is not based on assumed probabilities. And straightforward rounding of the conventional combinatorial values to lower-resolution substitutes does not in general produce decodable results: more than one source sequence of the same symbol population can produce the same index. So, although substituting limited-resolution add-on values for conventional ones has been tried before in enumerative coding, previous approaches to using short-mantissa substitutes for conventional combinatorial values were restricted to source sequences that are constrained in ways that most source sequences are not. They have therefore been proposed for only a few niche applications.

But I have recognized that these limitations can be overcome by using what I refer to as "quantized indexing. In quantized indexing, gaps are left in the sequence of possible indexes: for a given symbol population, that is, the index values used to identify some sequences having that population will sometimes exceed certain values not so used. I leave gaps in such a way that the add-on values used to compute the indexes can be expressed in low-resolution representations that can be added in low-resolution operations and can require relatively little storage space. As will be seen below, such add-on values can readily be so chosen as to comply with the "pigeonhole principle"—i.e., to result in decodable indexes—by employing a "bottom-up" approach to add-on-value computation, i.e., by deriving add-on values for longer sequences' symbol populations from those for smaller sequences.

BRIEF DESCRIPTION OF THE DRAWINGS

The invention description below refers to the accompanying drawings, of which:

FIG. 7 is a code listing that illustrates one form of enumerative encoding;

FIG. 8 is a listing that illustrates the corresponding enumerative decoding;

FIG. 11 is a diagram that illustrates selection of operands in one index-computation step;

FIG. 12 is a diagram similar to FIG. 11 but depicting a different selection;

FIG. 13 is a diagram of one approach to converting a large-alphabet sequence into binary-alphabet sequences for coding;

FIG. 14 is a similar diagram of another approach;

FIG. 15 is a diagram that labels the steps used in the approach of FIG. 13; and

FIG. 16 is a diagram that labels the steps used in the approach of FIG. 14.

DETAILED DESCRIPTION OF AN ILLUSTRATIVE EMBODIMENT

Figure 1:
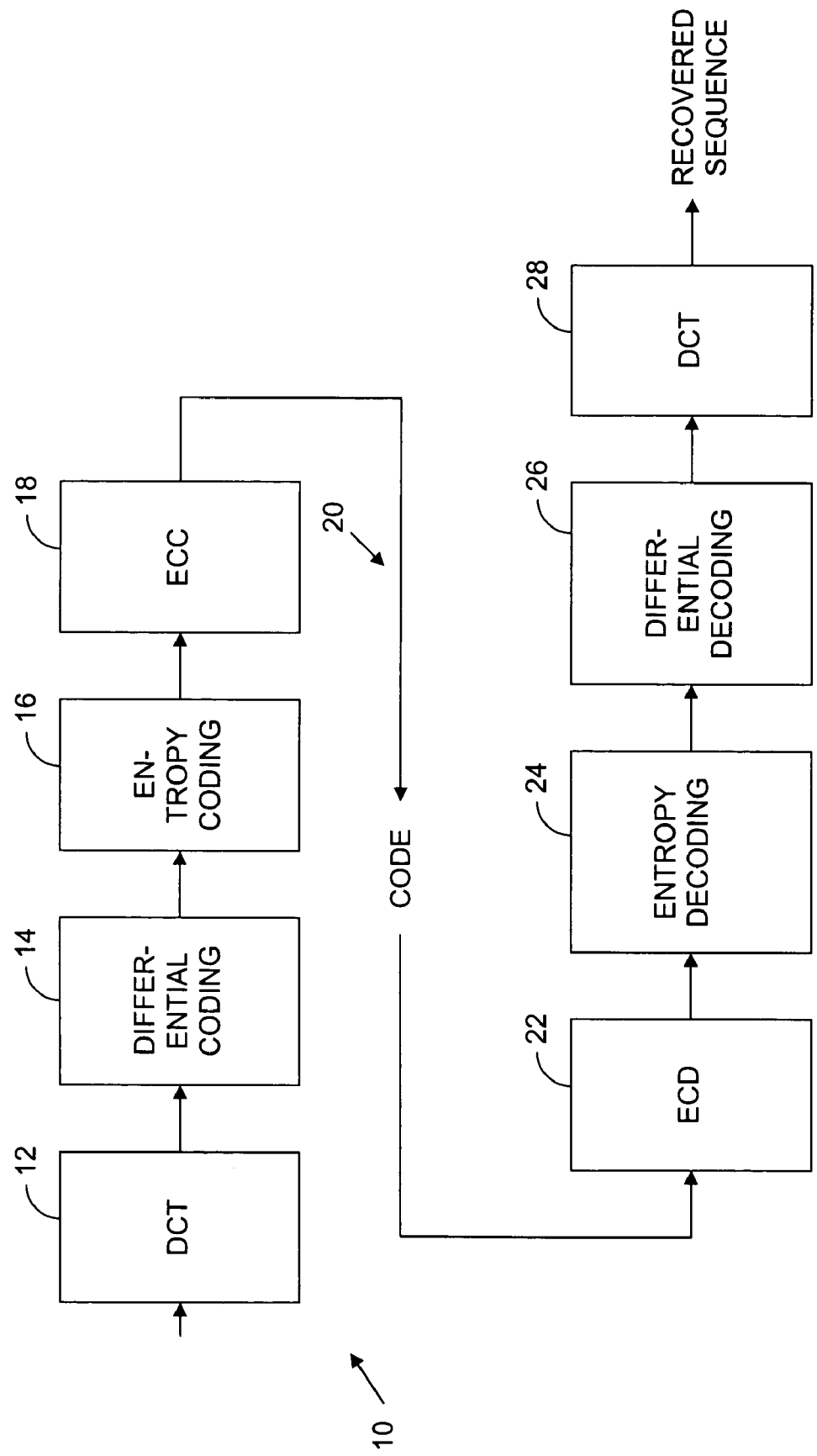
FIG. 1 is block diagram of a typical encoding and decoding environment in which entropy encoding may be used.

Before we consider ways in which the present invention can be implemented, we will briefly consider a typical environment in which an entropy encoder may be used. The entropy encoder may be a constituent of a composite encoder 10, usually one designed to operate on a specific type of source sequence. For instance, the encoder may be intended to encode sequences of symbols that represent values of image pixels. Framing information may be available, too, and the data may accordingly be subjected to, say, a two-dimensional discrete cosine transform 12. Some difference operation 14 may then be performed to express each value as a difference from one that came before.

Despite the differential operations, there is usually some skew in the resultant output's symbol distribution, and it is at this point that the entropy coding 16 may be employed to compress the data toward their entropy value. In some cases, some measure of redundancy will then be re-introduced by, say, error-correction coding 18 in order to protect against corruption in a noisy transmission channel 20. If so, the result will be subjected to error-correction decoding 22 at the other end of the channel 20, and entropy decoding 24 will re-expand the compressed data to the form that emerged from the difference operation 14. An accumulator operation 26 will reverse the difference operation 14, and another discrete cosine transform 28 will complete the task of reconstituting the image. In addition to the actual pixel-value data discussed here, the channel in a practical system would typically also carry framing, quantization, and other metadata.

For the sake of explanation, it is convenient to represent the operations as FIG. 1 does, with successive operations represented by successive blocks. And, in some environments, those blocks could represent respective different circuits. In many cases, though, some or all would be embodied in the same circuitry; all of the encoding circuitry could, for example, be implemented in the same computer system, such as the one that FIG. 2 represents.

In that drawing, a computer system 30 includes a microprocessor 32. Data that the microprocessor 32 uses, as well as instructions that it follows in operating on those data, may reside in on-board cache memory or be received from further cache memory 34, possibly through the mediation of a cache controller 36. That controller can in turn receive such data and instructions from system read/write memory ("RAM") 38 through a RAM controller 40 or from various peripheral devices through a system bus 42. Alternatively, the instructions may be obtained from read-only memory ("ROM") 44, as may some permanent data, such as the index-volume values that will be discussed below in more detail. The processor may be dedicated to encoding, or it may additionally execute processes directed to other functions, and the memory space made available to the encoding process may be "virtual" in the sense that it may actually be considerably larger than the RAM 38 provides. So the RAM's contents may be swapped to and from a system disk 46, which in any case may additionally be used instead of a read-only memory to store instructions and permanent data. The actual physical operations performed to access some of the most-recently visited parts of the process's address space often will actually be performed in the cache 34 or in a cache on board microprocessor 32 rather than in the RAM 38. Those caches would swap data and instructions with the RAM 38 just as the RAM 38 and system disk 46 do with each other.

In any event, the ROM 44 and/or disk 46 would usually provide persistent storage for the instructions that configure such a system as one or more of the constituent encoding or encoding circuits of FIG. 1, the system may instead or additionally receive them through a communications interface 48, which receives them from a remote server system. The electrical signals that typically carry such instructions are examples of the kinds of electromagnetic signals that can be used for that purpose. Others are radio waves, microwaves, and both visible and invisible light.

Figure 2:
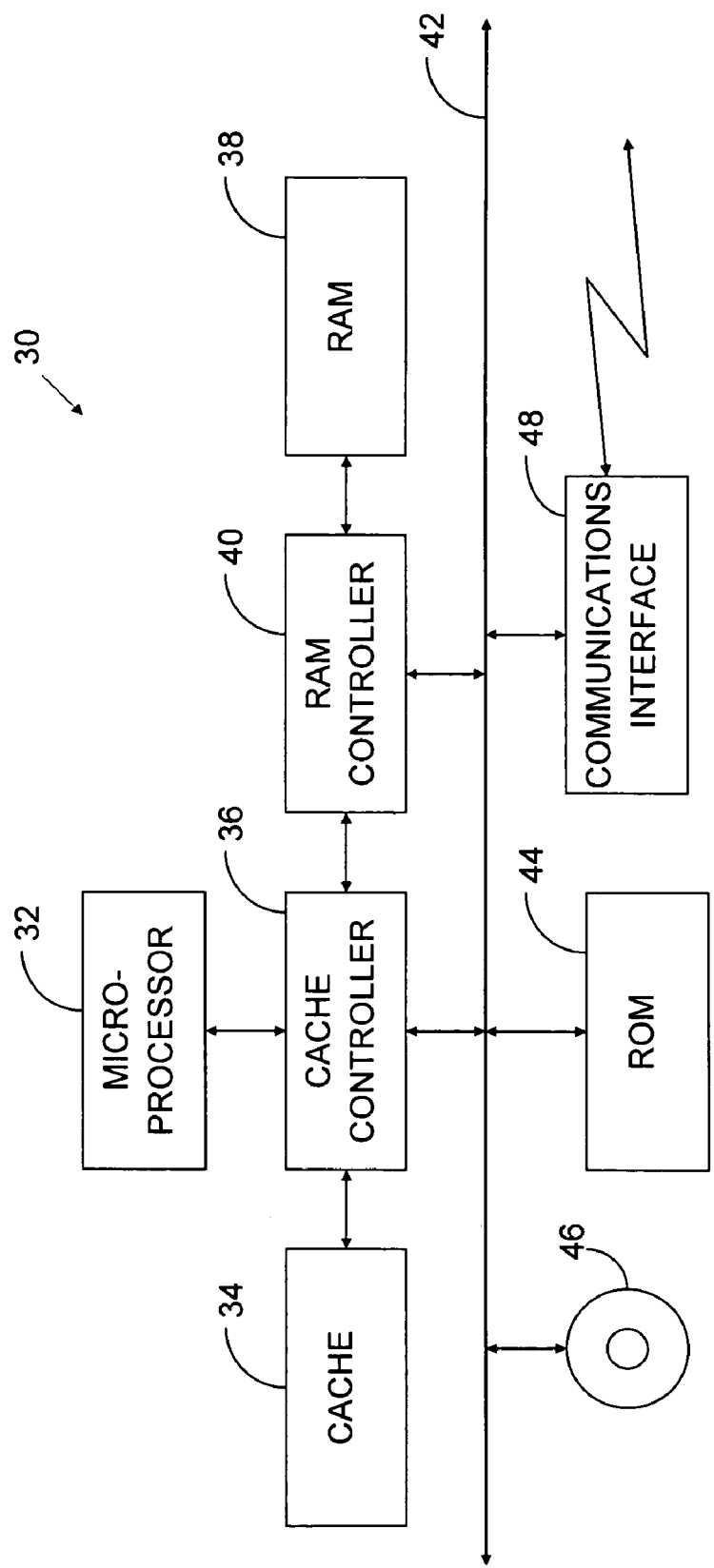
FIG. 2 is a block diagram of a typical computer system that can be used to perform encoding.

Of course, few computer systems that implement the present invention's teachings will be arranged in precisely the manner that FIG. 2 depicts, and encoders are not necessarily implemented in general-purpose microprocessors or signal processors. This is true of encoders in general as well as those that implement the present invention's teachings, to which we now turn by way of illustrative embodiments.

Figure 3:
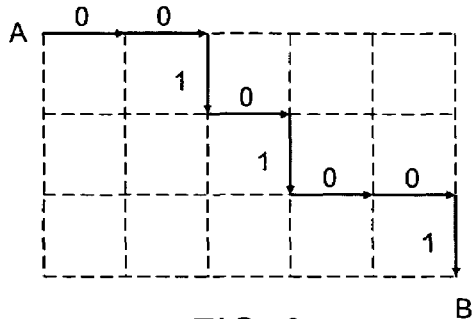
FIG. 3 is a diagram of a lattice employed to depict a relationship between sequences and their symbol populations.

To introduce those teachings, we will start by returning to conventional enumerative encoding and describing it in accordance with a conceptual framework that helps present certain of the present invention's aspects. Of special interest are binary sources, i.e., sources whose outputs are sequences of the symbols 0 and 1, since most other types of data sources can be reduced to this canonical source. We will map such sequences to paths on a square lattice depicted in FIG. 3. The square lattice is a set of points (x,y), where x and y are integers. Unless otherwise indicated, the lattice paths discussed start at the origin (0,0) in the upper left corner. The drawing convention for coordinates will follow text directions, i.e., x increases from left to right and y from top to bottom. The mapping rule interprets a binary string as instructions for a connected sequence of lattice steps, 0 as a rightward step and 1 as a downward step. FIG. 3 illustrates the mapping between a binary string $S_8$=0 0 1 0 1 0 0 1 and a lattice path [A,B].

We digress here to point out that references in this discussion below to 0 bits and 1 bits in the sequence to be encoded is arbitrary; 0 refers to one of the two possible bit values and 1 to the other, independently of what arithmetic meaning they are accorded outside of the encoding operation. Also, although it is advantageous if the sequence-bit value to which we refer as 1 occurs less frequently in the sequence than the value to which we refer as 0, there is no such requirement.

Figure 4:
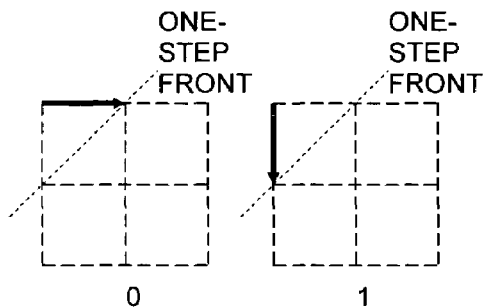
FIG. 4 depicts two single-bit paths in that lattice.
Figure 5:
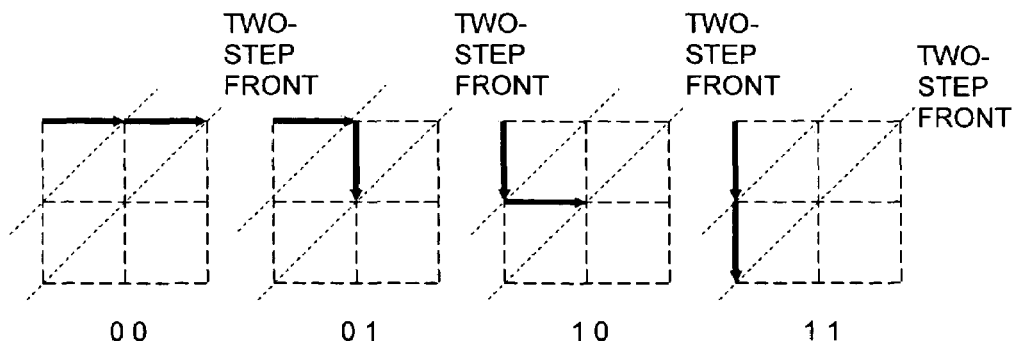
FIG. 5 depicts four two-bit paths in that lattice.

Before we compute the index of a particular path, we will examine how many different paths (constructed by our mapping rule) there are from point A to point B. FIG. 4 shows both possible single-step paths from the origin, while FIG. 5 shows all possible two-step paths. The one- and two-step fronts represented in those drawings by dashed diagonal lines run though all lattice points reachable in one and two steps, respectively. More generally, since the lattice coordinates x and y are simply the counts of 0's and 1's in a bit string ending in the point (x,y)—i.e., since each lattice point represents a respective unique symbol population shared by all paths that terminate there—and the number of steps n is the total number of bits in the string (i.e. n=x+y), every n-step front is a diagonal line parallel to the one- and two-step fronts shown.

FIGS. 3, 4, and 5 reveal a general pattern: every path to any point (x,y), passes either through the point above it, i.e., (x,y−1), or through the point to its left, i.e., (x−1,y). So the path count N(x,y) for the symbol population (x,y) is the sum of the path counts of its predecessor symbol populations, i.e. of its two neighbors at (x−1,y) and (x,y−1). Symbolically, that is:

$$N(x,y)=N(x-1,y)+N(x,y-1)$$

$$N(x,0)=N(0,y)=1 \quad x,y \geq 0 \qquad (2)$$

For all edge points (x,0) or (0,y) the path counts for the neighbors at (x,−1) or (−1,y) are 0 since these neighbors cannot be reached by our lattice-walk rules. (The only valid steps are right or down.) And we define the origin (0,0)'s path count as 1 (corresponding to the path of 0 steps) in order to avoid separate equations for the edge-point path counts (which are always 1).

Figure 6:
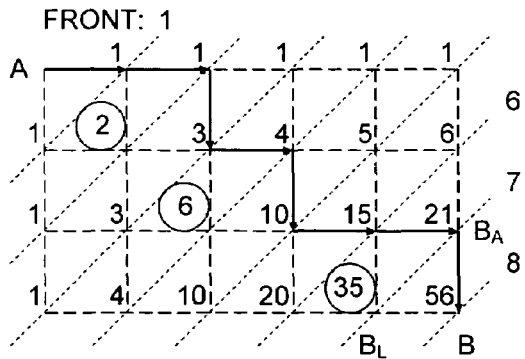
FIG. 6 depicts the lattice with path counts.

Eq. (2) enables us to compute the path counts for all (x,y) points along an n-step front (the points along the line x+y=n) from path counts of the points on the (n−1)-step front. Since we already have the path counts for the two-step front, we will propagate them, as FIG. 6 shows, to the eight-step front. The path count next to each point was calculated by adding the path counts of its two neighbors and advancing from one front to the next. Note that each front's values are the combinatorial values in a respective row of Pascal's triangle, so they could instead be computed as $C(x+y,x) \equiv (x+y)!/(x!y!)$. As will be seen, though, focusing instead on the "bottom-up" approach of deriving successive fronts' values from previous fronts' leads more readily to the way in which we will obtain the quantized values to be introduced below.

Having found the path count N(B)≡N(5,3)=56, we know that numbers in the range [0 . . . 55] are sufficient to guarantee a unique numeric index to every distinct path to point B. To arrive at a specific numeric classification of the paths to B, we will adopt a divide-and-conquer strategy, splitting the problem into smaller sub-problems until the sub-problems become non-problems.

Following the hint of the Eq. (2), we notice that the fifty-six paths reaching point B (after 8 steps) consist of thirty-five paths arriving from B's left neighbor $B_L$ and twenty-one paths arriving from its neighbor above, $B_A$. And, for each of the thirty-five eight-step paths $S_{35}$ arriving at B via $B_L$, there is a matching seven-step sub-path $S_L$ arriving at $B_L$. Similarly, for each of the twenty-one paths $S_{21}$ arriving at B via $B_A$ there is a matching seven-step sub-path $S_A$ arriving at $B_A$.

If we had an indexing scheme $I_7$(path) for the seven-step paths to $B_L$ and to $B_A$, we would then have an index for $S_L$ (some number $I_7(S_L)$ in the range 0 . . . 34) and an index of $S_A$ (a number $I_7(S_A)$ in the range 0 . . . 20). With these two numbers, we could then define the index for any of the thirty-five eight-step paths from $\{S_{35}\}$ as $I_8(S_{35})=I_7(S_L)$. For the remaining twenty-one eight-step paths $\{S_{21}\}$ we cannot reuse the index $I_7(S_A)$ directly by defining $I_8(S_{21})=I_7(S_A)$, as we did with $I_7(S_L)$, since these numbers are in the range [0 . . . 20] and would collide with the thirty-five already-assigned eight-step indexes [0 . . . 34]. In order to get to the twenty-one unused eight-step indexes a simple solution is to add 35 to each of the twenty-one numbers $I_7(S_A)$. So we will define $I_8(S_{21})=I_7(S_A)+35$, pushing thus these twenty-one indexes into the unused index range of the $I_8()$ index space.

In summary, we can construct indexing for the eight-step paths to B from the seven-step indexing by directly reusing the seven-step index for the paths coming from the left neighbor $B_L$ and by offsetting the seven-step index by 35 (i.e., by the path count of the point $B_L$) for the paths coming from the neighbor above, $B_A$.

We can follow this approach for any given path, moving back along the path, while accumulating the full index offset by adding the left neighbor's path count whenever the next back-step is going up, and reducing in each step the unknown residual index to the next-lower order. Eventually, we will reach an edge point (x=0 or y=0), where the path counts are 1. Since this single path is indexed by a single value 0, that completes our residual index reduction. The resulting index of the full path is thus the accumulated sum of the index offsets alone.

The numbers circled in FIG. 6 show these add-on values from the left neighbors along the backtrack for $S_8$=0 0 1 0 1 0 0 1. Adding them results for this path's index: $I_8(00101001)=35+6+2=43$. The path index thus computed is the "main" component of the compressed data. The other component is an identifier of point B. To decode the received index I, we start at the end point B and compare the index I with the path count $N_L$ of its left neighbor. If $I<N_L$, we output 0 as the decoded bit and take a horizontal step to the left. Otherwise we output 1 as the decoded bit, then set $I=I-N_L$ and take a vertical step up. We continue with this sequence until we arrive at the origin (0,0), at which point the full string has been decoded.

Since the index reduction described above is the foundation of enumerative coding and the springboard for the new approach described below, we will rewrite it symbolically for a general point $B_n=(x_n, y_n)$ reached after n steps. The left neighbor $B_L=(x_n-1, y_n)$. The number of steps to $B_n$ is $n=x_n+y_n$ and the number of steps to $B_L$ or $B_A$ is n−1. If the bit strings for paths ending in $B_n$ are denoted $S_n=b_1 b_2 \ldots b_n$ (where bits $b_i$ are 0 or 1), the coordinates $x_n$ and $y_n$ (where $y_n$ is the count of 1's in $S_n$ and $x_n$ is the count of 0's) can be expressed in terms of the input string $S_n$ as:

$$y_n = \sum_{i=1}^{n} b_i \text{ and } x_n = n - y_n. \tag{3}$$

The reduction of the n-bit index to the (n−1)-bit index then becomes:

$$I_n(b_1 b_2 \ldots b_n) = I_{n-1}(b_1 b_2 \ldots b_{n-1}) + b_n N(x_{n-1}, y_n) \tag{4}$$

This is merely a concise symbolic restatement of the earlier conclusion about the reuse of the previous order index $I_{n-1}$ with or without the offset term. The seemingly superficial factor $b_n$ in (4) plays the role of the earlier if-else descriptions: it selects whether to add (when $b_n=1$) or not to add (when $b_n=0$) the left neighbor's path count $N(x_n-1, y_n)$ to the cumulative index. By recursively expanding the $I_{n-1}$ term in (4), using Eq. (4) itself, along with the recursion termination conditions $I_1(0)=I_1(1)=0$, we obtain:

$$I_n(b_1 b_2 \ldots b_n) = \sum_{i=1}^{n} b_i N(x_i - 1, y_i) \tag{5}$$

Although (5) could be used to backtrack visually along the path (as in FIG. 6 for the $S_8$ example) and compute the path index, we will streamline it further to a form more suitable for an implementation in a computer program (i.e., a form closer to the properties of the input bit string). As was stated above, FIG. 6's numbers form Pascal's triangle (rotated by 45° with point A on top), so the path counts N(x,y) are binomial coefficients:

$$N(x, y) = \binom{x+y}{x} \equiv \binom{n}{x} = \binom{n}{y} = \frac{n!}{x!y!} \equiv C(n, x) \tag{6}$$

With this identification, the path counts being summed in (5) become:

$$N(x_i - 1, y_i) = \binom{x_i - 1 + y_i}{x_i - 1} = \binom{x_i - 1 + y_i}{y_i} = \binom{i - 1}{y_i}$$

The only non-zero contributions to the sum (5) come from those i for which $b_i=1$. Since numbers $y_i$ above are the counts of 1's within the first i steps, we can rewrite (5) in terms of the purely bit-string properties as:

$$I_n(b_1 b_2 \ldots b_n) = \sum_{j=1}^{k} \binom{n_j}{j} \quad 0 \le n_1 < n_2 < \ldots < n_k < n, \tag{7}$$

where k is the number of 1's in $S_n$ and the $n_j$'s are the values of i for which $b_i$ is a one rather than a zero. Eq. (7) is a form in which the index computation can be implemented efficiently, since it uses the input bit-string's properties directly and incrementally: at any point in the input string, the computation depends only on the values traversed to that point, and it is independent of the later ones and of the limits n and k.

The encoding proceeds by scanning the input data until the jth instance of a bit set to 1 is found at some zero-based bit index $n_j$. A binomial coefficient $C(n_j,j)$ is retrieved (usually from a table) and added to the cumulative path index (which represents the compressed data). At the end of the input data (or a block), the last j that was used is the count of 1's, which is sent to the decoder as k. The code of FIG. 7 shows the encoding procedure.

FIG. 7's second line imposes the termination condition n<M. This results in fixed-to-variable ("FV") pacing: the input-block size is fixed, while size of the resultant code is variable. Actually, though, this encoding is self-sufficient at all points: if the loop is terminated at any point where n<M, the accumulated code I up to that point is a valid path index for the bit string $S_n$ scanned up to that point and can be decoded by using the values of n and k present at the termination point. Therefore, alternative termination conditions could be used, such as limiting the count of ones (variable-to-variable, "VV") or limiting the size (in bits) of the path index (variable-to-fixed, "VF"). (This self-sufficiency is a property of the indexing formula (7), which implements the colexicographic ordering scheme. With the lexicographic ordering that more-common treatments of enumerative coding employ, the codes produced depend on the block size M.)

Some boundary cases of interest are strings consisting of all zeroes (k=0) or all ones (k=n). Since the path counts in these cases are C(n,0)=1 and C(n,n)=1, the number of bits for the path index is log(C)=log(1)=0; i.e., no compressed bits are transmitted. If the block size n is pre-defined, the only data sent are the count of 1's, which is 0 or n.

The decoder starts with the received index I, the count of 1's (the value k) and the known (e.g., pre-arranged) total number of expanded bits n. If the special boundary cases k=0 and k=n have been handled separately, the decoding proceeds as the FIG. 8 code fragment indicates.

Sliding Window Enumerative Coding

Having now examined conventional enumerative encoding in detail (and described a self-sufficient way of implementing it), we are now ready to consider one way to practice the invention. To motivate the main constructs of that approach, we will revisit the conventional enumerative-coding results from the FIG. 6 example. The index I for path [A,B] was computed to be 43, and that represented the "main" compressed data for the example input string $S_8$=0 0 1 0 1 0 0 1. To transmit this index, enough bits need to be sent to fit any of the fifty-six values that an index could have taken for sequences of the same symbol population. The compressed block size will therefore be log(56)=5.81 bits.

In addition to the index I, the decoder needs to know in advance where the end-point B was, i.e., what the source sequence's symbol population was, so more data (the side information) needs to be sent. Since there is a constraint x+y=n and in this example the two sides have agreed to a common value of n, the decoder can infer the symbol population simply from the count of 1's (the y coordinate). For our block size of 8 bits, the count of 1's could be any number from 0 to 8, spanning a range of 9 values, so it takes log(9)=3.17 bits on average to send the side information. This is more than half of the "main" compressed data size, and it makes the total compressed size 8.98 bits. That is, the "compressed" data's size exceeds even that of the uncompressed data.

By using Eq. (1), we can compute the entropy of a binary source that produces 3/8=37.5% 1's and 5/8=62.5% 0's for a block of 8 bits and obtain: H(3/8,8)=5 log(8/5)+3 log(8/3)= 7.64 bits. Although our "main" compressed data, the bit-string index, had used only 5.81 bits, which is less than the entropy of 7.64 bits, the side information's overhead (the 3.17 bits) turned the encoding into a net data expansion.

If we were to use blocks larger than eight bits, the compression would improve, because the side information grows slowly, only as log(n), i.e., much more slowly than the (linearly increasing) entropy. For example, for a block size of 256 bits instead of 8 bits and the same fraction of 3/8 for 1's, the side-information overhead is at most 8.01 bits, and the index would use 240.1 bits, yielding the net compressed output of 248.1 bits (or about 245 bits if the side information itself is being compressed, as could be done in a case in which there is a larger number of blocks and the number of 1's follows a Gaussian distribution), while the entropy in this case is 244.3 bits. If the block size is 256 bits or above and the side information is itself compressed, enumerative coding compresses at practically the entropy rate (i.e., 245 bits vs. 244.3 bits).

To quantify the output properties of enumerative coding beyond the illustrative examples, we need to examine the general case of the path index (6)–(7). The size (in 20 bits) of the path index $I_n$ for an n-bit sequence that contains exactly k ones is log(N(n–k,k))=log(C(n,k)), where the binomial coefficient C(n,k) is the path count for n-bit strings with k ones (cf. (6)–(7)). Applying the Stirling approximation for factorials, $$n! \cong \sqrt{2\pi n}\left(\frac{n}{e}\right)^n\left(1 + \frac{1}{12n} + O\left(\frac{1}{n^2}\right)\right), \quad (8)$$

to the three factorials in C(n,k) yields:

$$\log(C(n,k)) \cong k\log(n/k) + (n-k)\log n/(n-k) - \frac{1}{2}\log\left(\frac{2\pi k(n-k)}{n}\right) \quad (9)$$

We can express the bit counts above in terms of the corresponding probabilities through p(1)≡p=k/n and p(0)≡q=(n–k)/n, which transforms (9) into:

$$\log(C(n,k)) \cong n[p\log(1/p) + q\log(1/q)] - \frac{1}{2}\log(2\pi npq). \quad (10)$$

Comparing (10) with the entropy (1) for a two-symbol alphabet (R=2 in (1)) reveals that n[p log(1/p)+q log(1/q)] is this n-bit string's entropy. The second term (which is logarithmic in n) is a small negative correction, which reduces the size of the path count N(n–k,k) to a value slightly below the source entropy. This is the effect exhibited by the earlier numeric examples. The reduction is: ½ log(2π npq)=½ log(2πqk) bits. Since the bit cost of sending k, the count of 1's (or 0's if 0 is the less frequent symbol) is log(k) bits (if sent uncompressed), the reduction in (10) is around half the bit cost of sending k, so the total output (path index plus side information) exceeds the entropy by ½ log(2π npq).

Another redundancy, not explicit in (10), is one that becomes more significant for smaller blocks. It is the fractional-bit-rounding loss, which results from the fact that the compressed data can be sent only in whole numbers of bits. From the example of the (8,3) block, the index is a number in the range [0 . . . 55], so it contains log(56)=5.81 bits of information. A six-bit number is required to transmit that index, but a number of that size can represent a larger range, i.e., [0 . . . 63], so sending the index wastes the unused eight values of the range [56 . . . 63]. In terms of bits, this is a waste of 6–5.81=0.19 bits, or about 3.3% of every 5.81-bit index sent.

In summary, enumerative coding is optimal to within the ½ log(2π npq)/n of the source entropy (per input symbol), so the block size n is the key controllable factor that determines the degree of the optimality. Another ingredient in (10) that affects the optimality (but to a lesser degree) is the product pq, but that is the property of the source and not of the encoder. For lower-entropy sources (pq→0), the degree of optimality is higher than for higher-entropy sources (p, q→½).

Although Eq. (10) demonstrates the appeal of larger blocks, it also shows why they cannot be achieved in a straightforward way (such as the way that FIG. 7 illustrates). Specifically, the terms being added at any point in the FIG. 7 loop are of the size given by (10), i.e. they are proportional to the processed size n scaled down by the factor $H(p) \equiv p \log(1/p)+q \log(1/q)$ (the entropy function), which is the compressed data size at that point. Not only does the addition operation's precision need to be high (of the order n), but the memory used to store tables of pre-computed binomials $C(n,k)$ is of the order $n^3$ (since it needs to contain $n^2/4$ entries of n bits each). This rapidly becomes impractical.

To introduce our solution for both problems, we need to examine more closely the arithmetic of the enumerative encoder. We will reuse the example from FIG. 2, the encoding of a string $S_8=00101001$. The streamlined formula (7) yields for the path index:

$$I_g(00101001) = \binom{2}{1} + \binom{4}{2} + \binom{7}{3} = 2 + 6 + 35 = 43.$$

or, in binary:

$$\begin{array}{rrr}
 & 0 & 0 \\
+ & 1\,0 & +\ 2 \\
\hline
 & 1\,0 & =\ 2 \\
+ & 1\,1\,0 & +\ 6 \\
\hline
 & 1\,0\,0\,0 & =\ 8 \\
+\ 1\,0\,0\,0\,1\,1 & & +\ 35 \\
\hline
1\,0\,1\,0\,1\,1 & & =\ 43
\end{array} \quad (11)$$

The indicated additions illustrate the growth of entropy as the coding progresses. The self-sufficiency property of colex indexing (7) implies that any add to the existent sum increases the size (in bits) of the sum by the entropy of the symbol that triggered the add. Roughly speaking, since the adds occur on encountering bit=1 (the less frequent of the two symbols), the running entropy has to increase by more than one bit for each add, so the add-on terms almost always have to be at least of the size of the existent sum. We can see this pattern, as (11) above demonstrates.

A further heuristic observation is that the bulk of the entropy production occurs at the leading (the most-significant) bits of the sum. Although carry propagation in the lower bits can lengthen the sum, that happens only rarely. (The probability of such an occurrence drops exponentially with the distance d of the bit from the sum's leading edge). So the activity in the lower bits, far away from the leading edge, seems to be of little importance—except that it expands the required arithmetic precision to the output-data size.

Now, that unfortunate result would be eliminated if the ones in the add-on terms' resolutions were limited. (We will say that the resolution in radix r of a value N is h if h is the number of radix-r digits in the smallest quotient that results from dividing N evenly by a non-negative-integer power of r.) It could be eliminated, that is, if the conventional add-on terms $N(x,y)$ (which are by (7) binomial coefficients) were replaced with values $V(x,y)$ that could be expressed as floating-point numbers whose mantissas are short. It turns out, though, that simply rounding the conventional path-count values to such low-resolution values does not work; the resultant indexes are not always unique. But I have recognized that the add-on values can be selected in a way that both satisfies the short-mantissa requirement and produces a decodable result—and still achieve nearly the same degree of compression that the conventional binomial values do.

A way in which this can be achieved can readily be understood by returning to FIG. 6's path counts. By presenting their computation as the recurrence relationship of Equation (2) rather than as the binomial term $(x+y)!/(x!y!)$, we have shown the way to arrive at add-on terms that have the desired properties. Specifically, such add-on terms can be obtained by employing the approach of Equation (2) with one change. When the result of that equation for a given value of $N(x,y)$ cannot be expressed exactly as a floating-point value whose mantissa is short enough, it is rounded up to a value $V(x,y)$ that can be—and then used the result in computing $V(x+1,y)$ and $V(x,y+1)$. That is, the rounding is applied to values that have been computed from values that themselves have potentially resulted from rounding. By thus applying the rounding in a "bottom-up" manner we ensure that the resultant index is unique among those computed for sequences whose symbol population is the same.

Note that in principle the "rounding up" can be any operation that results in an appropriate-resolution value greater than or equal to the value for which it is being substituted; it need not be the lowest such value. Indeed, the rounding-up operation can be performed even for values whose resolution is already low enough. In practice, though, it will ordinarily be preferable to employ the lowest such value. In the discussion that follows we will therefore assume an embodiment that observes that restriction. In that discussion it will be convenient to take an object-oriented-programming perspective and treat the add-on values during their computation in this embodiment of the invention as instances of a "sliding-window-integer" ("SW integer") class of data objects. This class's data member takes the form of a floating-point number (although not typically one represented in accordance with, say, the IEEE 754 standard). Additionally, this class will include method members. The method members perform what we will refer to as "sliding-window arithmetic," which implements the above-mentioned rounding uniquely and is used to compute further add-on values (but not the resultant indexes).

Before we describe SW arithmetic in detail, we need to examine the requirements that arise from the add-on-values' computation. We also need to assess how feasible using them for enumeration is in the first place, especially for arbitrary-length input blocks.

Initially, we assume only the properties of the SW integers without which they would not be useful at all. Their defining structural feature is the formal separation of the significant digits (the window or the mantissa) from the tail of zeros (specified as the shift or the binary exponent for the window). We can express this feature as follows:

$$W \equiv W(w,s,m) \equiv W(w,s) = w \cdot 2^s \text{ and if } (s>0) \text{ then} \\ 2^{m-1} \leq w < 2^m \quad (12)$$

or, more visually:

$$W(w, s, m) = \overbrace{1xx\ldots x}^{m\text{-bit }w}\overbrace{000\ldots 0}^{s\text{ bits}} \quad (12a)$$

The SW integer W in (12) shows the significant bits as integer w, the shift as s and the width of the mantissa (in bits)

as m. The three forms shown with different degrees of detail are synonyms. For computational convenience, the mantissa is normalized, i.e. mantissa w satisfies $2^{m-1} \leq w < 2^m$ for s>0. For s=0 (i.e., when the mantissa's value is that of the non-shifted integer), $0 \leq w < 2^m$. In practice, such values may be stored in a packed format, in which the mantissa's most-significant bit is implicit for s>0. That is, w's most-significant bit, which must be 1 for s>0, is not stored, but instead gets inserted automatically by the lookup function. For the packed SW format it is convenient to use a biased shift, i.e., $W(w,r,m) \equiv w \cdot 2^{r-1}$ for r>0 and $W(w,r,m) \equiv w$ for r=0, where $r \equiv s+1$ for $W \geq 2^{m-1}$ and r=0 for $W < 2^{m-1}$. That enables value r=1 to be used as an signal of the implicit bit's presence of for s=0 and $w \geq 2^{m-1}$.

We will now examine how large an SW integer's shift s and mantissa size m need to be to represent the binomials in (7). In the high-entropy range of p, i.e., where p=q=½, Equation (10) shows that $\log(C(n,n/2)) \leq n$, so the binomial uses at most n bits. From (12a) it then follows that shift s requires no more than $\lceil \log(n-m) \rceil$ bits. The mantissa size m is a parameter that affects the path index's size (and therefore the compression ratio). For SW integers to represent $n^2/4$ distinct binomials up to C(n,n/2) they need ≈2 log(n) bits, and, since the shift s provides log(n) bits, the mantissa size m has to be at least $\lceil \log(n) \rceil$ bits as well. In the discussion below of add-on-value tables, though we will find that m need not be greater than $\lceil \log(n) \rceil + 1$ bits for the compression to be practically optimal, i.e. to have less than a single bit of redundancy per n bits of input data.

Using the packed format for the add-on-value tables results in the entry size for the binomial tables of $2 \cdot \lceil \log(n) \rceil$ bits, which is ½ n/log(n) times as small as the tables that conventional enumerative coding would require. For example, the tables would be 50 times as small for n=1024, or 293 times as small for n=4096. And the speed advantage of using low-resolution add-on values is at least twice that great.

This speed estimate is based on the assumption that the new terms being added in accordance with Equation (7) are roughly of the same size or slightly larger than the partial sums to which they are being added, i.e. that they exhibit the pattern shown in (11). A case that would cause a problem would be a situation in which the cumulative sum is large (e.g. roughly of the size of compressed data), while the term being added is comparatively small. In such an instance, the add-on term's leading digits could be far behind the sum's, and carry propagation could require the adds to proceed across the entire gap between the addends' leading digits. Our earlier preliminary argument against this type of occurrence was based on the growth of the instantaneous entropy. I.e., since the adds occur only when a less-frequent symbol is encountered, they have to increase the entropy of the output by more than a single bit, so the add-on term has to be at least as large as the partial sum to which it is added. However, the ratio of 1's and 0's can change over the span of a block: what was the less-frequent symbol initially may later become the more-frequent one overall. To clarify the potential carry-propagation problem, we will examine the individual adds in (7) more closely.

Figure 9:
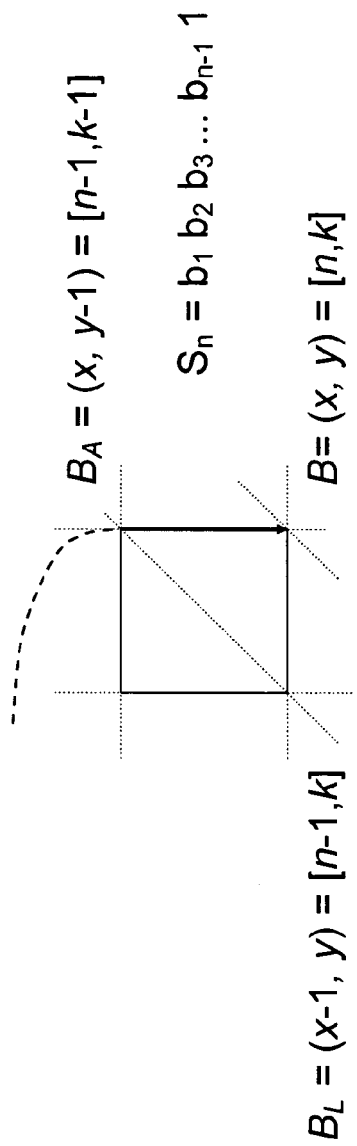
FIG. 9 is a diagram that depicts the relationships between successor and predecessor symbol populations.

FIG. 9. depicts a general arrival at some (symbol-population-representing) point B=(x,y) through a path representing a sequence $S_n$ that ends in $b_n=1$. The path therefore ends in a vertical step from a point above it, $B_A=(x,y-1)$. (Equation (7) calls for adding add-on terms only on vertical steps). Also shown is B's left neighbor, $B_L=(x-1,y)$ since its path count will need to be added to the running sum. Next to the coordinates' (x,y) formats are the corresponding [n,k] formats obtained in accordance with (3): n=x+y, k=y, n-k=x.

The sum of interest is the one at point $B_A$, $\sigma(B_A) = \sigma(n-1,k-1)$, which was obtained from (7) by adding along the sub-path to $B_A$: $S_{n-1} = b_1 b_2 \ldots b_{n-1}$. Since $\sigma(B_A)$ is also the path index of the sub-path $S_{n-1}$ (by the self-sufficiency property of (7)), it is always smaller than the path count to $B_A$, $N(B_A)$, which from FIG. 9 is $N(B_A) = C(n-1,k-1)$. Therefore:

$$\sigma(B_A) = I_{n-1}(b_1 b_2 \ldots b_{n-1}) < \binom{n-1}{k-1} = \qquad (14)$$

$$\frac{\overbrace{(n-1)(n-2)\cdots(n-k+1)}^{k-1 \text{ factors}}}{1 \cdot 2 \cdots (k-1)} \equiv C(n-1, k-1)$$

The term we are adding on arrival to B is the left neighbor's path count, i.e., $N(B_L)$ which is C(n-1,k). The ratio r between the $\sigma(B_A)$ and the add-on term C(n-1,k) is:

$$r = \frac{\sigma(B_A)}{C(n-1,k)} < \frac{\binom{n-1}{k-1}}{\binom{n-1}{k}} = \frac{k}{n-k} < n \qquad (15)$$

(Note that (15) assumes k<n. Otherwise, k=n→x=n-k=0, so B would be on the left edge and there would be no left neighbor $B_L$ and therefore no addition in (7) or carry propagation to consider.) The last inequality in (15) shows that the accumulated sum in (7) is never more than n times as great as the next term being added. This means that, if the add-on term is less than the accumulated sum, the difference between the position of the add-on term's most-significant one bit and that of the accumulated sum to which it is being added is never greater than log(n) bits, so it is less than the mantissa width m. That is, the carry propagates within the arithmetic precision of the sliding window, which will typically be kept well within machine-word precision. So any carry propagation due to the small add-on terms can occur within the machine word. (As will be explained below, though, some embodiments may nonetheless employ double-word—or even greater—arithmetic precision.)

In most implementations, the index calculations will be so arranged that the additions occur on the less-frequently occurring symbol, which in these discussions is assumed to be 1. Since k is the number of 1's and (n-k) is the number of 0's up to any point B, Equation (15)'s tighter inequality, i.e., r<k/(n-k), means that r<1 for all points at which the cumulative count of 0's dominates the count of 1's. In such path regions the add-on terms are greater than the current sum, as entropy considerations and example (11) already indicated.

If the index computation is performed in order of increasing volume values, then a key implication of Equation (15) concerns the compressed data's buffering and output. Since it is only the SW integer's m-bit mantissa w that is being added to the (machine) integer, and since the (SW-integer) add-on terms in (15) will never needed to be added to any bit positions more than log(n) bits from the end of the output buffer, no bits farther back than the distance $d = m + \lceil \log(n) \rceil = (2\lceil \log(n) \rceil + 1)$ bits from the current sum's leading bit will change any more. So those bits can be output immediately while the encoding progresses. Also, the output buffer can be very small; a d-bit buffer would suffice. These are features that conventional enumerative coding lacks.

In view of this carry-propagation analysis, it is likely that most index-computation circuits that employ the present invention's teachings will perform the limited-precision additions corresponding to those of Eq. (7)'s (unlimited-precision) additions in the order of increasing j in that equation, i.e., will sequence add-on-term addition from the smaller ones to the larger ones. For the proposed SW-integer add-on terms, this implies that the additions in (7) will go from smaller shift values of s to larger ones (which is a binary digit position for the mantissa as shown in (12a)). This ordering plays the same role as the analogous rule in elementary arithmetic that the additions of multi-digit numbers advance from the least-significant digits toward the more-significant; if they proceeded the other way, carries would propagate in the direction opposite from that in which the additions do, and this would necessitate backtracking to fix up the carry in the digits already left behind. So most embodiments will probably observe the n-sequencing rule and thereby avail themselves of the resultant efficiency advantage.

However, it may be important in some circumstances not only for the compressed bits to be sent incrementally with minimum coding delay but also for the decoder to be able to decode the incoming bits as they arrive, without waiting for the block completion. Embodiments that operate in such circumstances may violate the n-sequencing rule. The coding would proceed from $n_k$ down to $n_1$ (where $n_k > n_{k-1} \ldots > n_1 \geq 0$), and it would use a convention that the bit index $n_j$ is the bit position from the end of the block, so the maximum $n_k$ would point to the input string's first 1 bit. This would be analogous to adding long numbers by starting with the most significant digits and moving down to the least significant digits. To eliminate the need to delay transmitting the initial (most-significant) index bits because of the possibility of a carry, an extra 0 bit could be inserted into the buffer whenever more than 2 log(n) back-to-back 1's are sent. That stops any carry that would otherwise propagate beyond it, and, if the encoder encounters that many 1 bits in a row, it can infer that the next bit—which would be a 1 if it stopped a carry—is such an inserted bit. That inserted bit's value affects only the decoder's determination of its later output bits, so the encoder can compute the first bits without waiting for it. Of course, inserting the additional bit increases coding redundancy slightly, and it would increase processing time.

Quantized Indexing Enumeration

Having established the properties of SW integers that show their storage and computation advantages, we now turn in detail to the more-basic question: does the above-mentioned approach to selecting SW-integer replacements for the binomials in (7) result in output that is decodable and that can be nearly optimal? Perusal of the steps that lead to the binomials in (7) reveals that recurrence (2) is the step that fixed the choice to binomials, and it correctly specifies path counts. But the real objective there was to construct a path-indexing approach; the path counts were merely a tool used at that stage to limit the size of the indexing space. The connection between the path counts and the indexing space's size needs to be loosened if SW integers are used for the enumeration.

To make the distinctions between those concepts more precise, we define a separate quantity, the indexing volume V(x,y) at a point (x,y), as the size of indexing space reserved for the paths reaching (x,y). In these terms, conventional enumerative coding's largely unstated assumption, which we will call tight indexing, is:

$$V(x,y)=N(x,y) \quad (16)$$

We will drop this constraint. Instead:

$$V(x,y)=W(w,s,m) \quad (17)$$

That is, we will require that volumes be proper SW integers with mantissa size m. The arguments s and w in W(w,s,m) are themselves functions of x and y, i.e. w=w(x,y) and s=s(x,y), while m is chosen to produce the application-specific best compromise between the compression optimality and table size. In most embodiments it will be a constant for a given block size n. For reasons that will become apparent, it will usually satisfy the condition m=m(n)>log(n)+1 and m(n)→log(n)+1 for n→∞.

Of course, the path counts are still relevant; the pigeonhole principle requires that the volumes have to be at least as large as the number of paths to be indexed. But instead of complying with (16), which imposes the pigeonhole principle constraints maximally tight and all at once, we will phase in these constraints on the volumes gradually, leaving enough room to continue satisfying the requirement that the volumes remain SW integers (for a given mantissa size m).

To express the rest of the formula for generating volumes for any point (x,y), we will need to extend the SW arithmetic to the case SW+SW→SW. Since adding the integer forms of two SW numbers can result in more significant bits than the maximum allowed m (e.g. if their shifts s differ significantly), we will need some rules for turning the excess nonzero bits to zero. Keeping in mind the generator for the path counts (2) and that the pigeonhole principle limits us from below, i.e., that in addition to keeping the result as a proper SW integer, we need to maintain V≧N throughout, the smallest resulting volume that can satisfy both requirements will be an SW integer whose mantissa w results from rounding up the result of the addition to the nearest larger SW integer.

We therefore introduce the following rounding rule. To add $W_1+W_2=W(w, s, m)$, we in principle expand $W_1$ and $W_2$ into the large-integer format of (12a) and obtain the regular integer sum of the resultant two large integers in a form of a c-bit wide large integer L, thus L is bounded as: $2^{c-1} \leq L < 2^c$. (The actual code for implementing the operation would ordinarily follow an equivalent but much more-streamlined procedure. Rather than literally allocating space to expand the W's into the form (12a), padding s bits with zeroes, and adding two such long blocks, it would be cheaper merely to compare the two shifts s and perform at most a single add of the resultant native machine integers—or, if the shifts s differ by m or more, perform no addition at all.) If c≦m the result L is already an SW integer with s=0, and the addition is complete. If c≦m, the leading m bits are extracted from L into an integer w (the mantissa of W), and the shift s of W is set to s=c−m>0. Then, if there is any nonzero bit in L's remaining s bits, w is incremented by 1. If this increment causes w to grow beyond m bits, the SW integer is renormalized by setting w=w/2 and s=s+1. That completes the rounding procedure of L into W and the computation of the sum.

We now apply this SW-addition rule to one way of computing volumes of the type that can be used to practice the invention. In most embodiments, the volumes V(x,y) for the boundary points (x,0) and (0,y) will be set to 1). The volume values for the remaining points will then be determined in accordance with:

$$V(x,y)=V(x-1,y)+V(x,y-1) \quad (18)$$

Recall that by (17) the volumes are SW integers. Therefore, although (18) appears the same as its counterpart (2), the addition in (18) is SW addition, the resultant V(x,y) actually can sometimes be greater than the conventional, non-SW sum of V(x−1,y) and V(x,y−1). In contrast, the result N(x,y) in (2) was always exactly equal to the conventional sum N(x−1,y)+N(x,y−1).

By using (17) and (18), the index volume V(x,y) can be computed for all lattice points of interest. By (18), the index space size V(x,y) for any point (x,y), satisfies the pigeonhole principle, so each point has enough index space (and, because of the rounding in (18), generally more than enough) to enumerate all the paths arriving there from the two predecessor points (i.e., the neighbors to the left and above). Therefore, the index-reduction recursion (4) (and its expanded form (5)) will apply as is (i.e., without further rounding), becoming:

$$I_n(b_1 b_2 \cdots b_n) = I_{n-1}(b_1 b_2 \cdots b_{n-1}) + b_n V(x_n - 1, y_n) \quad (19)$$

$$I_n(b_1 b_2 \cdots b_n) = \sum_{i=1}^{n} b_i V(x_i - 1, y_i) \quad (20)$$

Eq. (6), which identifies N(x,y) as binomials C(n,k), will not apply, since the volumes V are not exact binomials, so the counterpart of the final Eq. (7) will retain the volumes from (20). To switch from the coordinate parameters (x,y) to the direct bit-string parameters (n,k), as we did in (7), we will define coefficients B(n,k)≡V(x,y), where n=x+y and k=y. This leads from (20) to a counterpart of Eq. (7):

$$I_n(b_1 b_2 \cdots b_n) = \sum_{j=1}^{k} B(n_j, j) \quad 0 \le n_1 < n_2 < \ldots < n_k \le n \quad (21)$$

Encoding and decoding procedures employing quantized indexing can therefore be performed largely as in FIGS. 7 and 8, with the exceptions that the lookup for the coefficients C(n,k) is replaced with a lookup for the B(n,k) and that the coefficient addition to and subtraction from the cumulative index I are performed by using SW arithmetic for large integers, which has O(1) complexity instead of the O(n) complexity that tight indexing requires.

Of course, quantized indexing does impose a cost. Of all the sequences that have a given symbol population, there is one that results in the highest index: each symbol population is associated with a maximum index. In a quantized-indexing scheme, a symbol population's maximum index is often greater than the number of sequences that have that symbol population. If $I_r$ is a given symbol population's maximum index under a given quantized-indexing scheme and $I_t$ is its maximum index under a tight-indexing scheme, a quantized-indexing scheme results in excess redundancy if it takes more bits to express $I_r$ than to express $I_t$, i.e. if $\log(I_r)$ exceeds $\log(I_t)$. Now, quantized indexing's advantages more than justify this compression compromise in almost all applications. Still, it is preferable if the add-on-value set is so chosen that the excess redundancy is not too great, so the mantissa length will usually be so chosen as to restrict redundancy to within a desired limit.

To obtain a general redundancy estimate for a given mantissa size m (or to find the value of m that keeps the redundancy below some specified value), we will first note that, for a given block size n and count k of 1's, the index size in bits has to be log(C(n,k)) for tight coding or log(B(n,k)) for quantized coding, independently of the sum (7) or (21) obtained. This is true because the index-calculation recurrences guarantee that the index for any path is smaller than the reserved indexing space C(n,k) or B(n,k). (For brevity we here assume a fixed-to-variable output-pacing scheme. Variable-to fixed or variable-to variable schemes would actually produce marginally better results.) Therefore, to assess the quantized-indexing scheme's redundancy in comparison with tight indexing for any particular (n,k) pair, it is necessary only to find how much larger than the tight-indexing space C(n,k) the quantized-indexing space B(n,k) can become. We will therefore examine the error generation and propagation in the volume-table-computation formula given by (17) and (18), which includes the SW+SW=SW rounding rule.

Since w is at least $2^{m-1}$ for any volume V=V(w,s,m) in which s exceeds zero, the factor f by which rounding-caused incrementing of w can expand the resulting volume V in (18) with respect to the exact sum cannot exceed $(1+1/2^{m-1})$ for a single rounding. The maximum number of such expansions for any n-step point is (n−m), since for the first m steps the exact C(m,k) cannot exceed $2^m$. Therefore, the total volume-expansion factor $f_n$ for any n-step point is at most $f^{n-m}$, implying: $f_n < (1+1/2^{m-1})^n$. Since an expansion factor $2^c$ increases the width of the volume $V_n$ by c bits, a constraint sufficient to keep the redundancy below c bits per block (where c can be a fraction) is $(1+1/2^{m-1})^n < 2^c$. This yields the following lower bound for m:

$$m(c) \ge \lceil \log(n/c) + \log(\log(e)) \rceil + 1, \quad (22)$$

where e is the base of the natural logarithm.

To halve the maximum number of added bits c, for example, we need to increase mantissa width by one bit. Similarly, if we wish to double the block size n, we also need to increase mantissa width by one bit. Eq. (22) also gives the maximum number of extra bits for a given block size n and mantissa width m as $c = n/2^{m-1}$.

It is likely that in most embodiments the volume values for will be so selected as to limit the redundancy to a single bit or less. Actually computing B(n,k) for all block sizes n up to 16384 with the mantissa length m set to $\lceil \log(n) \rceil + 1$ (i.e., with the mantissa length specified by (22) for a maximum error c no more than a single bit) yields a maximum redundancy of 0.5 bit per block and an average redundancy (over all k) of 0.3 bit/block. Both figures remained roughly constant over the tested range of n. So embodiments can be designed to limit redundancy to a single bit and still violate the sufficient but not necessary constraint set forth in Equation (22).

Now, the add-on values will not in all embodiments be so chosen as to restrict the redundancy to a single bit. Some, for example, may permit up to two bits of redundancy, and some may permit more. But few if any embodiments will be so designed as to permit c to exceed n/8. Most designs will likely restrict c to less than n/12 or n/16—indeed, to less than n/24 or n/32.

Figure 10:
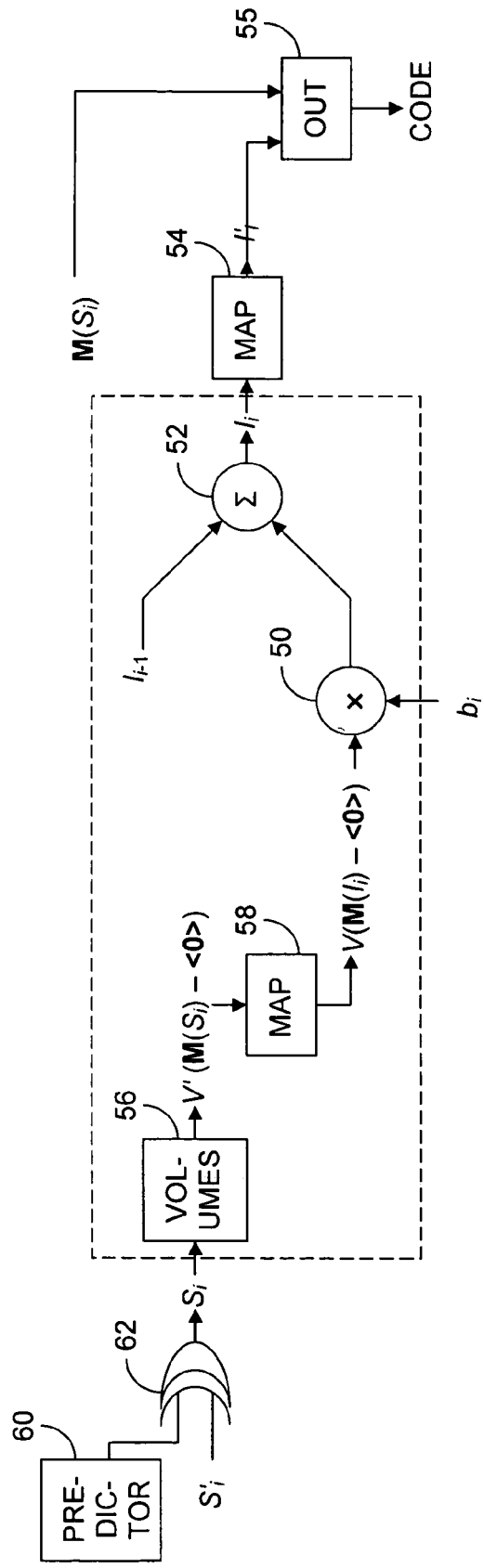
FIG. 10 is a block diagram that depicts one way of implementing an encoder's index-computation circuitry.

Although the description so far has concentrated on embodiments that apply the present invention's teachings to a binary alphabet, their applicability is not so limited; as will be explained below, they can be applied to larger alphabets. Before we turn to such alphabets, though, we will consider FIG. 10. The code that results from, say, FIG. 1's entropy encoding 16 will be determined in part from the encoded sequence's symbol population and in part from an index that uniquely identifies the sequence among the permitted sequences that share that symbol population. FIG. 10 conceptually depicts an example of one type of index-calculation circuit that can employ the present invention's teachings to arrive at that index.

Now, it is conceivable that some encoders that use the present invention's teachings will bring them into play only in certain circumstances. For example, they may use them only in cases where the number of symbol sequences that share the received sequence's symbol count is high. In view of machine-architecture considerations, for example, a "high" symbol count may be, say, $2^{16}$, $2^{32}$, $2^{64}$, or $2^{128}$. It is likely that in most cases, though, the encoder will employ such an index-generation circuit for all codes, or at least all codes representing sequences that share a symbol population with other sequences.

In any event, FIG. 10 omits for the sake of simplicity the encoder's symbol-population-determining elements, which, as FIG. 7 suggests, would typically (but not necessarily) be determined concurrently with the index. To lay the groundwork for appreciating the parallel between the binary case discussed so far and the larger-alphabet cases to be considered later, FIG. 10 represents symbol population as a vector M that extends from the origin to the FIG. 6 lattice position corresponding to that population. In that representation, the population vector can be thought of as a linear combination of two orthogonal unit basis vectors <0> and <1>, whose directions are respectively rightward and downward in FIG. 6. (That is, M is a vector in 2-space for a binary alphabet, and, in general, M is a vector in n space for n-symbol populations.) The population vector's projections onto the <0> and <1> axes are respectively the numbers of zeros and ones that define the population. With that representation, the add-on term for a given sequence is, as FIG. 10 indicates, the indexing volume V for the symbol population whose vector results from subtracting <0> from the given sequence's population vector M.

As was explained above, a sequence's index in most embodiments is the same as its prefix's index if that sequence differs from that prefix by only the addition of a terminal zero: an add-on term is added only if the current bit is a one. FIG. 10 represents this conceptually with a multiplier 50 that produces the product of the add-on term and the given sequence's last bit; the product is zero—i.e., there is nothing to add—if the sequence's last bit is a zero. An addition-operation block 52 represents generating the index $I_i$ for an input sequence $S_n$'s i-symbol prefix $S_i$ by adding the multiplier 50's output to the index $I_{i-1}$ for the i–1-symbol prefix $S_{i-1}$.

Now, it was mentioned above that in some embodiments the entropy encoder's output may not simply be the result of that addition; in embodiments that compute the index from the large-add-on-value end first, for example, the encoder may add extra, carry-accumulator bits into the output so that the decoder can begin decoding before it receives all of the code's bits. So FIG. 10 includes a mapping block 54 to represent the fact that some embodiments may use a transformation of that or some other type. In many embodiments if not most, though, that block corresponds to no actual operation, because in those embodiments the index component represented by the encoder output will actually be the same as the output of the index calculator. Although the index computation is FIG. 10's focus, it additionally includes a block 55 to represent combining the index with an indication of the symbol population to produce the resultant code.

Particularly since in enumerative coding the add-on values do not need to depend on expected symbol statistics and therefore do not have to be recomputed as statistics change, the add-on values will usually have been pre-computed and stored before actual index computation. So FIG. 10 employs two blocks 56 and 58 to represent the task of obtaining the add-on values. Block 56 represents determining the symbol population from the input sequence and retrieving a pre-stored value thereby specified. In principle, the add-on values do not have to be precisely those described above, i.e., the values obtained in accordance with Eq. (18), but they will be in most embodiments. Even when they are, though, what has been pre-computed and stored may be values from which respective intended add-on values are derived, rather than those add-on values themselves. To indicate this possibility, the drawing includes block 58, which represents mapping the retrieved values to the intended add-on values.

As was explained above, the additions that block 52 represents would in practice be performed only for every 1 bit, even though FIG. 10 depicts the index-calculation operation conceptually as performing an addition for every bit. It will therefore be helpful if 1 bits occur less frequently than 0 bits. To this end, the encoder may employ some kind of a bit predictor 60. An XOR gate 62 represents comparing the predicted bit (which needs to be the same as the output of a similar predictor in the corresponding de-coder) with the actual bit and supplying the comparison result as the input to the index-computation operation. To the extent that the predictions tend to be good, 0's will, as desired, predominate in that input.

The predictor may, for example, base its prediction on higher-level information, such as what the corresponding bit's value was in a previous image frame's data. Or it may use lower-level information, such as what the immediately previous bit was. In many embodiments that use this expedient, the basis of the prediction may simply be knowledge of which bit predominates in the input block. (Although that requires accumulating a whole block before starting to encode, the resultant delay will be essentially "free" in many applications because other latencies will mask it.) That is, if 1's predominate, the predictor output will simply be a 1, so the index-computation operation will see the complementary sequence, in which 0's predominate.

With the exception of the add-on values that it employs, the index-computation circuit 64 of FIG. 10 operates in a manner that could be employed for tight-indexing enumeration. That is, it could be implemented in a routine essentially the same as that of FIG. 7, with the binomial terms there replaced with quantized-indexing volumes. With quantized indexing, though, the add-on values are so chosen that the addition represented by block 52 can be performed with reduced resolution. A complementary decoder can bear a similar relationship to the FIG. 8 routine.

FIG. 11 gives an example of one way in which the limited-resolution operation can be performed. One of the addends, namely, the accumulated index $I_{i-1}$, is a "big integer," i.e., a number that takes potentially many machine words 66 to store. The other addend, namely, the add-on value V, represents a number that is at least nearly as big and usually bigger than the accumulated index but, as was explained above, has been so chosen that it can be expressed exactly in less than that many words. Typically, in fact, it will be stored as a mantissa w and an exponent s whose lengths together do not exceed the machine-word length t. For that reason, the drawing shows it as occupying a single machine word 68.

Rather than access all of the big integer's words 66, the processor can restrict itself to accessing a pair of words 70 selected, as the drawing indicates, in accordance with the exponent value s. (In principle, the access can be restricted to a single word-sized segment of $I_{i-1}$ rather than a pair of words, but the example of FIG. 11 is based on the assumption that targets of word-size accesses must be word-aligned, i.e., that the address of a b-byte word targeted by a word access must end in log b zeros.) The mantissa is then shifted in accordance with the exponent value s, as the drawing indicates, to result in a two-word value 72. In a double-precision addition operation, that value is added to the two selected index words 70, which are then replaced with the resultant sum. (With appropriate shifting, of course, that addition could instead be performed in a single-precision operation.) The next (multi-word) index value $I_i$ thereby results without accessing more than two of its words.

FIG. 12 shows the same operation in a system that permits word-length accesses at half-word boundaries. It employs identical reference numerals to refer to structures that correspond to same-numbered structures in FIG. 11, but in FIG. 12 the structure 66 that stores the index is treated as an array of half words rather than of whole words. In the case of a thirty-two-bit system, for example, the array-element length l would be sixteen bits in FIG. 12 rather than the thirty-two bits that it would be in FIG. 11. The two index half words 70 to be accessed as a single word are selected, as the drawing indicates, in accordance with the exponent value s. And the mantissa is shifted in accordance with the exponent value s, as the drawing indicates, to result in a single-word value 72. In a single-precision addition operation, that value is added to that of the selected index word 70, which is then replaced with the resultant sum. The next index value $I_i$ thereby results without accessing more than a single index word.

Methods for Reducing the Table Size

If the mantissa size m is set to $\lceil \log(n) \rceil + 1$ and the packed format is used for the entries B(n,k) in the add-on-value table, the size of each entry (which contains the mantissa w and the shift s) will be $2\lceil \log(n) \rceil$ bits. The full table up to a given n needs to hold $T(n) \equiv n^2/4$ entries, resulting in table size of $T_1(n) \equiv n^2 \lceil \log(n) \rceil / 2$ bits or $T_8(n) \equiv n^2 \lceil \log(n) \rceil / 16$ bytes. For block sizes up to n=256, for example, the B(n,k) table will have T(256)=16,384 entries (16 bits/entry), so the table size in bytes is: $T_8(256) = 32,678$ bytes.

In the situations where the memory is very limited or large block sizes are needed, the Pascal-triangle-like recurrences (18) offer a flexible choice for trading speed off for reduction in lookup-table-memory size. One can cut memory size in half, for example, by omitting from storage the table entries for every second value of n and computing the unstored values on the fly in accordance with $$B(n,k)=B(n-1,k)+B(n-1,k-1) \tag{18a}$$

which results from rewriting (18) in terms of the bit-string parameters (n,k) and the actual table entries B(n,k). The average number of extra adds that result from thus having skipped alternate rows' storage is one-half add per coefficient request. Expanding each B(n-1,*) term in (18a) and substituting the results back into (18a) itself yields:

$$B(n,k)=B(n-2,k)+2B(n-2,k-1)+B(n-2,k-2). \tag{18b}$$

This allows us to skip two rows out of every three and thereby reduce the table size to a third of the original size, in return for two adds (and a shift, which is merely an increment of B's s parameter) in the worst case. In this case we still use (18a) to compute B(n-1,k) values on the fly from the B(n-2,*) row by using a single add of (18a). On the average, this will result in (0+1+2)/3=1 extra adds per coefficient access.

More generally, for a required size-reduction factor r, we can skip r-1 rows out of every r rows by using (18a) applied (r-1) times to its own terms. For the worst case this yields the following coefficient computation:

$$B(n,k) = \sum_{j=0}^{r-1} \binom{r-1}{j} B(n-(r-1), k-j) \tag{18c}$$

In most practical embodiments that use such skipping, the reduction factors r in (18c) will be relatively small in comparison with n so that the multiplications of the small add-on terms can be performed by adds and shifts or a multiplication table that has $r^2/8$ entries. (Such a multiplication table would be triangular and have entries only for odd factors).

Multi-Block Coding

As is apparent from the decoding routine set forth in FIG. 8, the encoder needs to receive the "side information," i.e., some indication of the sequence's symbol population, in order to perform decoding. FIG. 10's block 55 represents including the side information in the code to be sent. But the particular way in which that information is presented is not critical. One way of presenting it in the case of FV pacing is simply to specify the number of ones in the sequence; the sequence length is implicit if the alphabet is binary, and the number of zeros can be inferred if necessary. But embodiments that use other pacing methods may specify symbol population in ways that take advantage of other implicit information.

Most simply, the side information for each block can be sent in a separate, dedicated field for each block. Another approach is to reduce redundancy by employing a field that contains a code for combinations of population values and initial index bytes. Since the value of an index is, on the average, one half the maximum index for the same population, a field dedicated the index will usually have some redundancy, but that redundancy will almost always be limited to the most-significant byte or two. And there will usually be some redundancy in a field that gives the side information separately. So the overall redundancy can be reduced by employing a code for the combination of the population-indicator value and the values of the index's most-significant byte or bytes.

Another approach is particularly applicable to arrangements that use an entropy limit on the input sequence rather than a length limit and therefore provide an output whenever the input sequence reaches a symbol population on what would be a somewhat-hyperbolic front of symbol populations in FIG. 6. In this approach, an order is assigned that front's symbol populations, and the sequence's index is added to the total of the top index values of the symbol populations that precede the input sequence's symbol population in the assigned order. Both the index and the symbol-population identity can therefore be inferred from the resultant sum.

Alternatively, or in addition, the sequence of side-information values for a sequence of blocks can be taken together and encoded. For example, successive counts of 1's in Fixed-to-Variable coding can be encoded by using the multi-alphabet encoder presently to be described. Since for a stationary source these counts satisfy the binomial distribution (which becomes approximately Gaussian for npq>9 or Poisson for n>100 and p<0.05), variable-length codes for these counts can be constructed directly. In any event, since the present invention makes it practical to employ enumerative coding on long blocks and the side information per symbol diminishes as $O(\log(n)/n)$, the problem of efficiently encoding the side information tends not to be important.

Multi-Alphabet Sources

There were two approaches proposed for generalizing the enumerative coding to non-binary alphabet $A_q$ containing q>2 distinct symbols $\{0, 1, 2, \ldots, q-1\}$. (Here we use the compact numeric representation of the q symbols as integers $0 \ldots q-1$). The earliest and the most-natural approach was given in J. P. M. Schalkwijk, "An Algorithm for Source Coding," *IEEE Trans. Inform. Theory*, vol IT-18, 395–399, May 1972. Cover subsequently incorporated that approach into more-general enumerative coding. Translated into the lattice treatment given above, that method amounts to replacing the path-count binomials in (6–7) with multinomials. Unfortunately, the exponential growth of the multinomial tables with alphabet size q makes this approach highly impractical.

A recently introduced approach (L. Öktem, *Hierarchical Enumerative Coding and Its Applications in Image Compressing*, Ph.D. thesis 1999, TUT Finland http://www.cs.tut.fi/~karen/project_site/publications/thesis.ps.Z) manages to reduce table dimensionality from q down to 2. It achieves this reduction by enumerating uniformly within sets of sequences in which the sum of the symbol codes is the same. Since the symbol codes are a merely a matter of convention, the symbol-code sum is a completely superficial quantity, unrelated to the usual sources parameterizations, such as symbol probabilities. For an enumerative code to be optimal, though, the instances that produce the same code/index size should have the same probability. This is indeed the case for the binary-source enumeration discussed so far, where the probability of any bit-string of length n and containing k 1's (and therefore (n−k) 0's) is $P(n,k)=p^k(1-p)^{n-k}$ for all instances or permutations of such (n,k) strings. It is also the case for Schalkwijk's multinomial generalization. But it fails for sum-based enumeration, since the set of sequences having the same symbol-code sum has no relation to the symbol probabilities, so the instance probabilities can vary arbitrarily from instance to instance within the set, yet all of them are encoded to the same code size.

The same type of problem eliminates a simpler scheme, one consisting of merely representing the q symbols from $A_q$ in binary (e.g., using $l=\lceil \log(q) \rceil$ bits per symbol) and then using the binary encoder to compress the resulting L=nl bits. In this case, the binary enumerator will count all the arrangements of the resulting L-bit string, fixing the number of 1's, otherwise freely swapping the bits across the entire L-bit string to obtain/count new instances of the set. This swapping includes the swaps of 1's and 0's freely across symbol block boundaries, so it changes one original symbol (from $A_q$) to another one. Since the symbol probabilities of $A_q$ vary from symbol to symbol, the enumerator is again uniformly enumerating the strings that have entirely different probabilities, so it is encoding sub-optimally.

Having identified the most-common pitfalls of multi-alphabet encoding, we take as our starting point the correct multinomial generalization of the binary source. We will consider a sequence of n symbols $S_n$ taking values from an alphabet $A_q=\{a_1, a_2, \ldots, a_q\} \equiv \{0,1, \ldots q-1\}$. As in the binary case, where we had the count of 1's k and the count of 0's (n−k), here we will have the list of q counts $k_1, k_2, k_2, \ldots k_q$ (each count $k_i$ counting the corresponding symbol $a_i$) adding up to n, i.e.:

$$k_1+k_2+ \ldots k_q=n \qquad (30)$$

The number of different n-digit arrangements of these n symbols with the given symbol counts—in the lattice language, the path count on a q-dimensional lattice to a point whose coordinates are $(k_1, k_2, k_2, \ldots k_q)$—is the multinomial coefficient:

$$N(n, k_1, k_2, \ldots, k_q) = \binom{k_1+k_2+\cdots+k_q}{k_1, k_2, \ldots k_q} = \frac{(k_1+k_2+\cdots+k_q)!}{k_1! k_2! \cdots k_q!}, \qquad (31)$$

which directly generalizes the expression (6) for the binary source path count. Since these coefficients would require a q-dimensional array of a size proportional to $n^q$ for block size n, we will look for a convenient way to express (31) through binomials so that we can use our existent SW binomial tables.

Since we will need flexibility in the way we expand a multinomial into binomials selection of the expansion form we show below (by using the example of q=4 and denoting $k_{12}=k_1+k_2$, $k_{34}=k_3+k_4$) how to generate these forms algebraically:

$$\frac{(k_1+k_2+k_3+k_4)!}{k_1! k_2! k_3! k_4!} = \frac{(k_1+k_2+k_3+k_4)!}{(k_1+k_2)!(k_3+k_4)!} \cdot \frac{(k_1+k_2)!}{k_1! k_2!} \cdot \frac{(k_3+k_4)!}{k_3! k_4!} = \qquad (32)$$

$$\binom{k_{12}+k_{34}}{k_{12}}\binom{k_{12}}{k_1}\binom{k_{34}}{k_3}$$

It is clear from (32) that instead of inserting the redundant factors $(k_1+k_2)!$ and $(k_3+k_4)!$ in numerators and denominators, we could have inserted, for example, $(k_1+k_2+k_3)!$ and $(k_1+k_2)!$, obtaining the usually presented form of the multinomial factorization:

$$\frac{(k_1+k_2+k_3+k_4)!}{k_1! k_2! k_3! k_4!} = \qquad (33)$$

$$\frac{(k_1+k_2+k_3+k_4)!}{(k_1+k_2+k_3)! k_4!} \cdot \frac{(k_1+k_2+k_3)!}{(k_1+k_2)! k_3!} \cdot \frac{(k_1+k_2)!}{k_1! k_2!} =$$

$$\binom{k_1+k_2+k_3+k_4}{k_1+k_2+k_3}\binom{k_1+k_2+k_3}{k_1+k_2}\binom{k_1+k_2}{k_1}$$

The combinatorial interpretation of the factorizations such as (32)–(33) (including the 4!=24 variants obtained by permuting the symbol labels 1,2,3,4) is that the multinomial enumeration is equivalent to the various chains of binomial enumerations. To apply this equivalence to the multi-alphabet-enumeration problem, we will interpret these binomial chains in terms of the multi-alphabet reduction as splitting the alphabet into two subsets, then splitting each of the two subsets containing more than two symbols into a further pair of subsets, until every final subset contains no more than two different symbols. This transforms a non-binary sequence into multiple binary sequences.

We will now show an example of how to represent the described splits in the form of strings of binary digits and how to encode these strings using the binary encoder without increasing the entropy of the output above the entropy of the original multi-alphabet string. For the q=4 decompositions of (32–33) we will use alphabet $A_4=\{a, b, c, d\}$ and examine the encodings of a data string $S_n$=(a a c a b c d d c b a c). Here n=12, $k_1$=4, $k_2$=2, $k_3$=4, and $k_4$=2. The factorization (32) contains three binomial factors in the right-most equality, which we interpret as shown in FIG. 13.

The first binomial factor in (32), $C((k_1+k_2)+(k_3+k_4), k_1+k_2)$, indicates a split into subsets $\{a|b\}$ and $\{c|d\}$. We interpret this split as a formula for creating a binary string of n bits, called Plane 1 in FIG. 13. Plane 1 has 0's where the $S_n$ has a or b, and it has 1's where the $S_n$ has c or d. The next factor in (32), $C(k_1+k_2, k_1)$, further splits subset $\{a|b\}$ into subsets $\{a\}$ and $\{b\}$. We interpret this as a formula for creating a bit string (called Plane 2.0 in FIG. 13) that has bits only where Plane 1 has bit=0. Plane 2.0 therefore has a total of $k_1+k_2$ bits, of which $k_1$ have value 0 (where $S_n$ has symbol a) and $k_2$ have value 1 (where $S_n$ has symbol b). The third factor in (32), $C(k_3+k_4, k_3)$, splits the subset $\{c|d\}$ (the places where Plane 1 has 1's) into subsets $\{c\}$ and $\{d\}$. We therefore create Plane 2.1, containing $k_3+k_4$ bits (shown at places where Plane 1 has 1's), of which $k_3$ have value 0 (where $S_n$ has c) while $k_4$ have value 1 (where $S_n$ has d).

FIG. 14 shows the analogous reduction constructed from Eq. (33). Note that the first split, arising from $(k_1+k_2+k_3)+(k_4)$ in (33), leaves a single symbol d in the second subset, so no further splits (or bit planes) are created from that branch. (I.e., Plane x.0.1 is empty for x>1.) The same phenomenon occurs for the next split $(k_1+k_2)+(k_3)$ shown in Plane 2.0, where symbol c is the only member of the second set and therefore generates no bits in its descendent plane. (I.e. Plane x.0.1 is empty for x>2.)

The reductions shown in FIGS. 12 and 13 produce the conversions of the input string $S_{12}$, which uses the four-symbol alphabet $A_4$, to several strings (labeled Plane x.) that use the binary alphabet. Our construction has used binomials of the general form $C(x+y,x)\equiv C(x+y,y)$ (which were the result of factoring the multinomial for the data string into a product of binomials) to create a bit strings of length x+y with x 0's and y 1's whose specific layouts are defined by the original multi-alphabet string. This binomial is the number of binary strings whose symbol count is the same as that of the specific constructed bit string. We can therefore encode that string in log(C(x+y,x)) bits, as equation (7) indicates. Since each constructed bit string has a matching binomial on the right-hand side of (32/33) and every binomial in (32/33) has a matching bit string, the total compressed size of the constructed bit strings is exactly the sum of the terms log(C(x+y,x)) for the binomials in (32/33). Since the log of the left side of (32/33) is the entropy of the original non-binary string, it follows that our construction produces s set of bit-strings whose total compressed size exactly equals the entropy of the original, non-binary string. (Note here that the size is "total" in the sense of the sum of the individual bit-strings' compressed sizes. This is not the same as the size produced by compressing the string that would result from concatenating all the bit strings into a single larger bit string. That result would be larger because of the binomial inequality $C(x+y,a+b)\geq C(x,a) C(y,b)$.)

More generally, any reduction of an alphabet $A_q$ (e.g., by a complete binary tree with q leaf nodes) into a binary prefix codes $T_q=\{t_1, t_2, \ldots t_q\}$ induces a factorization of the corresponding multinomial of Eq. (31) into the product of binomials. (A prefix code is the result of an encoding scheme in which no code is a prefix of another code.) As FIGS. 14 and 15 will illustrate, the multinomial-factorization-based procedure for converting a multi-alphabet string $S_n$ into a set of binary strings can be described conceptually as comprising the following steps.

Step 1: Replace all symbols $a_i$ in $S_n$ with their prefix codes $t_i$ so that the n bit-strings of the codes $t_i$ stand vertically with the top-aligned leading bits forming the top bit plane, Plane 1. The subsequent prefix-code bits, extending vertically down from Plane 1, form the subsequent bit planes Plane 2, Plane 3, ..., Plane z, all parallel to Plane 1 (where z is the maximum prefix-code length in bits). Formally, Plane k is a sequence of kth bits (k=1, ..., z) of all prefix codes $t_i$ in their coding of $S_n$.

Step 2: Split Plane 2 into two fragments, Plane 2.0 and Plane 2.1, so that each bit of Plane 2.0 has a zero bit above itself in Plane 1 and each bit of the Plane 2.1 has a one bit above itself in Plane 1. I.e., Plane 2.1 is the sequence of the second bits of codes $t_i$=1.*, and Plane 2.0 is the sequence of second bits of codes $t_i$=0.*).

Step 3: Split Plane 3 into fragments by using the Plane 2 fragments as a template. I.e., form Plane 3.0 and Plane 3.1 so that each bit of Plane 3 is assigned to Plane 3.0 if the bit above is in Plane 2.0 and to Plane 3.1 if the bit above is in Plane 2.1. (There may be fewer bits in Plane 3 than in Plane 2). Split each of these Plane 3.f fragments (for f=0,1) into 2 fragments: Plane 3.f.0 and Plane 3.f.1 according to the value of the bit above in Plane 2.f. Thus Plane $3.f_1.f_2$ is a sequence of the third bits of codes $t_1=f_1.f_2.*$ that code $S_n$.

Step 4: Following down from Plane 3, split Plane (k+1) using the already fragmented Plane $k.f_1.f_2 \ldots f_{k-1}$ (where $f_1, f_2, \ldots f_{k-1}$ are 0 or 1) containing $n_k$ fragments as follows: Separate Plane (k+1) into the $n_k$ fragments using the Plane-k fragments as a template (see step 3). Split further each of the newly created fragments Plane $(k+1).f_1.f_2 \ldots f_{k-1}$ into two fragments Plane $(k+1).f_1.f_2 \ldots f_{k-1}.0$ and Plane $(k+1).f_1.f_2 \ldots f_{k-1}.1$ according to the value of the bit above (from Plane $k.f_1.f_2 \ldots f_{k-1}$). Formally, Plane $(k+1).f_1.f_2 \ldots f_{k-1}f_k$ is a sequence of $(k+1)^{th}$ bits of all codes $t_i=f_1.f_2 \ldots f_{k-1}.f_k.*$ that code $S_n$.

Step 5: The process terminates when an empty bit plane is reached (after Plane z has been partitioned). At the termination, the total number of fragments from all planes will be $n_z$=q−1 (where Plane 1 is counted as a single fragment). Formally, Plane $k.f_1.f_2 \ldots f_{k-1}$ will be a sequence of $k^{th}$ bits of codes $t_i=f_1.f_2 \ldots f_{k-1}.*$ that codes $S_n$.

In summary, a binary sequence to be encoded is formed for each j-bit sequence of prefix-code bits such that the high-radix-alphabet sequence includes more than one symbol whose prefix code is longer than j bits and begins with that j-bit sequence. The sequence to be encoded consists of, for each digit in the high-radix sequence that equals such a symbol, the (j+1)st bit of the prefix code for that digit's symbol. (Here we consider every prefix code to begin with the degenerate, j=0 bit sequence: the prefix-code-bit sequence formed for j=0 contains a bit for every digit in the high-radix-alphabet sequence.) And a separate index is computed for every binary sequence thereby formed.

FIG. 15 illustrates this procedure for the example of FIG. 13, where the prefix codes are: a=00, b=01, c=10, d=11. It shows the result after steps 1–2, after which the construction has been completed.

FIG. 16 illustrates this procedure for the example of FIG. 14, where the prefix codes are: a=000, b=001, c=01, d=1. It shows the results after steps 1–3 (the entire construction).

Before we describe the fragment compression and decompression in the general case, we will discuss the selection of the prefix codes. In FIGS. 12 and 13, the leftmost column shows the number of bits in the corresponding plane fragment to the right. The totals of bits produced by the decompositions are twenty-four for FIG. 13 and twenty-eight for FIG. 14. Although, as shown by (32-33), both decompositions will compress optimally (to the entropy), the larger decompositions require more processing and more memory. Additionally, larger uncompressed sequences require either more blocks or larger blocks. If there are more blocks, there is more fractional bit loss at the block boundaries (although this loss is generally negligible when code blocks are thousands of bits long). If there are larger blocks, on the other hand, the previously described, table-driven encoder requires a larger table.

Since our construction from the prefix codes shows in step 1 that the total number of (uncompressed) bits produced is same as the total length of the $S_n$ encoded in that prefix code, the minimum number of bits will be produced by using Huffman codes as the prefix codes for the binary reduction. While it may seem redundant to compute the optimal Huffman codes and then use the enumerative coder recompress them, recall that redundancy is created whenever the Huffman construction merges unequal probabilities into a single node. The enumerative coder can completely eliminate that redundancy.

When Huffman codes are to be constructed to produce the prefixes, the initial symbol order in the conventional Huffman-construction pair-merge steps is preferably so ordered as to result in favoring the production of 0's over 1's in the bit-plane fragments: the Huffman construction should systematically place larger-probability symbols to the left (or to the right, depending on convention).

Some embodiments may use codes other than Huffman codes. Some may use the quicker Shannon-Fano codes. Others may use slice codes. The slice codes may, for example, be based on fixed-code-length tables or use $\lceil \log(1/p) \rceil$ Shannon code lengths based on a quick, low-precision-integer log-function implementation. Any other prefix code can be used, too, but it is best that it be compact, i.e., that the Kraft inequality become an equality. As a general rule, lower-entropy sources would save more working space for uncompressed bit arrays by using better codes. For high-entropy sources and alphabets where $q=2^m$, the use of the binary m-bit codes of the symbols can be used as well with practically no noticeable working-space penalty. For high-entropy sources with $q \neq 2^m$, a very fast one-step Huffman-like code can be used, too. As with the Huffman code, it is preferable for these alternative code-generation methods to impose a systematic bias in favor of selecting 0's over 1's.

Encoding

When binary-partition steps 1-5 have been completed, there are q-1 bit-plane fragments to compress. If coding optimality is to be achieved, each fragment will need to compressed separately. Typically, Plane 1 (which is always a single fragment) is sent first, followed by the compressed fragments of Plane 2, and so on, until the q-1 fragments have been sent.

We digress at this point to note that the hierarchical-set-partitioning methods used in wavelet image coding separate the wavelet coefficients into bit planes for entropy coding. This is similar to Step 1 above. But those methods encode each bit plane as a whole across the bit-plane fragments(and use an arithmetic coder to do it). This generates redundancy due to the binomial inequality $C(x+y, a+b) \geq C(x,a)C(y,b)$. Independently of whether they use enumerative encoding, therefore, image coding applications can benefit from the bit-plane-fragment-aligned encoding described above, preferably with Huffman or other compact codes used to guide the fragmentation.

The encoder and the decoder have to agree, of course, on the codes used for the partitioning. Since sending the symbol counts $k_1, k_2, \ldots k_q$ allows both sides to compute the same Huffman (or Shannon-Fano) codes for the binary decomposition, no additional side information is required. (We will see in the decoder description that counts of 1's is systematically deducible for all plane fragments from the single overall symbol counts and the prefix-code tree $T_q$).

Decoding

The decoder receives the compressed data as well as side information from which it can infer the counts $k_1, k_2, \ldots k_q$ and the sequence length n in accordance with Eq, (30). It constructs the prefix code from the counts or uses some other pre-arranged method to construct the prefix code. It can then decode Plane 1. (Plane 1 always has exactly n bits, and the number of ones is readily obtained by, for example, summing the results of multiplying the $k_i$'s by the corresponding prefix codes' first bits.)

From the expanded Plane 1 and the prefix-code tables, the decoder can establish the size of Plane 2. If no prefix codes are of length 1, then Plane 2 also has n bits. If there is a code of length 1, Plane 2's size is n minus the count $k_i$ of that code (as FIG. 14 illustrates for symbol d), and Plane 2 will have a single fragment. For that fragment, the length is known, as was just explained, and the number of 1's can be computed by, for example, summing the results of multiplying the $k_i$'s for that fragment's codes by the corresponding prefix codes' kth bits. (In the notation of Steps 1-5 above, that is, the number of 1's in fragment Plane $k.f_1.f_2 \ldots f_{k-1}$ is the sum of the $k_i$'s for prefix codes $t_i=f_1.f_2 \ldots f_{k-1},1.*$.) With the sequence length and number of 1's known, the decoder can decode that fragment.

If Plane 2 has two fragments, on the other hand, the sizes of the fragments are computed from already-known counts of 1's and 0's in Plane 1. From the prefix-code tables, we also know which codes belong to which fragment of Plane 2. (Those whose prefix codes begin with a 1 fall into Plane 2.1, and those that begin with a 0 fall into Plane 2.0.) So the code counts $k_i$ in each fragment of Plane 2 are known, and their counts of 1's can therefore be determined. Using the known expanded sizes of the two fragments and the counts of 1's in each, the binary decoder can expand the two fragments.

Once they have been expanded, the Plane-2 fragment(s) thereby obtained are interleaved as the layout of 1's and 0's in Plane 1 dictates: for each source-sequence digit, the second bit of the prefix code that will specify that digit's symbol is concatenated with that first prefix code's first bit.

Having fully expanded Plane 1 and Plane 2, the decoder can infer the layouts of all Plane-3 fragments. I.e., it can determine the number of fragments and the source-sequence digits to which their bits correspond. It can also compute the symbol counts and therefore the number of 1's for each Plane-3 fragment from the code tables and the known symbol counts for the Plane-2 fragments just as it determined those for the Plane-2 fragments from the Plane-1 fragments. From the known sizes and counts of 1's, the decoder can decode the Plane-3 fragments and therefore add the third bits to the source sequence's prefix codes. This procedure continues until all digits' prefix codes are completed and their symbols thereby determined.

General Symbol-Population-Based Sliding-Window Quantized Indexing

Sliding-window integers and quantized-indexing enumeration can be applied to other encoding and indexing problems. To appreciate their applicability, it helps to distill the essential properties of SW integers into the following elements:

1. SW integer W=W(w,s,m) is a variable size/extendible integer (large integer) n bits wide, with the number of significant bits limited to m. (The mantissa width m will be less than the block size n, and it will typically be on the order of log n.) The significant bits of W are contained in an m-bit mantissa w. The bits of W that follow the mantissa are a sequence of s zero bits (n=m+s). The symbolic form of W is shown in (12), and its expanded form is shown in (12a).

2. Arithmetic and relational operators (such as +,−,>,=,<) applied to SW integers depend on the destination operand. The general pattern of this dependency is as follows (with denoting any of the operators and ⊕ denoting SW addition):

a) SW/LargeInt SW→LargeInt: The SW operand or operands behave here as large integers in the form (12a), with the key distinction that the operations now have complexity O(log(n)) instead of O(n) (which is characteristic of the corresponding operations on regular large integers). Since the large integers have extendable precision, there is no precision loss in these operations, as there can be in floating-point operations.

b) SW/LargeInt⊕SW/LargeInt→SW: Any SW operands on the left side are expanded to LargeInt form (12a), and the operation is carried out by the regular large-integer rules (with, if m is so chosen that w always fits into a machine word, O(1) complexity). The resulting large integer L is rounded up to the nearest SW integer whose mantissa length does not exceed the assumed mantissa-length limit m. If we denote SW rounding of x as: $\{x\}_{sw}$, the sum rule is symbolically: SW⊕SW→SW⇔{SW+SW}$_{sw}$→SW.

c) SW/LI⊕SW/LI⊕ . . . ⊕SW/LI→SW: The rounding addition defined in (b) is not associative: the result of adding several addends in successive two-addend additions of that type is not in general independent of the order in which those additions occur. So, for three or more addends, we define addition as being performed with delayed SW rounding: the SW operands are expanded to large-integer format, the sum is computed exactly, and only the final result is rounded up:

SW⊕SW⊕SW⊕ . . . →SW⇔{SW+SW+SW+ . . . }$_{sw}$→SW

To present a general form of Quantized Indexing, we will start with multi-alphabet enumeration and extend it by dropping the requirement that all symbols in a string $S_n=b_1 b_2 \ldots b_n$ must be in the same range $0 \leq b_i < R$. That is, we will consider strings $S_n$ where each "character" or "digit" $b_i$ (for i=1,2 . . . , n) has its own range $R_i$: $0 \leq b_i < R_i$. ($S_n$ may be interpreted as an n-digit mixed-radix number. Mixed-radix integers are in common use for, e.g., time and date values.) Denoting $R \equiv \text{Max}\{R_i: i=1,2, \ldots\}$, we can reversibly remap all strings $S_n$ into n-step lattice paths in an R-dimensional lattice.

The lattice points (vectors, R-tuples) are labeled as $M=(x_0, x_1, \ldots, x_{R-1})$, and the kth coordinate of a point M is labled $X_k(M)=X_k=M[k]$. A step in the kth dimension (where k=0,1, . . . R−1) is defined as: <k>≡(0,0, . . . , 1, 0, . . . 0), where the single 1 has k zeroes to the left. Thus <k> is also a basis vector for the kth dimension. An inverse function, which converts a step/basis vector <k> into the dimension is denoted k=D(<k>). To make a step <k> from a point M, we add the two vectors, i.e., M+<k>=$(x_0, x_1, \ldots, X_k+1, \ldots x_{R-1})$. Multiplication of a vector M by a number c is defined as: cM=(c $x_0$, c $x_1$, . . ., c $x_{R-1}$). A special case to note is the points on an axis in the kth dimension reached after c steps: $A_k(c) \equiv c<k> = (0,0, \ldots 0,c, 0, \ldots 0)$.

A string $S_n = b_1 b_2 \ldots b_n$ is (reversibly) converted into a unique n-step lattice path by making n back-to-back steps $<b_1>, <b_2>, \ldots <b_n>$, starting from the origin $M_0 = (0,0, \ldots 0)$. The resulting n-step lattice path is $T_n = \{M_0, M_1, M_2, \ldots M_n\}$ where $M_i = M_{i-1} + <b_i>$. (That is, the point $M_i$ is a destination of the ith step $<b_i>$.) To express the conversions between the coordinates and the parameters of the input string $S_n$ more compactly, we will use Iverson's selector [X] (where the X is a Boolean expression or a statement), which is defined as [X]=1 if X is true and [X]=0 if X is false. For example [k=3] is 1 if k equals 3; otherwise, it is 0. We also note that a selector with multiple conditions [$X_1$ & $X_2$ & $X_3$ & . . . ] connected by the logical-AND (&) operator factors out into a product $[X_1] \cdot [X_2] \cdot [X_3] \cdot$ of single-condition selectors. With these definitions, the conversions are:

$$S_n \text{ to path } T_n \Rightarrow M_i[k] \equiv x_k(i) = \sum_{j=1}^{i} [b_j = k] \quad (40)$$

$$M_i = M_{i-1} + <b_i> = \sum_{j=1}^{i} <b_j> \quad (40a)$$

$$T_n \text{ to string } S_n \Rightarrow b_i = D(M_i - M_{i-1}) \quad (41)$$

$$n = \sum_{k=0}^{R-1} x_k(M_n) \quad (42)$$

In words, Eq. (40) says that the point $M_i$ reached after translating i symbols from $S_n$ into steps (i.e. after translating $b_1, b_2, \ldots b_i$ to $<b_1>,<b_2>, \ldots <b_i>$) will have coordinate $x_0$ equal to the count of 0's, coordinate $x_1$ equal to the count of 1's, . . . and, generally, co-ordinate $x_k$ equal to the count of k's in the sub-sequence $b_1, b_2, \ldots b_i$. Eq. (40a) gives two alternative expressions for conversions of the string $S_n$ to path points.

Eq. (41) says that the symbol $b_i$ is the dimension index D(<*>) of the step going from the path point $M_{i-1}$ to the path point $M_i$.

Eq. (42) gives the total number of steps n to reach some point $M_n = (x_0, x_1, \ldots, x_{R-1})$ in terms of the point's coordinates. Alternatively it gives the coordinates of all points $\{M_n\}$ reached in exactly n steps (denoted as the n-step front $F_n \equiv \{M_n\}$). The fronts $F_n$ for different n's form parallel (R−1)-dimensional hyper-planes (analogous to the parallel lines forming the n-step fronts in FIG. 2) propagating away from the origin as n increases.

The mixed-radix conditions $0 < b_i \leq R_i$ are interpreted in terms of lattice steps as constraints on the allowed directions that any path's ith step can take. (There may also be some additional, domain-specific, constraints on the paths.) To express such constraints on the steps in terms of lattice parameters, we will define a Boolean constraint evaluator M:k as true if step <k> is allowed from point M and false if <k> is not allowed from M. Applying the Iverson's selector to $M_i$:k, for a point $M_i$ on the i-step front $F_i$, since the next step (the (i+1)st step) from $M_i$ corresponds to the digit $b_{i+1}$ in the input strings $S_n$, the mixed-radix conditions on the input strings translate into lattice-step constraints as:

$$[M_i{:}k] = \begin{cases} 0 \text{ for } k \geq R_{i+1} \\ 1 \text{ for } k < R_{i+1} \end{cases} = [k < R_{i+1}] \ (i = 0, 1, \ldots) \quad (43)$$

The unconstrained R-dimensional lattice paths correspond to the fixed radix integer representation (the radix is then R and all the ranges are same: $R_i$=R for i=1,2, ... ).

The general enumeration of the R-dimensional lattice paths is based on the same reasoning that led to Eq. (2): the path count for some n-step point $M_n$ is the sum of the path counts of all (n−1)-step neighbors of $M_n$, denoted as $M_{n−1}(k) \equiv M_n$-<k> (where k=0,1, ... R−1), which can reach M, in one step. Thus the path-count recurrence and the boundary conditions generalizing Eq (2) are:

$$N(M_n) = \sum_{k=0}^{R-1} [M_{n-1}(k){:}k] \cdot N(M_{n-1}(k)) \quad (44)$$

$$N(M_0) \equiv 1, \ M_0 \equiv (0, 0, \ldots, 0) \quad (45)$$

The Iverson's selector $[M_{n−1},(k){:}k]$ in (44), which is only 0 or 1, merely turns to zero the terms of the sum for those neighbors $M_{n−1}(k)$ whose path constraints do not allow the nth step <k> needed to reach $M_n$. The boundary condition (45) defines the path count for the zero-step path (from origin to origin) as 1. (Note that points M with any coordinate equal to (−1) have path counts that equal 0; since such points are not reachable by steps <k>=(0,0, ... , 0+1, 0, ... 0). We also do not list as a separate assumption in (45) that the path counts for the axis points c<k> are 1 (or 0 if prohibited by the path constraints), since these are deducible from (44) and (45). A program computing the path counts would initialize the axis points to 0 or 1.)

Eqs. (44–45) yield the multinomial coefficients of Eq. (32) for the path counts if the lattice paths are unconstrained. Otherwise, although (44) will not generally result in a closed-form expression for the N(M), it can still be used as a formula for computing n-step path counts from the known (n−1)-step path counts and problem-specific constraints [M:k]. The computation would start with the one-step points, where all one-step path counts are either 1, for the allowed first-step directions k, or 0 for the disallowed ones, as illustrated by Eq. (43)). It would then use (44) to compute from these values the path counts for all two-step points, then use the two-step path counts to compute the three-step path counts, etc.

The reasoning that led to the (tight) index-reduction recurrence (4) applies in this more-general setting as well. Namely, if we have an indexing for the (n−1)-step paths, then we can construct an index for the n-step paths to some point $M_n$ from the index values of its (n−1)-step neighbors $M_{n−1}(k)$ (for k=0,1, ... R−1), i.e., of the points from which $M_n$ can be reached in a single step <k>.

This construction follows the same method of avoiding the n-step index collisions that Eq (4) uses: as it visits the alternatives (the one-step neighbors of M), it keeps track of the index space reserved for the alternatives traversed so far and uses this reserved space as the offset to separate the current neighbor's path index from those of the already-visited alternatives. Thus, for the paths arriving via the first neighbor $M_{n−1}(k=b_n=0)$, it reuses its (n−1)-step path index directly as the n-step path index. For the paths arriving via the second neighbor $M_{n−1}(k=b_n=1)$, it creates the n-step path index by offsetting this neighbor's (n−1)-step path index with the path count of the first neighbor $M_{n−1}(0)$, since it had already reserved that part of the index space for the paths arriving via $M_{n−1}(0)$. Similarly, for the paths arriving via a neighbor $M_{n−1}(k=b_n)$, the n-step index is computed by offsetting its (n−1)-step path index with the index space reserved so far, which is the sum of the path counts of the neighbors $M_{n−1}(j)$, for j=0,1, ... k−1). This conclusion generalizes Eq (4) for the path-index reduction (n→(n−1)) to:

$$I_n(b_1 b_2 \ldots b_n) = I_{n-1}(b_1 b_2 \ldots b_{n-1}) + \sum_{k=0}^{b_n - 1} [M_{n-1}(k){:}k] \cdot N(M_{n-1}(k)) \quad (46)$$

By using (46) itself, the residual index $I_{n−1}$ in (46) can be reduced further to $I_{n−2}$ ( ), and so on until $I_1(b_1)$ is reached, which is always 0 (the index for a single path of one step). This yields the following general enumeration formula:

$$I_n(b_1 b_2 \ldots b_n) = \sum_{t=1}^{n} \sum_{k=0}^{b_t - 1} [M_{t-1}(k){:}k] \cdot N(M_{t-1}(k)) \quad (47)$$

To extend the quantized-indexing method to the more-general enumeration given in (47), we will define the volume of a lattice point M (denoting it as V(M)) as the size of the indexing "space," i.e., the interval of consecutive integers reserved for enumeration of paths ending in M. The tight-indexing assumption used in deducing Eqs. (46–47) is then expressed as:

$$V(M) = N(M) \text{ for all } M \quad (48)$$

This assumption represents the selection of the absolutely minimum volumes consistent with the pigeonhole principle for all points M.

General quantized indexing reduces the tight constraints on volumes imposed by (48) and constructs volumes that simultaneously satisfy the pigeonhole principle (but less tightly than (48)) and the requirements of computational efficiency. Because of the latter consideration, most embodiments will adopt a requirement that all volumes V(M) be represented by the sliding-window integers with the same boundary conditions as the path counts (44–45):

$$V(M) = W(w(M), s(M), m), \ V(M_0) = N(M_0) = 1 \quad (49)$$

We digress briefly to note that volume-value storage could theoretically be reduced by employing variable mantissa widths, using smaller mantissas for shorter prefix lengths. But the mantissa length needed to keep redundancy to, say, less than a single bit varies only logarithmically with the number of steps to reach M. In most practical implementations of SW-based encoders, any table-space savings that result from varying mantissa length m would be outweighed in most cases by the efficiencies that result from using fixed table-entry sizes that align with addressing granularities. For blocks with n≤256, therefore, some implementations may use eight bits to store w (possibly without storing the implicit leading 1), while sixteen bits will be typical for $256 < n \leq 2^{16}$. And, in general, typical machine-word sizes and the possibility of omitting an implicit leading 1 suggest that the mantissa sizes likely to be the most popular are 8, 9, 16, 17, 32, and 33.

Since the SW integers W operate as regular integers for $W < 2^m$, most embodiments will streamline the volume construction by extending the volume/path-count identity $V(M_0) = N(M_0)$ in (49) to all points M for which the path counts are within this exact-arithmetic domain of W(w,s,m):

$$V(M) = N(M) \text{ for } N(M) < 2^m \tag{50}$$

To make clear the distinction between exact and rounded SW arithmetic (the latter being used only to compute volumes), we have been using the symbol "$\oplus$" instead of "+" to denote the rounded additions defined for SW+SW→SW. Some of the properties of the $\oplus$ operations in SW integers are:

$$a \oplus b = b \oplus a \geq a + b = b + a \tag{51a}$$

$$a \oplus a = a + a = 2a \tag{51b}$$

$$(a \oplus b) \oplus c \neq a \oplus (b \oplus c) \tag{51c}$$

where "$\neq$" in Eq. (51c) should be interpreted as "does not necessarily equal." Eq. (51a) shows that "$\oplus$" tends to produces larger sums than exact addition but shares the commutativity property with it. Eq. (51c) indicates that, unlike exact addition, "$\oplus$" is not associative.

For example, if we use a four-bit mantissa and set (in binary): a=10010, b=101, c=11, the left side of (51c) evaluates as: $10010 \oplus 101 = 10111$, which rounds up to 11000, then $11000 \oplus 11 = 11011$, which rounds up to 11100. For the right hand side of (51c) we have: $101 \oplus 11 = 1000$ and $10010 \oplus 1000 = 11010 \neq 11100$. The two rounding-up steps on the left hand side added 1 twice, while no rounding up occurred on the right hand side, so the right side's result which was smaller by 2 than the left side's result.

The lack of associativity precludes immediate extension of the general path-count recurrence (44) to the analogous equation in terms of volumes, since the multi-term summation in (44) would become ambiguous if the exact path counts were replaced with volumes. So we need to adopt a convention for repeatably performing multiple-addend additions.

To sort out the choices, we step back to the context of the problem. The objective was to compute volumes that can guarantee a decodable index; i.e., volumes large enough to comply with the pigeonhole principle. The path IDs are assigned by Eq. (47), which performs exact arithmetic. We notice that its inner sum (over index k for the (n−1)-step neighbors $M_{n-1}(k)$) is exactly a partial sum of (44), which computes the volume of $M_n$ from the volumes of its $M_{n-1}(k)$ neighbors. Since the partial sums over k in (47) are exact, they do not cause volume expansion, so we can compute the sum in (44) exactly and only thereafter round up the exact total to convert it into an SW integer, which is assigned to $V(M_n)$. To compute volumes, therefore, we can use delayed SW rounding:

$$V(M_n) = \left\{ \sum_{k=0}^{R-1} [M_{n-1}(k):k] \cdot V(M_{n-1}(k)) \right\}_{sw} \tag{52}$$

Together with the boundary conditions (50), Eq. (52) provides a recipe for computing volumes to any required n. (For some types of encoding-termination rule (VF, FV, VV, MaxIndex), the volume tables need not be filled up uniformly to some fixed n. To implement the MaxIndex termination rule, for example, V(M) would need to be computed only up to the hyper-surface boundary V(M)≧MaxIndex.

Since quantized indexing uses exact arithmetic for the index computation (encoding), the reasoning that led to the index computation (47) holds as is for the volumes, with the exception that in order to separate the lower-order indices from different neighbors, we will offset their indices with their volumes rather than their path counts. The resulting general enumeration formula for quantized indexing is therefore obtained by a simple replacement of path counts N(M) in (47) with volumes V(M):

$$I_n(b_1 b_2 \ldots b_n) = \sum_{t=1}^{n} \sum_{k=0}^{b_t - 1} [M_{t-1}(k):k] \cdot V(M_{t-1}(k)) \tag{53}$$

Unlike the volume recurrence (52), which performs delayed SW rounding on the result of the sum, the index computation in (53) performs exact arithmetic.

As noted in the multi-alphabet discussion, general sums of type (52) will require table sizes exponential in alphabet size. That consideration led us to introduce a binary reduction procedure so that we could use more-compact SW binomial tables to perform encoding. But significant reductions in table sizes may occur in the presence of the strong domain-specific path constraints [M:k], which could eliminate most of the terms in (52).

To provide useful examples of applying quantized indexing in accordance with (52–53), we will look to the high-entropy limit, i.e. to cases in which symbols are either uniformly distributed or have rapidly varying frequencies averaging over longer runs to the same uniform distribution. In the binary case, the result of enumerative encoding is, as was explained above, at best no better than no encoding at all and at worst ½ log(k) above the entropy. But we will examine ways in which quantized indexing can afford advantages for some non-binary sources—and can do so without excessively large volume tables.

Encoding Fixed-Radix Sequences Where R≠2s

In the first example we will consider an unconstrained high-entropy source with some fixed radix (alphabet size) R. The n-symbol entropy is $H_n(R) = n \log(R)$.

We will start with tight enumeration, i.e., with the path counts given in (44) and indexes given in (47). Absent constraints, we can remove the Iverson's selector from (44). We will then simplify the sum in (44), which runs over different path counts $N(M_{n-1}(k))$ for different neighbors $M_{n-1}(k)$, by replacing each term with the largest path count $N(M_{n-1}(k))$ among the R neighbors as a representative of the (n−1)-step path counts. We need to use the largest path count among the neighbors to comply with the pigeonhole principle, i.e., to avoid index collisions. Of course, this "majorization" increases the resulting $N(M_n)$. Since the vast majority of the paths in the high-entropy limit will be near the Pascal hyper-triangle's central axis of symmetry, though, the variations in path counts among the neighbors will be relatively small.

We refer to this largest path count as $N_{n-1} \equiv \text{Max} \{N(M_{n-1}(k)): k=0,1, \ldots R-1\}$. With this notation, the sum in (44) simplifies to a closed-form expression for $N_n$:

$$N_n = RN_{n-1} \Rightarrow N_n = R^n \tag{54}$$

With the path counts approximated by (54), we can turn to index computation via (47). Since we are assuming no path constraints, we replace Iverson's selectors in (47) with 1. Using the approximate path counts $N_n$ from (54) yields the following expression for the resulting encoding:

$$I_n(b_1 b_2 \ldots b_n) = \sum_{t=1}^{n} b_t R^{t-1} = b_1 + b_2 R + b_3 R^2 + \ldots + b_n R^{n-1} \quad (55)$$

Eq. (55) is recognizable as an integer $I_n$ expressed in base R with digits $b_1, b_2, \ldots b_n$. The number of bits for n-symbol blocks is log $(R^n)$=n log(R), which is exactly the entropy of this block in the high-entropy limit. So (55) is an optimum encoding for a high entropy source. This conclusion justifies our initial path count majorization.

For the binary-alphabet case, R=2, that encoding is simply the uncompressed sequence of the input bits (as expected from the introductory conclusions implied by (10)). The same is true for any alphabet with $R=2^r$ (power-of-2 alphabet): the output is the sequence of r-bit symbol codes. The encoding in this case is also fast, since it merely returns the input bits as the "encoded" output. But, for radix-$2^s$ alphabets, this also means that there is no reason to perform coding of this type.

But the same is not true of non-radix-$2^s$ alphabets. Suppose that R=3: the alphabet has three symbols {a,b,c}. Suppose further that each symbol is expressed in the source code by two bits, e.g., a=00, b=01, and c=10. If the input string has 1000 symbols, then it takes 2000 bits, whereas the optimum code of Eq. (55) will produce output 1000 log(3)= 1585 bits.

The problem with (55) for non-power-of-2 alphabets is that, if we want to use (55) use encode the input sequence $b_1, b_2, \ldots b_n$ optimally, we need to perform arithmetic operations with a precision of nr bits, where r the value such that $2^{r-1} < R < 2^r$. These operations would include n multiplications in that precision. If we want to encode $S_n$ quickly, we could use r bits to represent the input symbols $0 \leq a_s < 2^r$ for s=0,1, ... R-1 and produce an output of nr bits instead of the optimum size n log(R) that (55) in high precision arithmetic would produce. The fast method would leave unused $U=2^r-R>0$ numbers allowed by the r-bit blocks, wasting thus r-log(R) bits per symbol.

Slower than this but still much faster than the optimal one of Eq. (55)) is a method based on slice codes. This method is equivalent to a Huffman code obtained for uniform symbol distribution, except that the Huffman tree need not be computed explicitly. The method involves encoding the $U=2^r-R$ symbols in (r-1)-bit codes $\{0,1, \ldots U-1\}_{r-1}$ and encoding the remaining $R-U=2R-2^r$ symbols in r-bit codes $\{U,U+1, \ldots R-1\}_r$. While this approach simplifies Huffman-code construction, its encoding and decoding still require variable-size-block insertions and extractions at arbitrary block boundaries.

To illustrate the numbers above, let the alphabet have the three symbols a, b, and c so that R=3. This means that r=2, i.e., $2^1 < R < 2^2 = 4$. Let the input string have 1000 symbols. The optimum code, i.e., the one given by Eq. 55, will produce output 1000 log(3)=1000*1.58496 . . . =1585 bits. The fast method will use two bits per symbol, producing an output of 2000 bits, which is 26% above the optimum size. For the Huffman/slice code we have U=4-3=1 and R-U=2, so we will create a single one-bit code and two two-bit codes: a=0, b=10, c=11. The resulting size will average at 1000-(1+2+2)/3=1667 bits, which is 5.2% above the optimum.

Now we will instead use the quantized-indexing method of Eqs. 52-3. For the unconstrained case, we can remove the Iverson's selectors from those equations. For the volume computations of Eq. 52, we will make the same simplification we made for the tight-indexing method. That is, we will replace all volumes of the R neighbors $M_{n-1}(k)$ (for k=0, 1, ... R-1) with the largest among these R volumes, labeling it $V_{n-1}=\text{Max}\{V(M_{n-1}(k)), k=0,1, \ldots R-1\}$. As in the tight-indexing method, we need to use the largest among the R volumes; there would otherwise be index collisions, since some neighbors would then receive smaller substitute volumes than what they had before). With these simplifications, volume computation recurrence (52) becomes:

$$V_n = \left\{\sum_{k=0}^{R-1} V_{n-1}\right\}_{sw} = \{RV_{n-1}\}_{sw} \quad (56)$$

Although (56) does not, as its counterpart (54) does, simplify to a closed form, it is a perfectly practical formula for computing the approximate high-entropy-limit volumes by using only n low-precision multiplications (or an equivalent of n log(R) shifts and adds).

In this construction, volumes $V_n$ can be interpreted as the SW approximations of the powers $R^n$. Because of the SW rounding rule, it also satisfies $V_t \geq R^t$. Since the sequence of powers $\{R^t: t=0,1, \ldots n\}$ grows by factor R from one element to the next, the corresponding sequence of SW volumes $\{V_t(w,s,m): t=0,1, \ldots n\}$ will have the shift s advancing approximately by log(R) from one volume to the next.

We will now estimate the SW parameters of V(w,s,m). Since the largest numbers represented are of the size $R^n = 2^{n \log(R)}$, the shift s requires $\lceil \log(n \cdot \log(R)-m) \rceil$ bits. To select the mantissa size m, we will require that the error in $V_n = V_n(w,s,m)$ not exceed a single bit; i.e., that the cumulative error of w not exceed $2^m$. We will also require that the numbers x<R be represented without error. This implies that m has to be at least $\lceil \log(R) \rceil$ bits. Since the recurrence (56) for computing volumes has at most n mantissa-rounding operations to compute $V_n$, w could be incremented (by 1) at most n times. Applying the reasoning from (22) to keep the error below 1 bit (c=1) imposes the requirement $m \geq \log(n)+1$. Adding this to the requirement that all numbers numbers x<R be represented without error results in m=Max $\{\lceil \log(n) \rceil+1, \lceil \log(R) \rceil\}$.

Calculations with this choice of m for n to $2^{26}$ and R to $2^{20}$ resulted in errors that were always below 0.8 bit, clustered at 0.5 bits, and decreased slowly as n or R grew. For the earlier example of R=3, n=1000, and mantissa width m=11 resulted in a total redundancy of 0.3972 bit for a 1000-symbol string, i.e., only 0.03% above the optimum.

The high-entropy-limit index computation applies (53) with the constraint selector removed and precomputed volumes $V_t$ that are independent of the neighbors' indexes k. Unlike the SW-rounding arithmetic of (52), the arithmetic used for Eq. 53's additions are exact, so the simplifications that arise from the tight-indexing solution will apply here. The result is the quantized-indexing counterpart of Eq. 55:

$$I_n(b_1 b_2 \ldots b_n) = \sum_{t=1}^{n} b_t V_{t-1} = b_1 + b_2 V_1 + b_3 V_2 + \ldots + b_n V_{n-1} \quad (57)$$

Although similar in form to (55), Eq. (57) multiplies SW integers $V_t(w(t),s(t),m)$, which have $m \approx \log(n)$ significant bits, by input digits $b_t$, which have $\log(R)$ bits. So (57) can be computed by using n−1 low-precision (i.e., of log(n) complexity) multiplies and adds. In some problem contexts it will be advantageous to replace the multiplies with table lookups or log(R) shift-and-add equivalents.

As in binary entropy coding, we can trade table space off for extra adds. In this case we can compute volumes on the fly by using n log(R) low-precision adds and shifts, requiring no volume tables and avoiding all multiplies in (57) since the partial sums of $b_t$ terms from the volume $V_t$ computation can be used (before rounding) as the complete $b_t V_{t-1}$ terms in (57).

Encoding Permutations

Permutations of n numbers 0, 1, 2, ..., n−1 can be encoded in a factorial radix. Given permutation $P_n = (a_1 a_2 \ldots a_n)$, its factorial radix digits $D_n = d_1, d_2, \ldots d_n$ are obtained by counting numbers larger than $a_i$ to the left of $a_i$ and assigning this count to digit $d_i$.

In this scheme $d_i$ is always 0, (for symbolic brevity, we use the customary redundant digit $d_1 = 0$), $d_2$ can be only 0 or 1, $d_3$ can be 0, 1, 2 and, in general, $d_i$ can be 0,1,...i−1. While the simple counting method for obtaining digits $d_i$ runs in $O(n^2)$ time, there is an algorithm that can produce $D_n$ (or reconstruct the permutation $P_n$ from a given $D_n$) in $O(n)$ time.

To compute the entropy of $D_n$, we will consider the high entropy limit, i.e., the case of uniformly distributed digits $d_i$ within their ranges $0 \leq d_i < i$, for i=1,2,... n. The entropy of the sequence $D_n$ is then simply the size (in bits) of the index for the list of n! distinct permutations: $H(D_n) = \log(n!)$. (For large n, $H(D_n) = n \log(n) - n \log(e)$.) The encoding that achieves this optimum is the factorial radix integer $f_n$ obtained from the factorial digits $D_n$ as:

$$f_n(d_1 d_2 \ldots d_n) = d_1 + d_2 1! + d_3 2! + d_4 3! + \ldots + d_n(n-1)! = \sum_{i=1}^{n} d_i \cdot (i-1)! \quad (58)$$

The problem with (58) is that the encoding requires O(n) high-precision multiplications and additions. The required precision is $H(D_n)$ bits, which is the size of the encoded output. Slice codes would encode $d_2$ in 1 bit, $d_3$ and $d_4$ in 2 bits per digit, $d_5 \ldots d_8$ in 3 bits/digit, ... etc., resulting in a code whose size is n log(n)−n+1 bits, which exceeds the (large n) entropy by n (log(e)−1)≈0.443 n bits.

To apply quantized indexing to this problem, we first examine the tight enumerative coding of $D_n = d_1 d_2 \ldots d_n$ in the high-entropy limit. For the input string $S_n = b_1 b_2 \ldots b_n$ we will define: $b_i \equiv d_i$. In accordance with Eq. 43, the mixed-radix condition $0 \leq d_i < i \equiv R_i$ (for i=1,2,... n) gives the i-th front constraint evaluator as: $[M_{i:k}] = [k < i+1]$. As in the fixed-radix example, the high-entropy limit replaces the neighbors' path counts $N(M_{n-1}(k))$ with the common (maximum) value $N_{n-1}$. Inserting this common value and the mixed-radix constraints $[M_{n-1}:k] = [k < n]$ into (44) results in a closed-form expression for $N_n$:

$$N_n = \sum_{k=0}^{R-1} [k < n] \cdot N_{n-1} = n N_{n-1} \Rightarrow N_n = n! \quad (59)$$

With these path counts and the radix constraints $[M_{t-1}:k] = [k < t]$, the Eq. 47 expression for the index simplifies to:

$$I_n(b_1 b_2 \ldots b_n) = \sum_{t=1}^{n} \sum_{k=0}^{b_t - 1} [k < t] \cdot (t-1)! = \sum_{t=1}^{n} b_t \cdot (t-1)! \quad (60)$$

So the tight enumerator given by Eq. 47 has "discovered" the optimum high-entropy permutation encoding set forth in Eq. 58—and it shares with it the same performance barrier for large n.

But, if the substitutions that we applied to tight indexing to yield Eq. 59 are instead applied to the quantized-indexing recurrence Eq. 52, the result is:

$$V_n = \left\{ \sum_{k=0}^{R-1} [k < n] \cdot V_{n-1} \right\}_{SW} = \{n V_{n-1}\}_{SW} \quad (61)$$

The quantized-indexing recurrence thus has not lead to a closed-form solution like Eq. 59, in which the tight-indexing recurrence resulted. Instead, it had yielded a low-complexity formula that requires only O(log(n))-bit multiplications instead of the O(n log(n))-bit multiplications that Eq. 59 requires. The volumes $V_n$ can be interpreted as the SW approximation of factorials: $V_n \approx n!$. Because of SW rounding-up operations, $V_n \geq n!$.

The SW parameters for $V_n(w,s,m)$ differ slightly here because the volumes are approximately n!, so they grow faster than $R^n$. Shift s uses $\lceil \log(n \cdot \log(n)) - m \rceil$ bits. The mantissa width m simplifies since it has no separate dependency on radix R. Since Eq. 61 accumulates the errors in w at the same rate as the fixed-radix recurrence of Eq. 56, $m = \lceil \log(n) \rceil + 1$ mantissa bits are enough to keep the error under a single bit.

The index computation works exactly as in the fixed-radix case, i.e., in accordance with Eq. 57, and the same arithmetic-complexity considerations apply, with the exception that the input-digit size is log(n) rather than log(R). The same computational shortcuts apply as well.

To illustrate performance, let n=16. The entropy $H(D_{16}) = \log(16!) = 44.25$ bits. Uncompressed permutation uses (16 symbols)·(4 bits/symbol)=64 bits, which is 45% above the entropy. The uncompressed digits of $D_{16}$ use 15·(4 bits/digit)=60 bits, which is 36% above the entropy. The slice codes use $1 + 2 \cdot 2 + 3 \cdot 2^2 + 4 \cdot 2^3 = 49$ bits, which is 11% above the entropy. Quantized indexing with a five-bit mantissa encodes $D_{16}$ to 44.46 bits, with redundancy of 0.22 bits, which is only 0.5% above entropy.

The results are even better for larger n. With n=1000, for example, the entropy is log(1000!)=8529.4 bits. The uncompressed data occupy 1000·(10 bits/symbol)=10,000 bits, or 17% above entropy. Slice codes use 8973 bits, or 5.2% above the entropy. Quantized indexing with an eleven-bit mantissa encodes $D_{1000}$ to 8529.9 bits, or only 0.006% above entropy.

Encoding General Mixed-Radix Sequences

The general case of a mixed-radix sequence $D_n = d_1 d_2 \ldots d_n$ is characterized by a set of separate ranges for each digit position: $0 \leq d_i < R_i$ where $R_i > 1$. The optimum encoding in the high entropy limit, i.e., when each digit is uniformly distributed within its range, is achieved when the mixed-radix integer for $D_n$ is computed as:

$$f_n(d_1 d_2 \cdots d_n) = \tag{62}$$

$$d_1 + d_2 R_1 + d_3 R_1 R_2 + \cdots + d_n R_1 R_2 \cdots R_{n-1} = \sum_{i=1}^{n} d_i \prod_{j=1}^{i-1} R_j$$

The entropy of the $D_n$ source characterized by $\{R^n\} = \{R_1, R_2, \ldots R_n\}$ is:

$$H(\{R^n\}) = \sum_{i=1}^{n} \log(R_i) \tag{63}$$

As in the previous examples, the full-precision enumerator given by Eqs. 44 and 47 reproduces the optimum representation set forth in Eq. 62 and the corresponding entropy given by Eq. 63, but its computation requirements tend to be onerous. So we use the quantized-indexing encoder set forth in Eqs. 52–53 in the high-entropy limit to compute volumes and index. Applying Eq. 43's mixed-radix constraints, i.e., $[M_{i-1}:k] = [k < R_i]$, yields the volume recurrence:

$$V_i = \{R_i \cdot V_{i-1}\}_{sw} \text{ with: } i = 1, 2, \ldots n \text{ and } V_0 = 1 \tag{64}$$

and the enumeration index given in Eq. (57). A mantissa size $m = \lceil \log(n) \rceil + 1$ will restrict the redundancy to less than a single bit. In some applications one may impose an additional requirement on the mantissa, e.g., that w must express any $R_i$ exactly, in which case the requirement would be $m = \text{Max } \{\lceil \log(R_i) \rceil, \lceil \log(n) \rceil + 1\}$. The shift s needs to be $\lceil \log(H-m) \rceil$ bits.

In some applications the volumes may be pre-computed into tables of size $O(n \log(n))$ bits and used in the index computation Eq. 57, where n low-precision ($O(\log(n))$- and $O(\log(R))$-bit-operand) multiplies (or an equivalent using $O(\log(R))$ shifts and adds) are performed. Alternatively, as noted in the fixed-radix discussion, a potentially slightly slower method, performing $O(n \log(R))$ low precision adds, can be used to compute the volumes (64) and the index (57), without requiring any tables or multiplies.

General Quantized Indexing

The foregoing examples are specific applications of a quantized-indexing approach that can be to employed for enumeration generally. Generic enumerative tasks of interest here are to compute a unique numeric index for a given "arrangement" A and to reconstruct the arrangement A from a given numeric index. As used here, an arrangement is an ordered set of elements, i.e., the set elements can be labeled as the first, second, . . . nth elements, which we will call items.

Although the existence of an order relation allows us to represent arrangements symbolically as abstract sequences of item symbols, the order relations may be implicit in many concrete enumerative tasks, such as encoding trees, graphs, networks, printed-circuit-board layouts, etc. The order relation may be implicit through, e.g., some formula or state machine, and the instances of the arrangements may be represented as some mix of indicators of computational rules along with their control values and data. So the enumerator does not necessarily receive the representation of an arrangement instance as a sequence of symbols representing the items. As enumerator inputs, arrangements are more general than sequences of item symbols. In particular, the enumerator may never need to compute symbolic values for the items in order to execute enumerative procedures, since these item values occur in these formulas only as the abstract control parameters (e.g. for neighbor scan), and these controls may in practice be implemented more directly and more efficiently by some application-specific arrangement space-traversal and -generation procedures that use whatever form the instance data may have.

We will denote an arrangement of n items as $A_n = a_1 a_2 \ldots a_n$, and we will call the number of items in the arrangement the arrangement's length, which we denote $n = L(A_n)$. An arrangement of 0 items, an "empty arrangement," is denoted as $A_0$. The items $a_i$ are encoded as numbers. For notational convenience we will assume they are already mapped into a compact numeric range $0, 1, \ldots R-1$ of some maximum size R, and we will denote these "normalized" items as $<a_i>$. (As was suggested above, this mapping may vary with i both in the size of the range actually used and in which symbols or sequences of symbols map to which numbers. We will use Iverson's selectors to encapsulate the effects of any such variations.) When the input is expressed in a sequence of symbols $S_m = b_1 b_1 \ldots b_m$, the codes $a_i$ may be literal symbol values $b_i$ or any mapping of symbols $b_i$ or of their subsequences (through, e.g., a dictionary, an application-specific parser, a state machine, etc.).

An enumerative space for a given enumerator is a set of arrangements that a given enumerator can process. The corresponding indexing space is a range of numbers that the computed index may have. For tight (exact) enumerators the index range is compact: the possible indexes for a given enumerative space are $0, 1, 2, \ldots N-1$, where N is the number of possible arrangements in that (possibly constituent) enumerative space. Now, the set that encompasses all arrangements that a given enumerator can process may be partitioned into separate constituent enumerative spaces, as the sequence spaces in the examples above were partitioned in accordance with symbol population; that is, there may be separate, independent indexing spaces for each constituent enumerative space. For tight enumerators this implies that each of these index spaces restarts its indexing range at 0.

To characterize an enumerative space's structure, we will label the set of all arrangements $A_n$ containing n items as $F_n$. To help visualize the temporal progression of processing we will call this set the n-step front. We will denote the addition (appending) of an item $<a>$ to the arrangement $A_{-1}$ as: $A_n = A_{n-1} 30 <a>$ and the removal of the last item $<a>$ from the arrangement $A_n$ as $A_{n-1} = A_n - <a>$. We will also say that $A_{n-1}$ is a predecessor of $A_n$ whenever the two are related as $A_{n-1} = A_n - <a>$. To distinguish between the allowed and the disallowed item additions (or removals) we will define a Boolean constraint evaluator A:a (typically implemented in an application-specific state machine), which evaluates to true if $A + <a>$ is an allowed item addition and otherwise to false.

Enumerators usually partition into constituent enumerative spaces the composite enumerative space that encompasses all arrangements a given enumerator can process, and the encoded output will contain the partition indicator and the index within that partition. (Either of these two output components may be implicit; e.g., if the count of 1's is 0 or n in a binary coder, no index has to be sent.) Partitioning is advantageous whenever the source produces arrangements with non-uniform probabilities, since the probabilities within resultant constituent spaces are usually more uniform. In fixed-to-variable coding, for example, this leads to non-uniform, and therefore compressible, partition indicators. Partitioning may be done for reasons other than just to reduce the size of the encoded output. For example, it may speed up or to simplify encoding and/or decoding, reduce coder-table sizes, expose some data features not apparent before encoding, or facilitate some type of processing of the encoded data.

E.g., for sources with slowly varying or stationary non-uniform symbol probabilities, each optimal partition would be associated with a symbol count, which all arrangements in that class would have. In other applications, each partition may be associated with a respective symbol-value sum. More generally, each partition may be associated with a respective value of some application-defined arrangement classifier v(A).

In terms of n-step fronts, partitioning separates the arrangements belonging to the n-step front $F_n$ into disjoint n-item classes, and each class's arrangements are indexed in a separate indexing space. As a visual aid, we will call these n-item classes of arrangements with separate indexing n-step points, or points on $F_n$, since for symbol-population-based partitioning these classes correspond to lattice points, and we will label them $M_n$, or, simply, M. We extend the "length" notation to the points, i.e., write n=L($M_n$) Although enumerators will generally have finer sub-structures and relations among the partitions (such as a hierarchy of partitions, complex boundary definitions, etc) such details are not relevant for the description of how the quantized-indexing method operates and how to implement it (although such variations in detail may affect the quantity and complexity of the implementation work).

We will denote the number of arrangements belonging to a point M as G≡N(M), thus in the explicit set notation we can express all the arrangements belonging to a point M as M={ A(g): g=1,2, . . . G }≡{A(g)}. Our notation for an item addition or removal to or from an arrangement extends naturally to an addition or removal item to or from a point. Adding item <a> to a point $M_{n-1}$, for example, is performed for each arrangement $A_{n-1}(g)$ in $M_{n-1}$ i.e. An(g)=$A_{n-1}$(g)+<a> for g=1 . . . G. For a general enumerator to which quantized indexing may be applied, the resulting set of arrangements {$A_{n-1}$(g): g=1,2, . . . G} need not entirely belong to the same n-front point $M_n$. To avoid burdening the notation for these exceptional cases but retain enough precision to specify the general quantized-indexing implementation recipe, we will consider {$A_{n-1}$(g)} as being (conceptually) further partitioned into subsets so that {$A_n$(g)=$A_{n-1}$(g)+<a>} does belong fully to the single point $M_n$. We can therefore denote item addition as $M_n$=$M_{n-1}$+<a> and the item removal as $M_{n-1}$=$M_n$-<a>. We will also denote $M_{n-1}$(a)≡$M_n$-<a> and say that $M_{n-1}$(a) is a predecessor of $M_n$. The constraint evaluator M:a is defined as true if any A(g):a is true and false if all A(g):a are false (for g=1 . . . G). In the computations and the enumerative formulas, M:a is usually enclosed in the numeric Iverson's selector [M:a], which is 1 for M:a=true and 0 for M:a=false. We will call point $M_0$≡{$A_0$} the origin of enumerative space.

With this background, we present the general concept of quantized indexing in terms of the way in which it can be used to improve existing (or for that matter, not-yet-designed) enumerators. Conceptually, the first step is a "bottom-up" description of the existing enumerator. Specifically, the relationship between the index I and the arrangement $A_n$ is expressed as:

$$I_t(a_1 a_2 \cdots a_t) = I_{t-1}(a_1 a_2 \cdots a_{t-1}) + \sum_{a=0}^{a_t-1} [M_{t-1}(a):a] \cdot N(M_{t-1}(a)) \quad (65)$$

or, equivalently, $$I_n(a_1 a_2 \cdots a_n) = \sum_{t=1}^{n} \sum_{a=0}^{a_t-1} [M_{t-1}(a):a] \cdot N(M_{t-1}(a)), \quad (66)$$

where $M_{t-1}$(a)=$M_t$-<a>, $M_t$ is, among a disjoint set of t-item-arrangement classes that together cover all allowed t-item arrangements, the t-item-arrangement class to which the arrangement $a_1 a_2$ . . . $a_t$ belongs, where N has a value given by:

$$N(M_0) \equiv 1 + C_0, N(B) = 1 + f(B), \forall B \in \Lambda \quad (67)$$

and $$N(M_i) = \sum_{a=0}^{R-1} [M_{i-1}(a):a] \cdot N(M_{i-1}(a)), i = 1,2, \ldots \forall M_i \notin \Lambda, \quad (68)$$

where $C_0$ and f(B) are non-negative integers, where Λ is a set of points B for which initialization values N(B) have been provided, and where not all $M_i$∈Λ. In most cases, Λ will consist of points $M_i$ that have at most one respective predecessor $M_{i-1}$. Note that N($M_i$)'s value here is not necessarily the number of allowed arrangements in class $M_i$, although it will be for "tight" enumerators. Eq. (68) is the basis for our referring to this representation as "bottom up": the add-on values for points representing arrangements of a given length can be computed from add-on values for points representing arrangements representing smaller lengths.

The improved enumerator is based on replacing the N($M_i$)'s with quantized values. To explain the nature of this replacement, we start by defining what we mean by quantization. Consider two non-empty—and possibly infinite—sets of numbers X={x} and Y={y}. It is easiest conceptually to think of the numbers as integers, but they can equivalently be any countable set of numbers, such as the set of all rational numbers, which is countably infinite. Consider also a single-valued mapping y=Q(x) (defined for all x∈X) that partitions set X into contiguous non-overlapping ranges of x values; i.e., no range of x values that map to any given y value overlaps the range of x values that map to any other y value. If at least some ranges contain more than one x value, we will say that Y is a quantization of X, denoting it as Y=Q(X). It is a uniform quantization if is Q($x_1$)≦Q($x_2$) whenever $x_1$<$x_1$. If, for every $x_1$<$x_2$ for which Q($x_1$)<Q($x_2$), Q(x) has the property that Q($x_1$)<$x_2$ and $x_1$<Q($x_2$), then, if the quantization is a uniform quantization, it will be called a quantized approximation, we will say that y approximates x, and we will call the function Q(x) a quantized-approximation function. If the numbers x∈X are a contiguous sequence of integers, this approximation property simply means that each y is picked from among the x of the range for which y=Q(x). When X is not a contiguous sequence, so that there are gaps between some ranges that map to different y values, y can also be a number from an adjacent gap.

A quantized approximation for which Q(x)≧x for all x will be called an expanding quantization. And, for a given application, we will say that the quantization Y is streamlined quantization, or that Y is a streamlined format (SF) of X and denote the mapping y=Q(x) as y=SF(x), if in that application additive-arithmetic operations (additions, subtractions, comparisons) and/or storage requirements of one or more numbers x from X become on average more efficient when one or more of these numbers x are replaced by their quantized approximations y=Q(x). For this purpose, the average is taken over all instances in which the additive arithmetic and/or storage of numbers from X occurs in that application, and it is weighted by the instance-usage frequency and any application-specific importance weights. Efficiency, too, is an application-specific criterion for this purpose. For storage, a more-compact representation is commonly considered more efficient, and arithmetic operations are commonly considered more efficient if they execute faster and/or use less working memory, registers, or power.

Quantization is often employed in the context of evaluating some complex expression. When a quantized value V is to be derived from a complex sequence of computations E, one may use minimum quantization: perform the entire sequence E and quantize only the final result before assigning it to V; i.e. V=Q(E). An alternative is to quantize one of more of computation E's intermediate results and continue the computation on the quantized results, performing the last quantization on the final result. At the opposite extreme from minimum quantization V=Q(E) is maximum quantization: quantizing every intermediate result in the computation of E. We will call any non-maximum quantization of E a delayed quantization of E or, when quantization is performed through rounding operations, delayed rounding.

Computational complexity and working-storage requirements will tend to differ among different quantization alternatives, as will numeric results. When fewer intermediate quantizations are employed, the result tends to be more accurate (in expanding quantization, greater accuracy implies more-compact encoding) at the expense of greater arithmetic complexity and working-storage requirements, especially when the quantization is of the streamlined-format type. So choosing among the alternatives involves balancing those factors. We will use notation $\{E\}_Q$ or $\{E\}_{SF}$ to indicate symbolically any degree of intermediate quantization o the enclosed complex expression E, from minimum to maximum Most commonly used quantization approaches are limited-precision quantizations: the number of significant digits in the numbers y used to approximate numbers x is capped, typically to some value less than the maximum number of significant digits in x. The sliding-window-integer arithmetic described above, for example, employs one type of limited-precision quantization. In limited-precision quantization the significant-digit limit is usually but not always imposed on y as expressed in binary, i.e., on the number of binary digits.

Three common variants of limited-precision quantization are rounding up, in which the y value used to approximate x is the smallest y value greater than or equal to x: $y=\lceil x \rceil$, rounding down, in which the y value used to approximate x is the largest y value less than or equal to x: $y=\lfloor x \rfloor$, and rounding to the nearest, in which the y value used to approximate x is the y value nearest to x: $y=\lfloor x \rceil$. Rounding up is a special case of expanding quantization.

Another kind of limited-precision quantization is least-digit quantization, in which the least significant digit of numbers y in some number base r is restricted to a fixed value. The base r may vary with x and may depend on the maximum or minimum x in X. A common convention in this type of quantization is to set the least significant digit to 0.

Having now defined what is meant by quantization, we are ready to describe how to arrive at the improved enumerator from the base enumerator described by Eqs. 65–68. First, we select a streamlined expanding quantization function SF(X) for the number in set X, where X contains at least all add-on values required in the quantization operations set forth below and all the sum values in Eqs. 71 and 72 below. Then substitute for the base enumerator's N(M) values V(M) values as follows:

$$I_t(a_1 a_2 \ldots a_t) = I_{t-1}(a_1 a_2 \ldots a_{t-1}) + \sum_{a=0}^{a_t-1} ([M_{t-1}(a){:}a] \cdot V(M_{t-1}(a)) + \varepsilon) \quad (69)$$

or, equivalently, $$I_n(a_1 a_2 \ldots a_n) = \sum_{t=1}^{n} \sum_{a=0}^{a_t-1} ([M_{t-1}(a){:}a] \cdot V(M_{t-1}(a)) + \varepsilon), \quad (70)$$

where $\varepsilon \geq 0$ can differ for different values of t and a, and V(M) is given by:

$$V(M_0) \equiv \{1 + C_0 + \varepsilon\}_{SF} \ V(B) = \{1 + f(B) + \varepsilon\}_{SF}, \forall B \in \Lambda \quad (71)$$

and $$V(M_i) = \left\{ \sum_{a=0}^{R-1} [M_{i-1}(a){:}a] \cdot V(M_{i-1}(a)) + \varepsilon \right\}_{SF} \ i = 1,2,\ldots \forall M_i \notin \Lambda, \quad (72)$$

where $\varepsilon \geq 0$ represents an optional, application specific reserved code space that can differ for different values of $M_i$ and B.

As was exemplified by the radix and permutation coders described above, the dependence on the volume $V(M_i)$ on the point $M_i$ simplifies in the high-entropy limit to a dependence only on the number i of items: $V(M_i))=V(i)\equiv V_i$. In that case, Eqs. 69–72 respectively simplify to:

$$V_0 \equiv \{1 + C_0 + \varepsilon\}_{SF} \quad (73)$$

$$V_i \left\{ \sum_{a=0}^{R-1} [M_{i-1}(a){:}a] \cdot V_{i-1} + \varepsilon \right\}_{SF} \ i = 1,2,\ldots \quad (74)$$

$$I_t(a_1 a_2 \ldots a_t) = I_{t-1}(a_1 a_2 \ldots a_{t-1}) + \sum_{a=0}^{a_t-1} ([M_{t-1}(a){:}a] \cdot V_{t-1} + \varepsilon) \quad (75)$$

$$I_n(a_1 a_2 \ldots a_n) = \sum_{t=1}^{n} \sum_{a=0}^{a_t-1} ([M_{t-1}(a):a] \cdot V_{t-1} + \varepsilon) \quad (76)$$

Conclusion

By using the present invention's teachings, encoders can, for all practical purposes, compress to the entropy of the source. By using them, I have been able to produce is a prototype coder whose performance was superior to what I believe is a state-of-the-art arithmetic coder. The compression improvement in comparison with the arithmetic coder varied from only a couple of percent when the input data were almost incompressible to nearly 50% for the most-compressible input data, i.e., for precisely the kind of data on which arithmetic coders have demonstrated the strongest performance advantage over Huffman coders. In execution speed, the prototype showed an even greater advantage over the arithmetic coder against which it was tested, running from 20% to 1800% faster, with the lowest gains again being for nearly incompressible data (which a production version would probably pass without encoding, tagging it as "uncompressed").

Additionally, since encoders that employ the present invention's teachings employ an approach that is predominantly combinatorial rather than probabilistic, they can compress at a near-entropy level without accumulating or maintaining symbol statistics. So they do not suffer, as Huffman and arithmetic coders do, from poor adaptability to quickly changing sources, or, more generally, from the large compression-ratio drop that results when the coder-assumed probability distribution fails to match the source distribution. Such situations often occur, for instance, when data are compressed in very small chunks such as those encountered in the incremental state updates used by video and audio codecs. The present invention therefore constitutes a significant advance in the art.

What is claimed is:

1. In an enumerative encoder, an index-computation circuit that, for each n-digit sequence of digits $b_i$, i=1, 2, . . . n, of at least a plurality of sequences that belong to a predetermined set of allowed sequences, where $b_i$ is a symbol chosen from a respective $R_i$-symbol alphabet, responds to an input signal representing that n-digit sequence by generating as an output a signal that represents an index that identifies that input sequence uniquely among all allowed digit sequences having the same symbol population in accordance with an indexing scheme that assigns indexes to sequences in such a manner that:

A) for each i<n, there is associated with each sequence-length-i symbol population a respective single indexing volume V whose value is at least as great as the number of allowed sequences having that symbol population, where, for each sequence-length-i symbol population for which n>i>1:
  i) V is an integer greater than or equal to the sum of every indexing volume associated with a sequence-length-(i–1) symbol population that is a predecessor to that sequence-length-i symbol population; and
  ii) V=$r^s \cdot w$, where:
    a) r is an integer greater than unity,
    b) s is a non-negative integer; and
    c) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;

B) the indexing volumes V associated with some symbol populations exceed the number of allowed sequences having those symbol populations;

C) some allowed digit sequences whose symbol populations differ are identified by the same index;

D) the index assigned to any allowed i-symbol sequence is at least as great as the index assigned to that i-symbol sequence's i–1-symbol prefix;

E) with the exception of at most one symbol from the $R_i$-symbol alphabet, the index for every i-symbol sequence such that i>1 that ends in that symbol exceeds that of i-symbol sequence's i–1-symbol prefix by at least the volume value associated with one said sequence-length-i–1 symbol population that is a predecessor to that i-symbol sequence's symbol population; and F) every n-symbol sequence's index is less than $r^{n/8}$ times the number of allowed sequences that share that sequence's symbol population.

2. An index-computation circuit as defined in claim 1 wherein the index-computation circuit generates the output in accordance with that indexing scheme whenever the symbol population of the sequence represented by the input signal is shared by at least $2^{64}$ allowed n-digit sequences.

3. An index-computation circuit as defined in claim 1 wherein r=2.

4. An index-computation circuit as defined in claim 3 wherein the index-computation circuit generates the output in accordance with that indexing scheme whenever the symbol population of the sequence represented by the input signal is shared by at least $2^{64}$ allowed n-digit sequences.

5. An index-computation circuit as defined in claim 3 wherein the indexing scheme is such that every n-symbol sequence's index is less than $2^c$ times the number of allowed sequences that share that sequence's symbol population, where c=n/16.

6. An index-computation circuit as defined in claim 3 wherein the indexing scheme is such that every n-symbol sequence's index is less than $2^c$ times the number of allowed sequences that share that sequence's symbol population, where c=n/32.

7. An index-computation circuit as defined in claim 3 wherein the indexing scheme is such that every n-symbol sequence's index is less than $2^c$ times the number of allowed sequences that share that sequence's symbol population, where c=2.

8. An index-computation circuit as defined in claim 7 wherein $R_i$=2 for all i.

9. An index-computation circuit as defined in claim 7 wherein the index-computation circuit generates the output in accordance with that indexing scheme whenever the symbol population of the sequence represented by the input signal is shared by at least $2^{64}$ allowed n-digit sequences.

10. An index-computation circuit as defined in claim 3 wherein the indexing scheme is such that the index $I(b_1, \ldots, b_n)$ for any allowed sequence $b_1, \ldots, b_n$, satisfies the recurrence equation $$I(b_1 b_2 \ldots b_t) = I(b_1 b_2 \ldots b_{t-1}) + \sum_{k=0}^{b_t-1} [M_{t-1}(k):k] \cdot V(M_{t-1}(k)),$$

where $M_{t-1}(b)=M_t-\langle b\rangle$, $M_t$ is the set of sequences whose symbol population is the same as $b_1 b_2 \ldots b_t$; and $V(M_{t-1}(b))$ is the indexing volume associated with symbol population $M_{t-1}(b)$.

11. An index-computation circuit as defined in claim 10 wherein the indexing scheme is such that every n-symbol sequence's index is less than twice the number of allowed sequences that share that sequence's symbol population.

12. An index-computation circuit as defined in claim 11 wherein $w<r^{h-2}$.

13. An index-computation circuit as defined in claim 12 wherein the predetermined set of allowed n-digit sequences includes every sequence in which every $b_i$ is chosen from the respective $R_i$-symbol alphabet.

14. An index-computation circuit as defined in claim 13 wherein $R_i=2$ for all i.

15. An index-computation circuit as defined in claim 13 wherein the index-computation circuit generates the output in accordance with that indexing scheme whenever the symbol population of the sequence represented by the input signal is shared by at least $2^{16}$ allowed n-digit sequences.

16. An index-computation circuit as defined in claim 13 wherein the indexing scheme is such that every n-symbol sequence's index is less than $2^c$ times the number of allowed sequences that share that sequence's symbol population, where $c=\frac{1}{4}$.

17. An index-computation circuit as defined in claim 13 wherein the indexing scheme is such that every n-symbol sequence's index is less than $2^c$ times the number of allowed sequences that share that sequence's symbol population, where $c=\frac{1}{32}$.

18. An index-computation circuit as defined in claim 10 wherein the index-computation circuit generates the output in accordance with that indexing scheme whenever the symbol population of the sequence represented by the input signal is shared by at least $2^{16}$ allowed n-digit sequences.

19. An index-computation circuit as defined in claim 10 wherein the index-computation circuit generates the output in accordance with that indexing scheme whenever the symbol population of the sequence represented by the input signal is shared by a plurality of allowed n-digit sequences.

20. An index-computation circuit as defined in claim 3 wherein, for some positive integer m<h and each i>1, the indexing volume V associated with each sequence-length-i symbol population is the smallest value such that $V=r^s w$ and $w<r^m$ that is greater than or equal to the sum of the indexing volumes associated with the allowed-sequence-length-n–1 symbol populations that are predecessors of that symbol population.

21. An index-computation circuit as defined in claim 20 wherein the index-computation circuit generates the output in accordance with that indexing scheme whenever the symbol population of the sequence represented by the input signal is shared by at least $2^{16}$ allowed n-digit sequences.

22. An index-computation circuit as defined in claim 21 wherein $R_i=2$ for all i.

23. An index-computation circuit as defined in claim 20 wherein the indexing scheme is such that the index $I(b_1, \ldots, b_n)$ for any allowed sequence $b_1, \ldots, b_n$ satisfies the recurrence equation $$I(b_1 b_2 \ldots b_t) = I(b_1 b_2 \ldots b_{t-1}) + \sum_{k=0}^{b_t-1} [M_{t-1}(k){:}k] \cdot V(M_{t-1}(k)),$$

where $M_{t-1}(b)=M_t-\langle b\rangle$, $M_t$ is the set of sequences whose symbol population is the same as $b_1 b_2 \ldots b_t$; and $V(M_{t-1}(b))$ is the indexing volume associated with symbol population $M_{t-1}(b)$.

24. An index-computation circuit as defined in claim 23 wherein the predetermined set of allowed n-digit sequences includes every sequence in which every $b_i$ is chosen from the respective $R_i$-symbol alphabet.

25. An index-computation circuit as defined in claim 3 wherein $w<r^8$.

26. An index-computation circuit as defined in claim 3 wherein $w<r^9$.

27. An index-computation circuit as defined in claim 3 wherein $w<r^{16}$.

28. An index-computation circuit as defined in claim 3 wherein $w<r^{17}$.

29. An index-computation circuit as defined in claim 3 wherein $w<r^{32}$.

30. An index-computation circuit as defined in claim 3 wherein $w<r^{33}$.

31. An index-computation circuit as defined in claim 3 that includes persistent storage that contains a table of volume values from which at least some of the volume values are fetched to compute the index value.

32. An index-computation circuit as defined in claim 3 wherein the predetermined set of allowed n-digit sequences includes every sequence in which every $b_i$ is chosen from the respective $R_i$-symbol alphabet.

33. An index-computation circuit as defined in claim 3 wherein $R_i=2$ for all i.

34. An index-computation circuit as defined in claim 33 wherein:
A) the input sequence is one of a plurality of re-symboled sequences that the encoder generates, from a high-radix sequence of digits at least some of which are symbols chosen from an alphabet of more than two symbols, by:
  i) associating respective prefix codes with the alphabet's symbols, each prefix code consisting of a sequence of bits with which no other prefix code associated with another of the alphabet's symbols begins;
  ii) computing, for each j-bit sequence such that the high-radix sequence includes more than one symbol whose prefix code is longer than j bits and begins with that j-bit sequence, a separate index for the bit sequence that consists of, for each digit in the high-radix sequence that equals such a symbol, the (j+1)st bit of the prefix code for that digit's symbol;
B) the output includes a representation of each such index.

35. An index-computation circuit as defined in claim 34 wherein the index-computation circuit generates the output in accordance with that indexing scheme whenever the symbol population of the sequence represented by the input signal is shared by at least $2^{64}$ allowed n-digit sequences.

36. An index-computation circuit as defined in claim 34 wherein the prefix codes are compact.

37. An index-computation circuit as defined in claim 34 wherein the prefix codes are Huffman codes.

38. An index-computation circuit as defined in claim 33 wherein the indexing scheme is such that the index $I(b_1, \ldots, b_n)$ for any allowed sequence $b_1, \ldots, b_n$ satisfies the recurrence equation $$I(b_1, \ldots, b_t) = I(b_1, \ldots, b_{t-1}) + a_t V(b_1, \ldots, b_{t-1})$$
$$t>1,$$

where, for each t, $a_t$ equals zero if $b_t$ is a predetermined one of the two symbols in the alphabet, $a_t$ equals one if $b_t$ is the other of the two symbols in the alphabet, and $V(b_1, \ldots, b_{t-1})$ is the indexing volume associated with the symbol population of sequence $b_1, \ldots, b_{t-1}$.

39. An index-computation circuit as defined in claim 33 wherein the predetermined set of allowed n-digit sequences includes every sequence in which every $b_i$ is chosen from the respective $R_i$-symbol alphabet.

40. An index-computation circuit as defined in claim 1 wherein the value of the index $I_n$ is given by $$I_n(b_1 b_1 \ldots b_n) = \sum_{t=1}^{n} \sum_{b=0}^{b_t-1} ([M_{t-1}(b):b] \cdot V_{t-1} + \varepsilon),$$

where

A) $V_t$ is an indexing volume such that:

$$V_0 = \{C_0\}_{SF}; \quad \text{and} \quad V_t \left\{ \sum_{b=0}^{R-1} [M_{t-1}(b):b] \cdot V_{t-1} + \delta \right\}_{SF}, i = 1, 2, \ldots,$$

B) $M_{t-1}(b) = M_t - \langle b \rangle$;
C) $M_t$ is the symbol population of sequence $b_1 b_2 \ldots b_t$;
D) $\varepsilon$ is a non-negative integer that can differ for different combinations of b and t;
E) $C_0$ is a positive integer;
F) $\Lambda$ is a set of arrangement classes B for which initialization values $V(B)$ have been provided;
G) $\{E\}_{SF}$ is a streamlined expanding quantization of E;
H) R is the maximum number of symbols from which a digit can be selected; and
I) $\delta$ is a non-negative integer, which can differ for different values of $M_t$ and b.

41. An index-computation circuit as defined in claim 40 wherein the index-computation circuit generates the output in accordance with that indexing scheme whenever the symbol population of the sequence represented by the input signal is shared by at least $2^{64}$ allowed n-digit sequences.

42. An index-computation circuit as defined in claim 40 wherein $R_i = i$ and $V_n = \{nV_{n-1}\}_{SF}$.

43. An index-computation circuit as defined in claim 40 wherein the predetermined set of allowed n-digit sequences includes every sequence in which every $b_i$ is chosen from the respective $R_i$-symbol alphabet.

44. An index-computation circuit as defined in claim 40 wherein r=2.

45. An index-computation circuit as defined in claim 44 wherein $w < r^{h-2}$.

46. An index-computation circuit as defined in claim 44 wherein every n-symbol sequence's index is less than twice the number of allowed sequences that share that sequence's symbol population.

47. An index-computation circuit as defined in claim 46 wherein the index-computation circuit generates the output in accordance with that indexing scheme whenever the symbol population of the sequence represented by the input signal is shared by at least $2^{64}$ allowed n-digit sequences.

48. An index-computation circuit as defined in claim 46 wherein the index-computation circuit generates the output in accordance with that indexing scheme whenever the symbol population of the sequence represented by the input signal is shared by at least $2^{16}$ allowed n-digit sequences.

49. An index-computation circuit as defined in claim 46 wherein the index-computation circuit generates the output in accordance with that indexing scheme whenever the symbol population of the sequence represented by the input signal is shared by a plurality of allowed n-digit sequences.

50. An index-computation circuit as defined in claim 46 wherein the predetermined set of allowed n-digit sequences includes every sequence in which every $b_i$ is chosen from the respective $R_i$-symbol alphabet.

51. An index-computation circuit as defined in claim 46 wherein:
A) for some positive integer m<h and each i>1, the indexing volume V associated with each sequence-length-i symbol population is the smallest value such that $V = r^s w$ and $w < r^m$ that is greater than or equal to the sum of the indexing volumes associated with the allowed-sequence-length-n−1 symbol populations that are predecessors of that symbol population;
B) $\varepsilon = 0$; and
C) $\delta = 0$.

52. An index-computation circuit as defined in claim 51 wherein $C_0 = 1$.

53. An index-computation circuit as defined in claim 52 wherein the predetermined set of allowed n-digit sequences includes every sequence in which every $b_i$ is chosen from the respective $R_i$-symbol alphabet.

54. An index-computation circuit as defined in claim 44 wherein $w < r^8$.

55. An index-computation circuit as defined in claim 44 wherein $w < r^9$.

56. An index-computation circuit as defined in claim 44 wherein $w < r^{16}$.

57. An index-computation circuit as defined in claim 44 wherein $w < r^{17}$.

58. An index-computation circuit as defined in claim 44 wherein $w < r^{32}$.

59. An index-computation circuit as defined in claim 44 wherein $w < r^{33}$.

60. An index-computation circuit as defined in claim 40 wherein:
A) for some positive integer m<h and each i>1, the indexing volume V associated with each sequence-length-i symbol population is the smallest value such that $V = r^s w$ and $w < r^m$ that is greater than or equal to the sum of the indexing volumes associated with the allowed-sequence-length-n−1 symbol populations that are predecessors of that symbol population;
B) $\varepsilon = 0$; and
C) $\delta = 0$.

61. An index-computation circuit as defined in claim 1 wherein:
A) the index-computation circuit computes $I_n$ in a series of operations of which some are volume-operand operations, which employ as operands $V(M_i)$ for respective values of i; and
B) no said volume-operand operation that employs $V(M_i)$ as an operand employs any operand derived from $V(M_{i'})$, where i'>i.

62. An encoder comprising:
A) an index-computation circuit that, for each n-digit sequence of digits $b_i$, i=1, 2, ... n, of at least a plurality of sequences that belong to a predetermined set of allowed sequences, where $b_i$ is a symbol chosen from a respective $R_i$-symbol alphabet, responds to an input signal representing that n-digit sequence by generating as an output a signal that represents an index that identifies that input sequence uniquely among all allowed digit sequences having the same symbol population in accordance with an indexing scheme that assigns indexes to sequences in such a manner that:
i) for each i<n, there is associated with each sequence-length-i symbol population a respective single indexing volume V whose value is at least as great as the number of allowed sequences having that symbol population, where, for each sequence-length-i symbol population for which n>i>1:
  a) V is an integer greater than or equal to the sum of every indexing volume associated with a sequence-length-(i−1) symbol population that is a predecessor to that sequence-length-i symbol population; and
  b) $V=r^s \cdot w$, where:
    (1) r is an integer greater than unity,
    (2) s is a non-negative integer; and
    (3) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;
ii) the indexing volumes V associated with some symbol populations exceed the number of allowed sequences having those symbol populations;
iii) some digit sequences whose symbol populations differ are identified by the same index;
iv) with the exception of at most one symbol from the $R_i$-symbol alphabet, the index for every i-symbol sequence such that i>1 that ends in that symbol exceeds that of its i−1-symbol prefix by at least the volume value associated with one said sequence-length-i−1 symbol population that is a predecessor to that i-symbol sequence's symbol population; and
v) every n-symbol sequence's index is less than $r^{n/8}$ times the number of allowed sequences that share that sequence's symbol population; and
B) an output circuit responsive to the index-computation circuit to produce an output signal that represents a code determined in part by and indication of the sequence's symbol population an in part by the output of the index-computation circuit.

63. An enumerative decoder that, in response to an input signal that (1) identifies a sequence's symbol population and (2) specifies an index that identifies that sequence uniquely among all digit sequences having that same symbol population in a predetermined set of allowed sequences, generates, if the sequence is any n-digit sequence of digits $b_i$, i=1, 2, . . . n, of at least a plurality of sequences that belong to the predetermined set of allowed sequences, where $b_i$ is a symbol chosen from a respective $R_i$-symbol alphabet, an output signal that represents a sequence that the encoder determines in accordance with an indexing scheme that assigns indexes to sequences in such a manner that:
A) for each i<n, there is associated with each sequence-length-i symbol population a single respective indexing volume V whose value is at least as great as the number of allowed sequences having that symbol population, where, for each sequence-length-i symbol population for which n>i>1:
  i) V is an integer greater than or equal to the sum of every indexing volume associated with a sequence-length-(i−1) symbol population that is a predecessor to that sequence-length-i symbol population; and
  ii) $V=r^s \cdot w$ where:
    a) r is an integer greater than unity,
    b) s is a non-negative integer; and
    c) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;
B) the indexing volumes V associated with some symbol populations exceed the number of allowed sequences having those symbol populations;
C) some allowed digit sequences whose symbol populations differ are identified by the same index;
D) the index assigned to any allowed i-symbol sequence is at least as great as the index assigned to that i-symbol sequence's i−1-symbol prefix;
E) with the exception of at most one symbol from the $R_i$-symbol alphabet, the index for every i-symbol sequence such that i>1 that ends in that symbol exceeds that of i-symbol sequence's i−1-symbol prefix by at least the volume value associated with one said sequence-length-i−1 symbol population that is a predecessor to that i-symbol sequence's symbol population; and
F) every n-symbol sequence's index is less than $r^c$ times the number of allowed sequences that share that sequence's symbol population, where c=n/8.

64. A binary entropy encoder responsive to an input signal representing a high-radix sequence of digits chosen from an alphabet of more than two symbols to generate an output by:
A) associating respective prefix codes with the alphabet's symbols, each prefix code consisting of a sequence of bits with which no other prefix code associated with another of the alphabet's symbols begins;
B) computing, for each j-bit sequence such that the high-radix sequence includes more than one symbol whose prefix code is longer than j bits and begins with that j-bit sequence, a separate entropy code for the bit sequence that consists of, for each digit in the high-radix sequence that equals such a symbol, the (j+1)st bit of the prefix code for that digit's symbol; and
C) generating as the output a signal that includes the codes thus computed.

65. An encoder as defined in claim 64 wherein the prefix codes are compact.

66. An encoder as defined in claim 64 wherein the prefix codes are Huffman codes.

67. An enumeration circuit that, for each arrangement $a_1 a_2 \ldots a_n$ of at least a plurality of arrangements that belong to a predetermined set of allowed arrangements, each of that plurality of arrangements belonging to a respective arrangement class among a disjoint set of allowed-n-element-arrangement classes that together cover all allowed n-element arrangements, responds to an input signal representing that arrangement by generating in response thereto a signal representing an index $I_n$ that satisfies the recurrence $$I_t(a_1 a_2 \ldots a_n) = I_{t-1}(a_1 a_2 \ldots a_{t-1}) + \sum_{a=0}^{a_t-1} ([M_{t-1}(a):a] \cdot V(M_{t-1}(a)) + \varepsilon),$$

where:
A) $M_{t-1}(a) = M_t - <a>$;
B) $M_t$ is the t-element-arrangement class to which the arrangement $a_1 a_2 \ldots a_t$ belongs;
C) $\varepsilon$ is a non-negative integer that can differ for different combinations of a and t, and D) V(M) is an indexing volume such that:

$$V(M_0) \equiv \{C_0\}_{SF} \quad V(B) = \{f(B)\}_{SF}, \quad \forall B \in \Lambda, \text{ and}$$

$$V(M_i) = \left\{ \sum_{a=0}^{R-1} [M_{i-1}(a):a] \cdot V(M_{i-1}(a)) + \delta \right\}_{SF} \quad i = 1, 2, \ldots \forall M_i \notin \Lambda,$$

where:
$C_0$ is a positive integer;
$\Lambda$ is a set of arrangement classes B for which initialization values V(B) have been provided;
not all $M_i$ belong to $\Lambda$;
$f(B)$ is a positive-integer-valued function of B;
$\{E\}_{SF}$ is a streamlined expanding quantization of E;
R is the maximum number of items from which an arrangement's elements can be selected; and
$\delta$ is a non-negative integer, which can differ for different values of $M_i$ and B.

68. An enumeration circuit as defined in claim 67 wherein the allowed arrangements are symbol sequences and the elements in the arrangement $a_1 a_2 \ldots a_n$ are digits $b_i$, i=1, 2, ... n, where $b_i$ is a symbol chosen from a respective $R_i$-symbol alphabet.

69. An enumeration circuit as defined in claim 68 wherein each arrangement class is associated with a single respective symbol population, and all the symbol sequences having a given symbol population belong to the arrangement class associated with that symbol population.

70. An enumeration circuit as defined in claim 67 wherein the index satisfies the recurrence whenever the arrangement class to which the arrangement represented by the input signal belongs is shared by at least $2^{64}$ allowed arrangements.

71. An enumeration circuit as defined in claim 67 wherein:
A) every such n-element arrangement's index is less than $2^c$ times the number of allowed arrangements that share that arrangement class, where c=n/8; and
B) $\{E\}_{SF}$ is a streamlined expanding quantization of E such that, for some integer r greater than unity, some positive integer m less than h, where, for some allowed arrangement whose size is less than n, h is the number of radix-r digits in the smallest quotient that results from evenly dividing by a positive-integer power of r the allowed-arrangement count of the arrangement class to which that allowed arrangement belongs, and all i<n, $V(M_i)=r^s \cdot w$, where s is a non-negative integer and w is a positive integer less than $r^m$.

72. An enumeration circuit as defined in claim 71 wherein the index satisfies the recurrence whenever the arrangement class to which the arrangement represented by the input signal belongs is shared by at least $2^{64}$ allowed arrangements.

73. An enumeration circuit as defined in claim 71 wherein r=2.

74. An enumeration circuit as defined in claim 73 wherein $R_i=2$ for all i.

75. An enumeration circuit as defined in claim 73 wherein $[M_{i-1}(a):a]=1$ for all a<$R_i$.

76. An enumeration circuit as defined in claim 73 wherein:
A) $\Lambda$ includes no arrangement class that has more than one predecessor
B) $C_0=1$; and
C) $f(B)=1$.

77. An enumeration circuit as defined in claim 71 wherein:
A) $\{E\}_{SF}$ is the smallest value greater than or equal to E such that $\{E\}_{SF}=r^s w$ and w<$r^m$;
B) $\epsilon=0$; and
C) $\delta=0$.

78. An enumeration circuit as defined in claim 77 wherein $[M_{i-1}(a):a]=1$ for all a<$R_i$.

79. An enumeration circuit as defined in claim 78 wherein the enumeration circuit generates a signal representing such an index whenever the arrangement class to which the arrangement represented by the input signal belongs has an arrangement count greater than $2^{16}$.

80. An enumeration circuit as defined in claim 79 wherein $R_i=2$ for all i.

81. An enumeration circuit as defined in claim 80 wherein the enumeration circuit generates a signal representing such an index whenever the arrangement class to which the arrangement represented by the input signal belongs has an arrangement count greater than 2.

82. An enumeration circuit as defined in claim 77 wherein each arrangement class is associated with a single respective symbol population, and all the symbol sequences having a given symbol population belong to the arrangement class associated with that symbol population.

83. An enumeration circuit as defined in claim 71 wherein the resultant index $I_n$ is given by:

$$I_n(a_1 a_1 \ldots a_n) = \sum_{t=1}^{n} \sum_{a=0}^{a_t-1} ([M_{t-1}(a):a] \cdot V_{t-1} + \varepsilon),$$

where $V_t$ is an indexing volume such that:

$$V_0 = \{C_0\}_{SF} \quad \text{and} \quad V_i \left\{ \sum_{a=0}^{R-1} [M_{i-1}(a):a] \cdot V_{i-1} + \delta \right\}_{SF}, \quad i = 1, 2, \ldots$$

84. An enumeration circuit as defined in claim 83 wherein $R_i = i$ and $V_n = \{nV_{n-1}\}_{SF}$.

85. An enumeration circuit as defined in claim 67 wherein:
A) the enumeration circuit computes $I_n$ in a series of operations of which some are volume-operand operations, which employ as operands $V(M_i)$ for respective values of i; and
B) no said volume-operand operation that employs $V(M_i)$ as an operand employs any operand derived from $V(M_{i'})$ where i'>i.

86. A method of computing the volume values $V(M_i)$ for use in an enumeration circuit that, for each arrangement $a_1 a_2 \ldots a_n$ of at least a plurality of arrangements that belong to a predetermined set of allowed arrangements, each of that plurality of arrangements belonging to a respective arrangement class among a disjoint set of allowed-n-element-arrangement classes that together cover all allowed n-element arrangements, responds to an input signal representing that arrangement by generating in response thereto a signal representing an index $I_n$ that satisfies the recurrence $$I_t(a_1 a_2 \ldots a_t) = I_{t-1}(a_1 a_2 \ldots a_{t-1}) + \sum_{a=0}^{a_t-1} ([M_{t-1}(a):a] \cdot V(M_{t-1}(a)) + \varepsilon),$$

the method comprising successively computing volume values $V(M_i)$ from $V(M_{i-1})$ values in accordance with:

$$V(M_i) = \left\{ \sum_{a=0}^{R-1} [M_{i-1}(a):a] \cdot V(M_{i-1}(a)) + \delta \right\}_{SF} \quad i = 1, 2, \ldots,$$

for each $M_i$ that does not belong to $\Lambda$,
where:
A) $M_{t-1}(a) = M_t - \langle a \rangle$;
B) $M_t$ is the t-element-arrangement class to which the arrangement $a_1 a_2 \ldots a_t$ belongs;
C) $\varepsilon$ is a non-negative integer that can differ for different combinations of a and t, and
D) $V(M)$ is an indexing volume such that:

$$V(M_0) \equiv \{C_0\}_{SF} \quad V(B) = \{f(B)\}_{SF}, \forall B \in \Lambda, \text{ and}$$

$$V(M_i) = \left\{ \sum_{a=0}^{R-1} [M_{i-1}(a):a] \cdot V(M_{i-1}(a)) + \delta \right\}_{SF} \quad i = 1, 2, \ldots \forall M_i \notin \Lambda,$$

where:
$C_0$ is a positive integer;
$\Lambda$ is a set of arrangement classes B for which initialization values $V(B)$ have been provided;
not all $M_i$ belong to $\Lambda$;
$f(B)$ is a positive-integer-valued function of B;
$\{E\}_{SF}$ is a streamlined expanding quantization of E;
R is the maximum number of items from which an arrangement's elements can be selected; and
$\delta$ is a non-negative integer, which can differ for different values of $M_i$ and B.

87. A method as defined in claim 86 wherein $\{E\}_{SF}$ is a streamlined expanding quantization of E such that, for all $i<n$, $V(M_i)=r^s \cdot w$, where r is an integer greater than unity, s is a non-negative integer, w is a positive integer less than $r^m$, m is some positive integer less than h, and, for some allowed arrangement whose size is less than n, h is the number of radix-r digits in the smallest quotient that results from evenly dividing by a positive-integer power of r the allowed-arrangement count of the arrangement class to which that allowed arrangement belongs.

88. A method as defined in claim 87 wherein:
A) $\Lambda$ includes no arrangement class that has more than one predecessor
B) $C_0=1$; and
C) $f(B)=1$.

89. A method as defined in claim 88 wherein:
A) $\{E\}_{SF}$ is the smallest value greater than or equal to E such that $\{E\}_{SF}=r^s w$ and $w<r^m$; and
B) $\delta=0$.

90. A storage medium containing machine instructions readable by a computer system to configure the computer system as an index-computation circuit that, for each n-digit sequence of digits $b_i$, $i=1, 2, \ldots n$, of at least a plurality of sequences that belong to a pre-determined set of allowed sequences, where $b_i$ is a symbol chosen from a respective $R_i$-symbol alphabet, responds to an input signal representing that n-digit sequence by generating as an output a signal that represents an index that identifies that input sequence uniquely among all allowed digit sequences having the same symbol population in accordance with an indexing scheme that assigns indexes to sequences in such a manner that:
A) for each $i<n$, there is associated with each sequence-length-i symbol population a single respective indexing volume V whose value is at least as great as the number of allowed sequences having that symbol population, where, for each sequence-length-i symbol population for which $n>i>1$:
i) V is an integer greater than or equal to the sum of every indexing volume associated with a sequence-length-(i−1) symbol population that is a predecessor to that sequence-length-i symbol population; and
ii) $V=r^s \cdot w$, where:
a) r is an integer greater than unity,
b) s is a non-negative integer; and
c) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;
B) the indexing volumes V associated with some symbol populations exceed the number of allowed sequences having those symbol populations;
C) some allowed digit sequences whose symbol populations differ are identified by the same index;
D) the index assigned to any allowed i-symbol sequence is at least as great as the index assigned to that i-symbol sequence's i−1-symbol prefix;
E) with the exception of at most one symbol from the $R_i$-symbol alphabet, the index for every i-symbol sequence such that $i>1$ that ends in that symbol exceeds that of i-symbol sequence's i−1-symbol prefix by at least the volume value associated with one said sequence-length-i−1 symbol population that is a predecessor to that i-symbol sequence's symbol population; and
F) every n-symbol sequence's index is less than $r^{n/8}$ times the number of allowed sequences that share that sequence's symbol population.

91. A storage medium containing machine instructions readable by a computer system to configure the computer system as an enumerative decoder that, in response to an input signal that (1) identifies a sequence's symbol population and (2) specifies an index that identifies that sequence uniquely among all digit sequences having that same symbol population in a predetermined set of allowed sequences, generates, if the sequence is any n-digit sequence of digits $b_i$, $i=1, 2, \ldots n$, of at least a plurality of sequences that belong to the predetermined set of allowed sequences, where $b_i$ is a symbol chosen from a respective $R_i$-symbol alphabet, an output signal that represents a sequence that the encoder determines in accordance with an indexing scheme that assigns indexes to sequences in such a manner that:
A) for each $i<n$, there is associated with each sequence-length-i symbol population a single respective indexing volume V whose value is at least as great as the number of allowed sequences having that symbol population, where, for each sequence-length-i symbol population for which $n>i>1$:
i) V is an integer greater than or equal to the sum of every indexing volume associated with a sequence-length-(i−1) symbol population that is a predecessor to that sequence-length-i symbol population; and ii) $V = r^s \cdot w$, where:
   a) r is an integer greater than unity,
   b) s is a non-negative integer; and
   c) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;
B) the indexing volumes V associated with some symbol populations exceed the number of allowed sequences having those symbol populations;
C) some allowed digit sequences whose symbol populations differ are identified by the same index;
D) the index assigned to any allowed i-symbol sequence is at least as great as the index assigned to that i-symbol sequence's i−1-symbol prefix;
E) with the exception of at most one symbol from the $R_t$-symbol alphabet, the index for every i-symbol sequence such that i>1 that ends in that symbol exceeds that of i-symbol sequence's i−1-symbol prefix by at least the volume value associated with one said sequence-length-i−1 symbol population that is a predecessor to that i-symbol sequence's symbol population; and
F) every n-symbol sequence's index is less than $r^c$ times the number of allowed sequences that share that sequence's symbol population, where c=n/8.

92. A binary entropy encoder responsive to an input signal representing a high-radix sequence of digits chosen from an alphabet of more than two symbols to generate an output by:
A) associating respective prefix codes with the alphabet's symbols, each prefix code consisting of a sequence of bits with which no other prefix code associated with another of the alphabet's symbols begins;
B) computing, for each j-bit sequence such that the high-radix sequence includes more than one symbol whose prefix code is longer than j bits and begins with that j-bit sequence, a separate entropy code for the bit sequence that consists of, for each digit in the high-radix sequence that equals such a symbol, the (j+1)st bit of the prefix code for that digit's symbol; and
C) generating as the output a signal that includes the codes thus computed.

93. A storage medium containing machine instructions readable by a computer system to configure the computer system as an enumeration circuit that, for each arrangement $a_1 a_2 \ldots a_n$ of at least a plurality of arrangements that belong to a predetermined set of allowed arrangements, each of that plurality of arrangements belonging to a respective arrangement class among a disjoint set of allowed-n-element-arrangement classes that together cover all allowed n-element arrangements, responds to an input signal representing that arrangement by generating in response thereto a signal representing an index $I_n$ that satisfies the recurrence $$I_t(a_1 a_2 \ldots a_t) = I_{t-1}(a_1 a_2 \ldots a_{t-1}) + \sum_{a=0}^{a_t-1} ([M_{t-1}(a):a] \cdot V(M_{t-1}(a)) + \varepsilon),$$

where:
A) $M_{t-1}(a) = M_t - \langle a \rangle$;
B) $M_t$ is the t-element-arrangement class to which the arrangement $a_1 a_2 \ldots a_t$ belongs;
C) $\varepsilon$ is a non-negative integer that can differ for different combinations of a and t, and
D) V(M) is an indexing volume such that:

$$V(M_0) \equiv \{C_0\}_{SF} \quad V(B) = \{f(B)\}_{SF}, \forall B \in \Lambda, \text{ and}$$

$$V(M_i) = \left\{ \sum_{a=0}^{R-1} [M_{i-1}(a):a] \cdot V(M_{i-1}(a)) + \delta \right\}_{SF} \quad i = 1, 2, \ldots \forall M_i \notin \Lambda,$$

where:
$C_0$ is a positive integer;
$\Lambda$ is a set of arrangement classes B for which initialization values V(B) have been provided;
not all $M_i$ belong to $\Lambda$;
$f(B)$ is a positive-integer-valued function of B;
$\{E\}_{SF}$ is a streamlined expanding quantization of E;
R is the maximum number of items from which an arrangement's elements can be selected; and
$\delta$ is a non-negative integer, which can differ for different values of $M_i$ and B.

94. A storage medium containing machine instructions readable by a computer system to configure the computer system to compute the volume values $V(M_i)$ for use in an enumeration circuit that, for each arrangement $a_1 a_2 \ldots a_n$ of at least a plurality of arrangements that belong to a predetermined set of allowed arrangements, each of that plurality of arrangements belonging to a respective arrangement class among a disjoint set of allowed-n-element-arrangement classes that together cover all allowed n-element arrangements, responds to an input signal representing that arrangement by generating in response thereto a signal representing an index $I_n$ that satisfies the recurrence $$I_t(a_1 a_2 \ldots a_t) = I_{t-1}(a_1 a_2 \ldots a_{t-1}) + \sum_{a=0}^{a_t-1} ([M_{t-1}(a):a] \cdot V(M_{t-1}(a)) + \varepsilon),$$

by successively computing volume values $V(M_i)$ from $V(M_{i-1})$ values in accordance with:

$$V(M_i) = \left\{ \sum_{a=0}^{R-1} [M_{i-1}(a):a] \cdot V(M_{i-1}(a)) + \delta \right\}_{SF} \quad i = 1, 2, \ldots,$$

for each $M_i$ that does not belong to $\Lambda$, where:
A) $M_{t-1}(a) = M_t - \langle a \rangle$;
B) $M_t$ is the t-element-arrangement class to which the arrangement $a_1 a_2 \ldots a_t$ belongs;
C) $\varepsilon$ is a non-negative integer that can differ for different combinations of a and t, and
D) V(M) is an indexing volume such that:

$$V(M_0) \equiv \{C_0\}_{SF} \quad V(B) = \{f(B)\}_{SF}, \forall B \in \Lambda, \text{ and}$$

$$V(M_i) = \left\{ \sum_{a=0}^{R-1} [M_{i-1}(a):a] \cdot V(M_{i-1}(a)) + \delta \right\}_{SF} \quad i = 1, 2, \ldots \forall M_i \notin \Lambda,$$

where:
$C_0$ is a positive integer;
$\Lambda$ is a set of arrangement classes B for which initialization values V(B) have been provided;
not all $M_i$ belong to $\Lambda$;
$f(B)$ is a positive-integer-valued function of B;
$\{E\}_{SF}$ is a streamlined expanding quantization of E;
R is the maximum number of items from which an arrangement's elements can be selected; and
$\delta$ is a non-negative integer, which can differ for different values of $M_i$ and B.

95. A storage medium containing machine instructions readable by a computer system to configure the computer system as an encoder comprising:
- A) an index-computation circuit that, for each n-digit sequence of digits $b_i$, i=1, 2, ... n, of at least a plurality of sequences that belong to a predetermined set of allowed sequences, where $b_i$ is a symbol chosen from a respective $R_i$-symbol alphabet, responds to an input signal representing that n-digit sequence by generating as an output a signal that represents an index that identifies that input sequence uniquely among all allowed digit sequences having the same symbol population in accordance with an indexing scheme that assigns indexes to sequences in such a manner that:
  - i) for each i<n, there is associated with each sequence-length-i symbol population a respective indexing volume V whose value is at least as great as the number of allowed sequences having that symbol population, where, for each sequence-length-i symbol population for which n>i>1:
    - a) V is an integer greater than or equal to the sum of every indexing volume associated with a sequence-length-(i−1) symbol population that is a predecessor to that sequence-length-i symbol population; and
    - b) $V=r^s \cdot w$, where:
      - (1) r is an integer greater than unity, and
      - (2) s is a non-negative integer;
      - (3) w is a positive integer less than $r^{h-1}$, where, for some allowed sequence whose length is less than n, h is the number of radix-r digits in the smallest quotient that results from evenly dividing the allowed-sequence count of that symbol population by a positive-integer power of r;
  - ii) the indexing volumes V associated with some symbol populations exceed the number of allowed sequences having those symbol populations;
  - iii) some digit sequences whose symbol populations differ are identified by the same index;
  - iv) with the exception of at most one symbol from the $R_i$-symbol alphabet, the index for every i-symbol sequence such that i>1 that ends in that symbol exceeds that of its i−1-symbol prefix by at least the volume value associated with one said sequence-length-i−1 symbol population that is a predecessor to that i-symbol sequence's symbol population; and
  - v) every n-symbol sequence's index is less than $r^{n/8}$ times the number of allowed sequences that share that sequence's symbol population; and
- B) an output circuit responsive to the index-computation circuit to produce an output signal that represents a code determined in part by and indication of the sequence's symbol population and in part by the output of the index-computation circuit.

96. A method of generating an index signal for entropy coding comprising:
- A) receiving a signal representing an n-digit sequence of digits $b_i$, i=1, 2, ... n, where $b_i$ is a symbol chosen from a respective $R_i$-symbol alphabet, that belongs to a predetermined set of allowed sequences;
- B) computing for that sequence an index that, uniquely among all allowed digit sequences having the same symbol population, identifies that input sequence in accordance with an indexing scheme such that:
  - i) for each positive integer i<n, there is associated with each sequence-length-i symbol population a respective single indexing volume V whose value is at least as great as the number of allowed sequences having that symbol population, where, for each sequence-length-i symbol population for which n>i>1:
    - a) V is an integer greater than or equal to the sum of every indexing volume associated with a sequence-length-(i−1) symbol population that is a predecessor to that sequence-length-i symbol population; and
    - b) $V=r^s \cdot w$, where:
      - (1) r is an integer greater than unity, and
      - (2) s is a non-negative integer;
      - (3) w is a positive integer less than $r^{h-1}$, where, h is the radix-r resolution required to express the symbol count of the symbol population of some allowed sequence whose length is less than n;
  - ii) the indexing volumes V associated with some symbol populations exceed the number of allowed sequences having those symbol populations;
  - iii) some digit sequences whose symbol populations differ are identified by the same index;
  - iv) with the exception of at most one symbol from the $R_i$-symbol alphabet, the index for every i-symbol sequence such that i>1 that ends in that symbol exceeds that of its i−1-symbol prefix by at least the volume value associated with one said sequence-length-i−1 symbol population that is a predecessor to that i-symbol sequence's symbol population; and
  - v) every n-symbol sequence's index is less than $r^{n/8}$ times the number of allowed sequences that share that sequence's symbol population; and
- C) generating an output signal representative of the index thus computed.

97. A method as defined in claim 96 wherein r=2.

98. A method as defined in claim 97 wherein $R_i$=2 for all i.

99. A method as defined in claim 98 wherein the indexing scheme is such that the index $I(b_1, \ldots, b_n)$ for any allowed sequence $b_1, \ldots, b_n$, satisfies the recurrence equation $$I(b_1 b_2 \ldots b_t) = I(b_1 b_2 \ldots b_{t-1}) + \sum_{k=0}^{b_t-1} [M_{t-1}(k):k] \cdot V(M_{t-1}(k)),$$

where $M_{t-1}(b) = M_t - <b>$, $M_t$ is the set of sequences whose symbol population is the same as $b_1 b_2 \ldots b_t$; and $V(M_{t-1}(b))$ is the indexing volume associated with symbol population $M_{t-1}(b)$.

100. A method as defined in claim 99 wherein, for some positive integer m<h and each i>1, the indexing volume V associated with each sequence-length-i symbol population is the smallest value such that $V=r^s w$ and $w<r^m$ that is greater than or equal to the sum of the indexing volumes associated with the allowed-sequence-length-n−1 symbol populations that are predecessors of that symbol population.

101. A method as defined in claim 100 wherein the predetermined set of allowed n-digit sequences includes every sequence in which every $b_i$ is chosen from the respective $R_i$-symbol alphabet.

102. A method as defined in claim 101 wherein:
- A) the method further includes providing a memory that contains values of the volumes; and
- B) computing the index is performed by adding together volume values including some volume values fetched from the memory.

* * * * *